US008237519B2

(12) United States Patent
Achour

(10) Patent No.: US 8,237,519 B2
(45) Date of Patent: Aug. 7, 2012

(54) FILTER DESIGN METHODS AND FILTERS BASED ON METAMATERIAL STRUCTURES

(75) Inventor: Maha Achour, San Diego, CA (US)

(73) Assignee: Rayspan Corporation, Dover, DE (US)

( * ) Notice: Subject to any disclaimer, the term of this patent is extended or adjusted under 35 U.S.C. 154(b) by 669 days.

(21) Appl. No.: 12/272,781

(22) Filed: Nov. 17, 2008

(65) Prior Publication Data

US 2009/0160578 A1 Jun. 25, 2009
US 2010/0109805 A2 May 6, 2010

Related U.S. Application Data

(60) Provisional application No. 61/050,954, filed on May 6, 2008, provisional application No. 60/988,768, filed on Nov. 16, 2007.

(51) Int. Cl.
*H03H 7/01* (2006.01)
*H01P 3/08* (2006.01)
(52) U.S. Cl. ........ 333/172; 333/175; 333/204; 333/236; 333/246
(58) Field of Classification Search .............. 333/172, 333/175, 204, 219, 236, 246; 343/700 MS
See application file for complete search history.

(56) References Cited

U.S. PATENT DOCUMENTS

| 6,859,114 B2 | 2/2005 | Eleftheriades et al. |
| 7,012,484 B2 | 3/2006 | Chang et al. |
| 7,330,090 B2 | 2/2008 | Itoh et al. |
| 7,391,288 B1 | 6/2008 | Itoh et al. |
| 7,446,712 B2 | 11/2008 | Itoh et al. |
| 7,741,933 B2 | 6/2010 | Duwel |
| 2002/0190905 A1 | 12/2002 | Flint et al. |
| 2003/0181192 A1 | 9/2003 | Park et al. |
| 2004/0160371 A1 | 8/2004 | Hirota et al. |
| 2005/0047356 A1 | 3/2005 | Fujii et al. |
| 2005/0253667 A1 | 11/2005 | Itoh et al. |
| 2008/0001684 A1 | 1/2008 | Itoh et al. |
| 2008/0048917 A1 | 2/2008 | Achour et al. |
| 2008/0204327 A1 | 8/2008 | Lee et al. |
| 2008/0258981 A1 | 10/2008 | Achour et al. |
| 2011/0050364 A1 | 3/2011 | Achour |

FOREIGN PATENT DOCUMENTS

| EP | 1 376 743 | 1/2004 |
| EP | 1 376 745 | 1/2004 |
| EP | 1376743 B1 | 8/2006 |
| EP | 1376745 B1 | 8/2006 |

(Continued)

OTHER PUBLICATIONS

Chen, B.H., Zhang, Y.N., Wu, D., Seo, K., "Novel composite right/left-handed transmission line for quad-band applications", Communication Systems, 2008. ICCS 2008. 11th IEEE Singapore International Conference on, On pp. 617-620, Volume: Issue: , Nov. 19-21, 2008.*

(Continued)

*Primary Examiner* — Robert Pascal
*Assistant Examiner* — Kimberly Glenn
(74) *Attorney, Agent, or Firm* — Connolly Bove Lodge & Hutz LLP

(57) ABSTRACT

Filter design techniques and filters based on metamaterial structures including an extended composite left and right handed (E-CRLH) metamaterial unit cell.

42 Claims, 55 Drawing Sheets

FOREIGN PATENT DOCUMENTS

| KR | 1020050011047 A | 1/2005 |
|---|---|---|
| WO | WO2007/127955 A2 | 8/2007 |
| WO | WO 2009/067197 A2 | 5/2009 |
| WO | WO-2009137302 A2 | 11/2009 |

OTHER PUBLICATIONS

Siso, G., Gil, M., Bonache, J., Martin, F., "Generalized Model for Multiband Metamaterial Transmission Lines", Microwave and Wireless Components Letters, IEEE, on pp. 728-730, vol. 18 Issue: 11, Nov. 2008.*

Caloz and Itoh, *Electromagnetic Metamaterials: Transmission Line Theory and Microwave Applications*, John Wiley & Sons (2006).

Itoh, T., "Invited Paper: Prospects for Metamaterials," *Electronics Letters*, 40(16):972-973, Aug. 2004.

Lai, A., et al., "Infinite Wavelength Resonant Antennas with Monopolar Radiation Pattern Based on Periodic Structures," *IEEE Transactions on Antennas and Propagation*, 55(3):868-876, Mar. 2007.

Matthaei, G., et al., *Microwave Filters, Impedance-Matching Networks, and Coupling Structures*, Artech House, Inc., 1980.

Rennings, A., et al., "Extended Composite Right/Left-Handed (E-CRLH) Metamaterial and its Application as Quadband Quarter-Wavelength Transmission Line," *Proceedings of Asia-Pacific Microwave Conference*, pp. 1405-1408, Dec. 2006.

Sievenpiper, "High-Impedance Electromagnetic Surfaces," Ph.D. Dissertation, University of California, Los Angeles, 1999.

"International Application Serial No. PCT/US2009/042001, International Search Report mailed Dec. 14, 2009", 2 pgs.

Lai, Anthony, et al., "Inifinite Wavelength Resonant Antennas with Monopolar Radiation Pattern Based on Periodic Structures", IEEE Transactions on Antennas and Propagation, 55(3), (Mar. 2007), 868-876.

Eleftheriades, G.V., "A Generalized Negative-Refractive-Index Transmission-Line (NRI-TL) Metamaterial for Dual-Band and Quad-Band Applications," *IEEE Microwave and Wireless Components Letters*, 17(6):415-417, Jun. 2007.

Guan, X., et al., "Synthesis of Dual-Band Bandpass Filters Using Successive Frequency Transformations and Circuit Conversions," *IEEE Microwave and Wireless Components Letters*, 16(3):110-112, Mar. 2006.

Studniberg, M., et al., "A Dual-Band Bandpass Filter Based on Generalized Negative-Refractive-Index Transmission-Lines," *IEEE Microwave and Wireless Components Letters*, 19(1):18-20, Jan. 2009.

International Search Report and Written Opinion dated Jul. 20, 2009 for International Application No. PCT/US2008/12887, filed Nov. 17, 2008 (12 pages).

Atkinson, G.M, et al., "Piezoelectric Polyimide MEMS Process", Departments of Electrical and Mechanical Engineering, Virginia Commonwealth University, Richmond, VA; National Institute of Aerospace, NASA Langley Research Center, Hampton, VA, pp. 1-6, USA.

Conway, Nicholas, et.al., "A strain amplifying piezoelectric MEMS actuator", Journal of Micromechanics and Microengineering, Mar. 9, 2007, pp. 781-787, IOP Publishing, MIT, Cambridge, MA, USA.

* cited by examiner

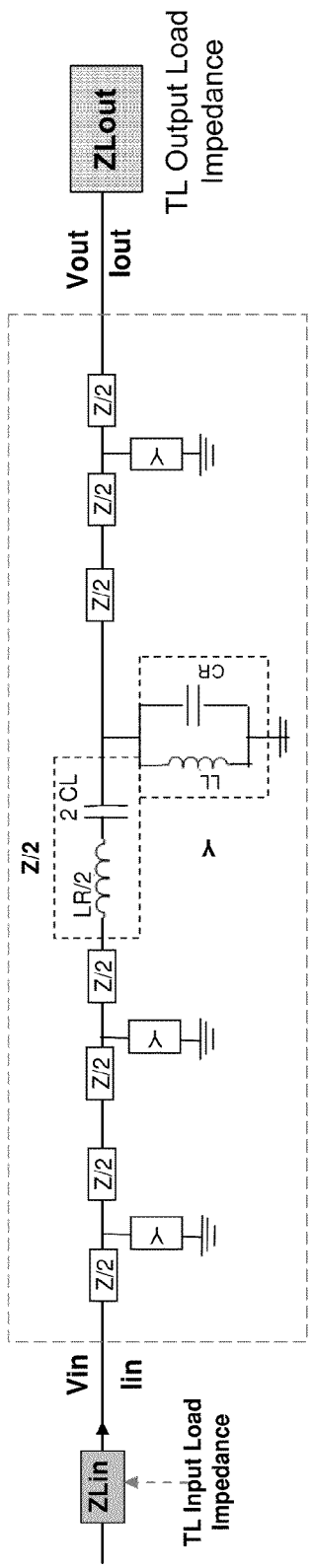
FIG. 3
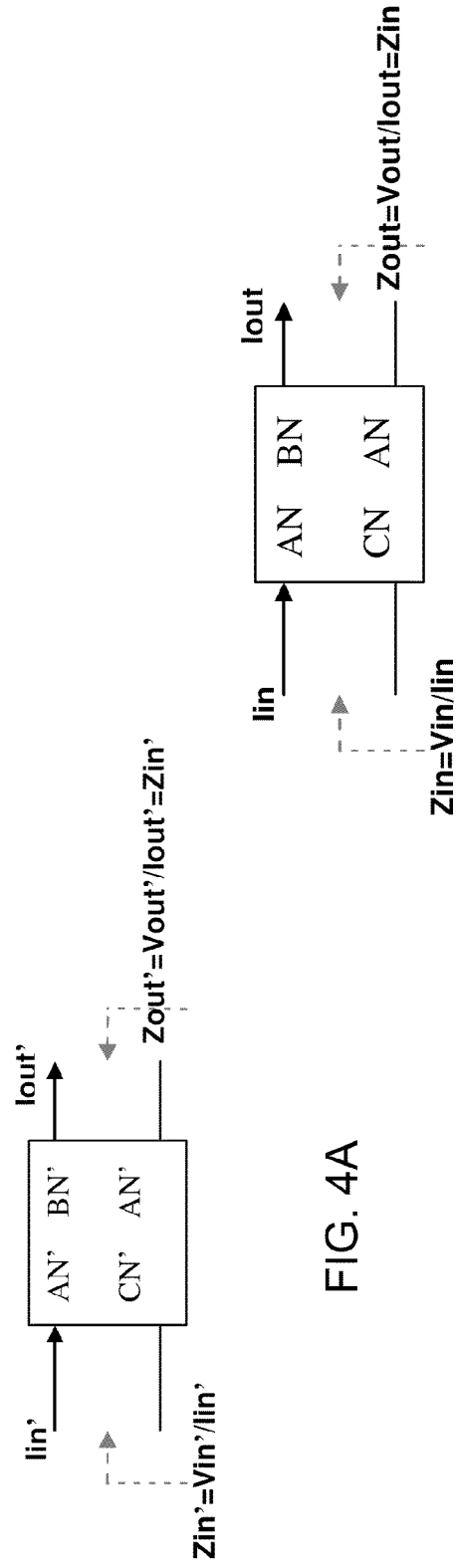
FIG. 4A
FIG. 4B

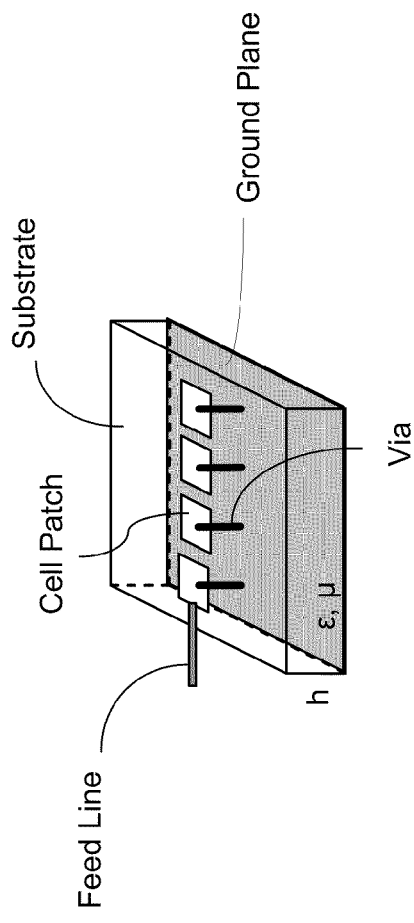
FIG. 5
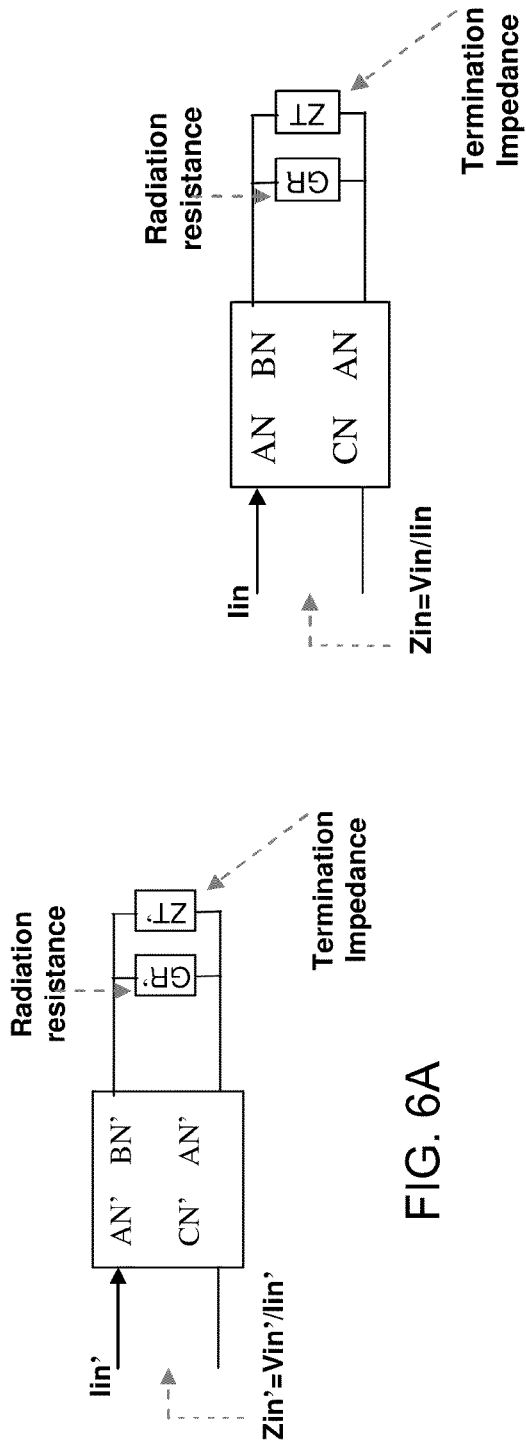
FIG. 6B
FIG. 6A

Layer 3

Cell 21 Bottom Patch

Layer 4

Main GNG

FILTER DESIGN METHODS AND FILTERS BASED ON METAMATERIAL STRUCTURES

PRIORITY CLAIMS AND RELATED APPLICATIONS

This application claims the benefits of U.S. Provisional Patent Application Ser. No. 60/988,768 entitled "Extended Metamaterial Structures and Applications for High-Q Filters" and filed on Nov. 16, 2007, and U.S. Provisional Application Ser. No. 61/050,954 entitled "Single Cable Antenna Solution for Laptop Computer" and filed on May 6, 2008. The entire disclosures of the above two applications are incorporated by reference as part of the specification of this application.

BACKGROUND

The propagation of electromagnetic waves in most materials obeys the right handed rule for the (E, H, β) vector fields, where E is the electrical field, H is the magnetic field, and β is the wave vector. The phase velocity direction is the same as the direction of the signal energy propagation (group velocity) and the refractive index is a positive number. Such materials are "right handed" (RH). Most natural materials are RH materials. Artificial materials can also be RH materials.

A metamaterial (MTM) has an artificial structure. When designed with a structural average unit cell size p much smaller than the wavelength of the electromagnetic energy guided by the metamaterial, the metamaterial can behave like a homogeneous medium to the guided electromagnetic energy. Unlike RH materials, a metamaterial can exhibit a negative refractive index with permittivity $\epsilon$ and permeability $\mu$ being simultaneously negative, and the phase velocity direction is opposite to the direction of the signal energy propagation where the relative directions of the (E, H, β) vector fields follow the left handed rule. Metamaterials that support only a negative index of refraction with permittivity $\epsilon$ and permeability $\mu$ being simultaneously negative are pure "left handed" (LH) metamaterials.

Many metamaterials are mixtures of LH metamaterials and RH materials and thus are Composite Left and Right Handed (CRLH) metamaterials. A CRLH metamaterial can behave like a LH metamaterial at low frequencies and a RH material at high frequencies. Designs and properties of various CRLH metamaterials are described in, Caloz and Itoh, "Electromagnetic Metamaterials: Transmission Line Theory and Microwave Applications," John Wiley & Sons (2006). CRLH metamaterials and their applications in antennas are described by Tatsuo Itoh in "Invited paper: Prospects for Metamaterials," Electronics Letters, Vol. 40, No. 16 (August, 2004).

CRLH metamaterials can be structured and engineered to exhibit electromagnetic properties that are tailored for specific applications and can be used in applications where it may be difficult, impractical or infeasible to use other materials. In addition, CRLH metamaterials may be used to develop new applications and to construct new devices that may not be possible with RH materials.

Various filters based on CRLH metamaterials are examples and are described below.

SUMMARY

This application describes filter design techniques and filters based on metamaterial structures including an extended composite left and right handed (E-CRLH) metamaterial unit cell.

In one aspect, a metamaterial structure based filter apparatus includes an extended composite left and right handed (E-CRLH) metamaterial unit cell. The E-CRLH cell includes a series inductor LR and a series capacitance CL that in combination produce a series resonance $\omega_{SE}$, a shunt inductor LL and a shunt capacitance CR that in combination produce a shunt resonance $\omega_{SH}$, a series inductor LR' and a series capacitance CL' that in combination produce a series resonance $\omega_{SE'}$, and a shunt inductor LL' and a shunt capacitance CR' that in combination produce a shunt resonance $\omega_{SH'}$. The series inductor LR, the series capacitance CL, the shunt inductor LL, the shunt capacitance CR, the series inductor LR', the series capacitance CL', the shunt inductor LL' and the shunt capacitance CR' are (1) connected to form a symmetric cell structure for the E-CRLH unit cell where an input and an output of the E-CRLH unit cell have a common circuit structure, and (2) to have values that render $\omega_{SE}$ and $\omega_{SH'}$ to be substantially equal, and $\omega_{SH}$ and $\omega_{SE'}$ to be substantially equal.

In another aspect, a filter apparatus includes a E-CRLH unit-cell structure formed from a non-linear combination of a non-linear combination of a Conventional CRLH (C-CRLH) cell and a Dual CRLH (D-CRLH) cell. In this apparatus, a combination of a series inductor LR and a series capacitance CL of the C-CRLH cell produces a series resonance ωSE; a combination of a shunt inductor LL and a shunt capacitance CR of the C-CRLH cell produces a shunt resonance ωSH; a combination of a series inductor LR' and a series capacitance CL' of the D-CRLH cell produces a series resonance ωSE'; and a combination of a shunt inductor LL' and a shunt capacitance CR' of the D-CRLH cell produces a shunt resonance ωSH'. The ωSE and ωSH' are substantially equal and ωSH and ωSE' are substantially equal.

In another aspect, a filter apparatus includes a C-CRLH unit-cell structure comprised of a plurality of Conventional CRLH (C-CRLH) cells having a first CRLH (C-CRLH) cell coupled to a second CRLH (C-CRLH) cell; a combination of a series inductor LR1 and a series capacitance CL1 of the first CRLH (C-CRLH) cell which produces a series resonance ωSE1; a combination of a shunt inductor LL1 and a shunt capacitance CR1 of the first CRLH (C-CRLH) cell which produces a shunt resonance ωSH1; a combination of a series inductor LR2 and a series capacitance CL2 of the second CRLH (C-CRLH) cell which produces a series resonance ωSE2; and a combination of a shunt inductor LL2 and a shunt capacitance CR2 of the second CRLH (C-CRLH) which produces a shunt resonance ωSH2. The ωSE1 and ωSE2 are substantially equal, and ωSH1 and ωSH2 are substantially equal.

In another aspect, a fully printed extended composite left and right handed (E-CRLH) metamaterial structure includes a first metallization layer patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line; a second metallization layer patterned to comprise a first conductive cell patch positioned underneath the first metallization layer between the first and second cell patches; a third metallization layer patterned to comprise a second conductive cell patch underneath the first conductive cell patch in the second metallization layer; a first conductive via that connects the first conductive cell patch in the second metallization layer and the second conductive cell patch in the third metallization layer; a fourth metallization layer to provide a ground electrode for the apparatus; a first cell via that connects the first cell patch on the first metallization layer and the ground electrode in the fourth metallization layer, the first cell via being separate from and without direct contact with the first and second conductive cell patches; and a second cell via that connects the second cell patch on the first metallization layer and the ground electrode in the fourth metallization layer, the second cell via being separate from and without direct contact with the first and second conductive cell patches.

In another aspect, a diplexer apparatus includes a main input/output port capable of transmitting and receiving a plurality of signals having a low-band frequency and a high-band frequency; a low-band input/output port capable of transmitting and receiving a first signal operating at the low-band frequency; a band-pass low-band filter connecting the main input/output port to the low-band input/output port having a low insertion loss and a sharp upper band edge; a high-band input/output port capable of transmitting and receiving a second signal operating at the high-band frequency; and a band-pass high-band filter connecting the main input/output port to the high-band port having a low insertion and a sharp lower band edge. An isolation defined between the upper edge of the low-band filter and the lower edge of the high-band filter defines is low.

In yet another aspect, a method for designing a filter circuit includes identifying target filter performance parameters of a filter circuit, including an impedance, a frequency band, and a filter bandwidth of the filter circuit; deriving a plurality of initial circuit parameters based on the identified target filter performance parameters and impedance matching conditions of the filter circuit; evaluating a beta curve, return loss, transmission bands, and impedances of the filter circuit; and creating a spreadsheet to iteratively optimize and verify the circuit parameters of the filter circuit to search for a final set of circuit parameters that meet the identifying target filter performance parameters. As an example, such a method can be used for designing a filter circuit that includes an Extended Composite Right Left Handed (E-CRLH) cell.

The filter designs and design methods described here may be implemented to provide an optimum circuit based filter design utilizing a CRLH type structure that is efficient, easily scales to any band, can provide for matching conditions over a targeted frequency band, and also integrates into front-end module packages. The filter designs and design methods described here may be also used to provide a Conventional and Extended structure of transmission-line based Composite Right-Left Handed, C-CRLH and E-CRLH respectively, Metamaterial (MTM) that generally exhibit rich dispersion behavior to allow better control one or more of the following filter characteristics: frequency bands, quality factor, sideband filter rejection, low insertion loss.

These and other implementations and their variations are described in detail in the attached drawings, the detailed description and the claims.

BRIEF DESCRIPTION OF THE DRAWINGS

FIG. 3 illustrates another representation of the equivalent circuit of the 1D CRLH MTM TL shown in FIG. 1.

FIG. 4A illustrates a two-port network matrix representation for the 1D CRLH TL equivalent circuit shown in FIG. 2.

FIG. 4B illustrates another two-port network matrix representation for the 1D CRLH TL equivalent circuit shown in FIG. 3.

FIG. 5 illustrates an example of a 1D CRLH MTM antenna based on four unit cells.

FIG. 6A illustrates a two-port network matrix representation for the 1D CRLH antenna equivalent circuit analogous to the TL case shown in FIG. 4A.

FIG. 6B illustrates another two-port network matrix representation for the 1D CRLH antenna equivalent circuit analogous to the TL case shown in FIG. 4B.

FIGS. 27A-27E illustrate different views of the GE-CRLH structure in

FIG. 17.

FIG. 28: S11 and S12 of the High-Q filter based on E-CRLH in FIG. 17 and 27; (a) all printed HFSS design, (b) its corresponding E-CRLH circuit using Ansoft Designer.

DETAILED DESCRIPTION

Figure 1:
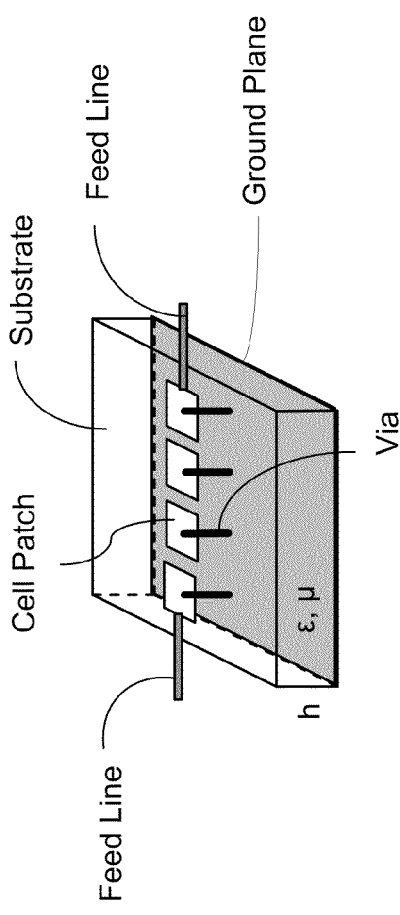
FIG. 1 illustrates an example of a 1D CRLH MTM TL based on four unit cells.

Metamaterial (MTM) structures can be used to construct antennas, transmission lines, filters and other electrical components and devices, allowing for a wide range of technology advancements such as size reduction and performance improvements. The MTM antenna structures can be fabricated on various circuit platforms, for example, a conventional FR-4 Printed Circuit Board (PCB) or a Flexible Printed Circuit (FPC) board. Examples of other fabrication techniques include thin film fabrication technique, system on chip (SOC) technique, low temperature co-fired ceramic (LTCC) technique, and monolithic microwave integrated circuit (MMIC) technique.

In one application of CRLH metamaterial structure, such structures can be directly applied to modern filter designs. Filter design, in general, enables communication links to filter out any signals from frequency bands other than the one used to communicate. Modern filter designs and techniques utilizing CRLH structures may be a high-pass, band-pass, or impedance transformer some of which are described by G. Mattaei, L. Young, E. N. T. Jones, "Microwave Filters, Impedance-matching Networks, and Coupling Structures", Artech House publisher, 1980.

The high-pass design filter is based on pure left-handed unit cells as described by Mattaei. In another example of designing filters, the band-pass and impedance transformer design filters are based on CRLH unit cells. However, as indicated by Mattaei, the use of the CRLH structure filter design is difficult to achieve in a practical microwave structure and, instead, series inductances and impedance inverters are used for filter design. In another example of Mattaei's approach to filter design, a high number of unit cells such as Conventional CRLH (C-CRLH) are required to create sharp filters which increases filter insertion loss due to ripples appearing in the filter pass band. The unit cell parameters and number of cells are derived from coefficients listed in tables generated for different unit cells. Alternative approaches to filter designs are also available but generally utilize brute force techniques to achieve optimum results.

Other CRLH structures such as Extended Composite Right/Left-Handed (E-CRLH) is described by Rennings et al., "Extended Composite Right/Left-Handed (E-CRLH) Metamaterial and its Application as Quadband Quarter-Wavelength Transmission Line," Proceedings of Asia-Pacific Microwave Conference (2006), which is incorporated by reference as part of the specification of this application.

Although useful, the conventional filter design approaches, several of which are described above, are considered cumbersome, utilize too many parameters, require a large range, and are difficult to match over a targeted frequency band.

A practical limitation of current filter designs is their inability to simplify the RF Front End Module (FEM) of small wireless communication devices, such as handsets and client cards. In current FEM designs, for example, Surface Acoustic Wave (SAW) based filters are used instead of microwave circuit structures making it difficult and impractical to integrate such designs in RFIC packages or on FEM substrates.

The present application discloses examples and implementations of filter designs and filters based on MTM structures. The MTM structures for filters can be based on MTM antenna structures and MTM transmission line structures, which can be configured to generate two different frequency bands: a "low band" and a "high band." The low band includes at least one left-handed (LH) mode resonance and the high band includes at least one right-handed (RH) mode resonance. Some of the implementations in the present application are directed to cell phone applications, handheld device applications (e.g., Blackberry) and other mobile device applications, in which the antenna is expected to support multiple frequency bands with adequate performance under limited space constraints. The MTM antenna designs disclosed in the present application provide advantages over conventional antennas such as but not limited to smaller sizes, multiple resonances based on a single antenna solution, stable resonances that do not shift with the user interaction and resonant frequencies that are independent of the physical size. The frequency bands in cell phone and mobile device applications are comprised of: the cellular band (824-960 MHz) which actually includes two bands, CDMA and GSM bands; and the PCS/DCS band (1710-2170 MHz) which actually includes three bands: PCS, DCS and WCDMA bands. A quad-band antenna covers one of the CDMA and GSM bands in the cellular band and all three bands in the PCS/DCS band. A penta-band antenna covers all five bands (two in the cellular band and three in the PCS/DCS band).

Some MTM antenna structures are described in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007, which are hereby incorporated by reference as part of the specification of the present application.

An MTM antenna or M™ transmission line (TL) is a M™ structure with one or more MTM unit cells. The equivalent circuit for each MTM unit cell includes a right-handed series inductance (LR), a right-handed shunt capacitance (CR), a left-handed series capacitance (CL), and a left-handed shunt inductance (LL). LL and CL are structured and connected to provide the left-handed properties to the unit cell. This type of CRLH TLs or antennas can be implemented by using distributed circuit elements, lumped circuit elements or a combination of both. Each unit cell is smaller than about λ/4 where λ is the wavelength of the electromagnetic signal that is transmitted in the CRLH TL or antenna.

A pure LH metamaterial follows the left-hand rule for the vector trio (E, H, β), and the phase velocity direction is opposite to the signal energy propagation. Both the permittivity ε and permeability μ of the LH material are negative. A CRLH metamaterial can exhibit both left-hand and right-hand electromagnetic modes of propagation depending on the regime or frequency of operation. Under certain circumstances, a CRLH metamaterial can exhibit a non-zero group velocity when the wavevector of a signal is zero. This situation occurs when both left-hand and right-hand modes are balanced. In an unbalanced mode, there is a bandgap in which electromagnetic wave propagation is forbidden. In the balanced case, the dispersion curve does not show any discontinuity at the transition point of the propagation constant $\mu(\omega_o)= 0$ between the left- and right-hand modes, where the guided wavelength is infinite, i.e., $\lambda_g=2\pi/|\beta|\to\infty$, while the group velocity is positive:

$$v_g = \frac{d\omega}{d\beta}\bigg|_{\beta=0} > 0.$$

This state corresponds to the zeroth order mode m=0 in a TL implementation in the LH region. The CRHL structure supports a fine spectrum of low frequencies with the dispersion relation that follows the negative β parabolic region. This allows a physically small device to be built that is electromagnetically large with unique capabilities in manipulating and controlling near-field radiation patterns. When this TL is used as a Zeroth Order Resonator (ZOR), it allows a constant amplitude and phase resonance across the entire resonator. The ZOR mode can be used to build MTM-based power combiners and splitters or dividers, directional couplers, matching networks, and leaky wave antennas.

In the case of RH TL resonators, the resonance frequency corresponds to electrical lengths $\theta_m=\beta_m l=m\pi$ (m=1, 2, 3 . . . ), where l is the length of the TL. The TL length should be long to reach low and wider spectrum of resonant frequencies. The operating frequencies of a pure LH material are at low frequencies. A CRLH MTM structure is very different from an RH or LH material and can be used to reach both high and low spectral regions of the RF spectral ranges. In the CRLH case $\theta_m=\beta_m l=m\pi$, where l is the length of the CRLH TL and the parameter m=0, ±1, ±2, ±3 . . . ±∞.

FIG. 1 illustrates an example of a 1D CRLH MTM TL based on four unit cells. One unit cell includes a cell patch and a via, and is a minimum unit that repeats itself to build the MTM structure. The four cell patches are placed on a substrate with respective centered vias connected to the ground plane.

Figure 2:
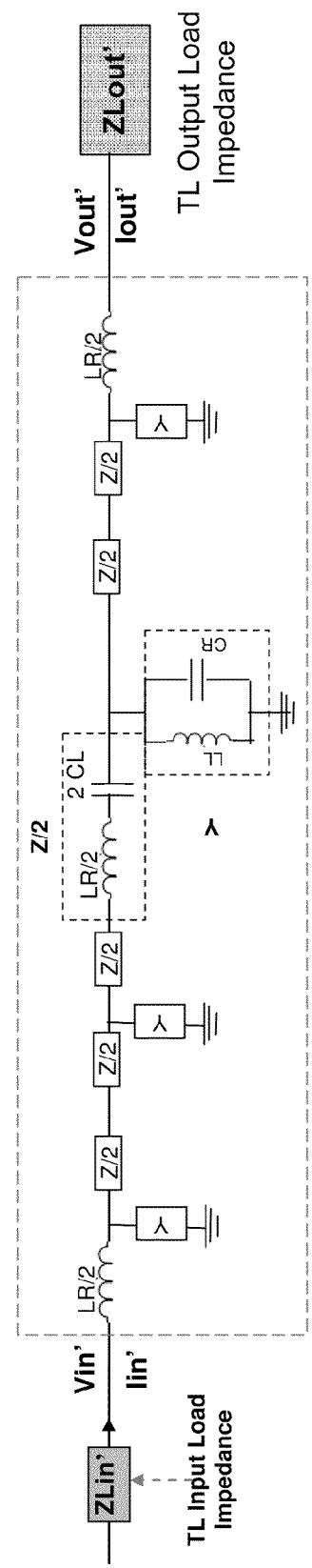
FIG. 2 illustrates an equivalent circuit of the 1D CRLH MTM TL shown in FIG. 1.

FIG. 2 shows an equivalent network circuit of the 1D CRLH MTM TL in FIG. 1. The ZLin' and ZLout' correspond to the TL input load impedance and TL output load impedance, respectively, and are due to the TL coupling at each end. This is an example of a printed two-layer structure. LR is due to the cell patch on the dielectric substrate, and CR is due to the dielectric substrate being sandwiched between the cell patch and the ground plane. CL is due to the presence of two adjacent cell patches, and the via induces LL.

Each individual unit cell can have two resonances $\omega_{SE}$ and $\omega_{SH}$ corresponding to the series (SE) impedance Z and shunt (SH) admittance Y. In FIG. 2, the Z/2 block includes a series combination of LR/2 and 2CL, and the Y block includes a parallel combination of LL and CR. The relationships among these parameters are expressed as follows:

$$\omega_{SH} = \frac{1}{\sqrt{LL\ CR}}; \omega_{SE} = \frac{1}{\sqrt{LR\ CL}}; \omega_R = \frac{1}{\sqrt{LR\ CR}}; \quad \text{Eq. (1)}$$

$$\omega_L = \frac{1}{\sqrt{LL\ CL}} \text{ where,}$$

$$Z = j\omega LR + \frac{1}{j\omega CL} \text{ and } Y = j\omega CR + \frac{1}{j\omega LL}.$$

The two unit cells at the input/output edges in FIG. 1 do not include CL, since CL represents the capacitance between two adjacent cell patches and is missing at these input/output edges. The absence of the CL portion at the edge unit cells prevents $\omega_{SE}$ frequency from resonating. Therefore, only $\omega_{SH}$ appears as an m=0 resonance frequency.

To simplify the computational analysis, a portion of the ZLin' and ZLout' series capacitor is included to compensate for the missing CL portion, and the remaining input and output load impedances are denoted as ZLin and ZLout, respectively, as seen in FIG. 3. Under this condition, all unit cells have identical parameters as represented by two series Z/2 blocks and one shunt Y block in FIG. 3, where the Z/2 block includes a series combination of LR/2 and 2CL, and the Y block includes a parallel combination of LL and CR.

FIG. 4A and FIG. 4B illustrate a two-port network matrix representation for TL circuits without the load impedances as shown in FIG. 2 and FIG. 3, respectively.

FIG. 5 illustrates an example of a 1D CRLH MTM antenna based on four unit cells. FIG. 6A shows a two-port network matrix representation for the antenna circuit in FIG. 5. FIG. 6B shows a two-port network matrix representation for the antenna circuit in FIG. 5 with the modification at the edges to account for the missing CL portion to have all the unit cells identical. FIGS. 6A and 6B are analogous to the TL circuits shown in FIGS. 4A and 4B, respectively.

In matrix notations, FIG. 4B represents the relationship given as below:

$$\begin{pmatrix} Vin \\ Iin \end{pmatrix} = \begin{pmatrix} AN & BN \\ CN & AN \end{pmatrix} \begin{pmatrix} Vout \\ Iout \end{pmatrix}, \quad \text{Eq. (2)}$$

where AN=DN because the CRLH MTM TL circuit in FIG. 3 is symmetric when viewed from Vin and Vout ends.

In FIGS. 6A and 6B, the parameters GR' and GR represent a radiation resistance, and the parameters ZT' and ZT represent a termination impedance. Each of ZT', ZLin' and ZLout' includes a contribution from the additional 2CL as expressed below:

$$ZLin' = ZLin + \frac{2}{j\omega CL}, \quad ZLout' = ZL_{out} + \frac{2}{j\omega CL}, \quad \text{Eq. (3)}$$

$$ZT' = ZT + \frac{2}{j\omega CL}.$$

Since the radiation resistance GR or GR' can be derived by either building or simulating the antenna, it may be difficult to optimize the antenna design. Therefore, it is preferable to adopt the TL approach and then simulate its corresponding antennas with various terminations ZT. The relationships in Eq. (1) are valid for the circuit in FIG. 2 with the modified values AN', BN', and CN', which reflect the missing CL portion at the two edges.

The frequency bands can be determined from the dispersion equation derived by letting the N CRLH cell structure resonate with $n\pi$ propagation phase length, where n=0, ±1, ±2, ... ±N. Here, each of the N CRLH cells is represented by Z and Y in Eq. (1), which is different from the structure shown in FIG. 2, where CL is missing from end cells. Therefore, one might expect that the resonances associated with these two structures are different. However, extensive calculations show that all resonances are the same except for n=0, where both $\omega_{SE}$ and $\omega_{SH}$ resonate in the structure in FIG. 3, and only $\omega_{SH}$ resonates in the structure in FIG. 2. The positive phase offsets (n>0) correspond to RH region resonances and the negative values (n<0) are associated with LH region resonances.

The dispersion relation of N identical CRLH cells with the Z and Y parameters is given below:

$$\begin{cases} N\beta p = \cos^{-1}(A_N), \Rightarrow |A_N| \leq 1 \Rightarrow 0 \leq \chi = -ZY \leq 4 \forall N \\ \text{where } A_N = 1 \text{ at even resonances } |n| = 2m \in \begin{cases} 0, 2, 4, \ldots 2\times \\ \text{Int}\left(\frac{N-1}{2}\right) \end{cases} \end{cases} \quad \text{Eq. (4)}$$

$$\text{and } A_N = -1 \text{ at odd resonances } |n| = 2m +$$
$$1 \in \left\{1, 3, \ldots \left(2 \times \text{Int}\left(\frac{N}{2}\right) - 1\right)\right\}$$

where Z and Y are given in Eq. (1), AN is derived from the linear cascade of N identical CRLH unit cells as in FIG. 3, and p is the cell size. Odd n=(2m+1) and even n=2m resonances are associated with AN=−1 and AN=1, respectively. For AN' in FIG. 4A and FIG. 6A, the n=0 mode resonates at $\omega_0 = \omega_{SH}$ only and not at both $\omega_{SE}$ and $\omega_{SH}$ due to the absence of CL at the end cells, regardless of the number of cells. Higher-order frequencies are given by the following equations for the different values of $\chi$ specified in Table 1:

For n > 0, $$\omega_{\pm n}^2 = \frac{\omega_{SH}^2 + \omega_{SE}^2 + \chi \omega_R^2}{2} \pm \sqrt{\left(\frac{\omega_{SH}^2 + \omega_{SE}^2 + \chi \omega_R^2}{2}\right)^2 - \omega_{SH}^2 \omega_{SE}^2} \quad \text{Eq. (5)}$$

Table 1 provides $\chi$ values for N=1, 2, 3, and 4. It should be noted that the higher-order resonances |n|>0 are the same regardless if the full CL is present at the edge cells (FIG. 3) or absent (FIG. 2). Furthermore, resonances close to n=0 have small $\chi$ values (near $\chi$ lower bound 0), whereas higher-order resonances tend to reach $\chi$ upper bound 4 as stated in Eq. (4).

TABLE 1

Resonances for N = 1, 2, 3 and 4 cells

| | Modes | | | |
|---|---|---|---|---|
| N | \|n\| = 0 | \|n\| = 1 | \|n\| = 2 | \|n\| = 3 |
| N = 1 | $\chi_{(1,0)} = 0$; $\omega_0 = \omega_{SH}$ | | | |
| N = 2 | $\chi_{(2,0)} = 0$; $\omega_0 = \omega_{SH}$ | $\chi_{(2,1)} = 2$ | | |
| N = 3 | $\chi_{(3,0)} = 0$; $\omega_0 = \omega_{SH}$ | $\chi_{(3,1)} = 1$ | $\chi_{(3,2)} = 3$ | |
| N = 4 | $\chi_{(4,0)} = 0$; $\omega_0 = \omega_{SH}$ | $\chi_{(4,1)} = 2 - \sqrt{2}$ | $\chi_{(4,2)} = 2$ | |

Figure 7A:
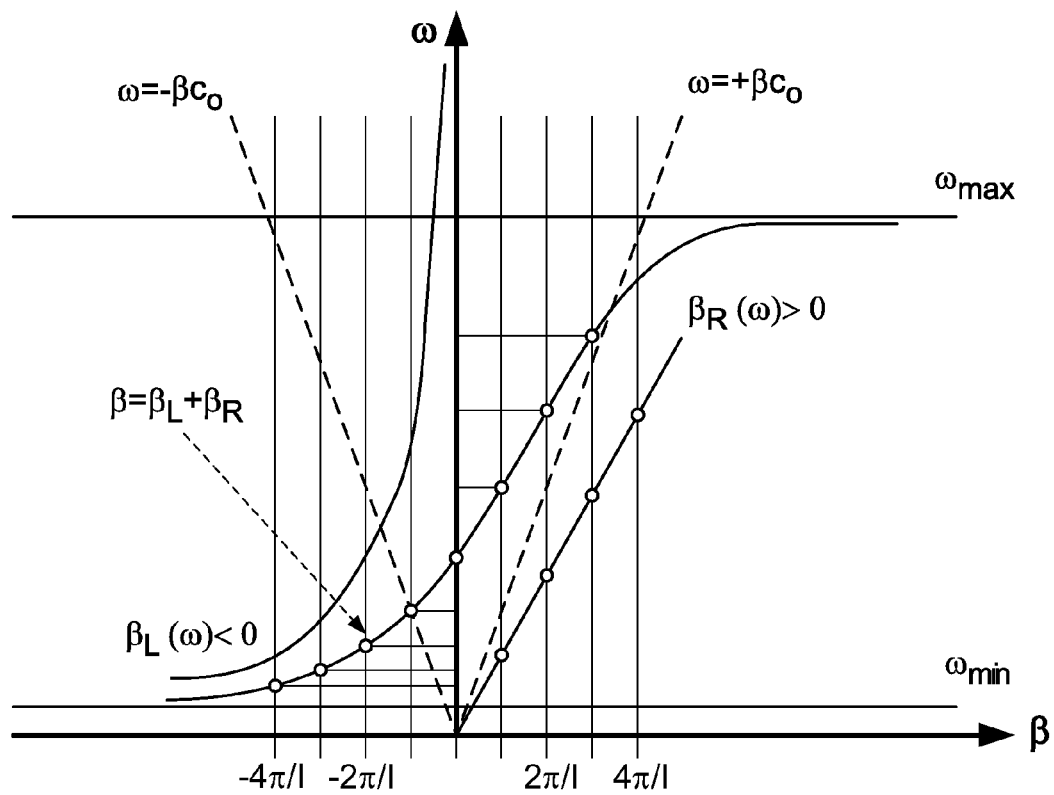
FIG. 7A illustrates an example of a dispersion curve for the balanced case.
Figure 7B:
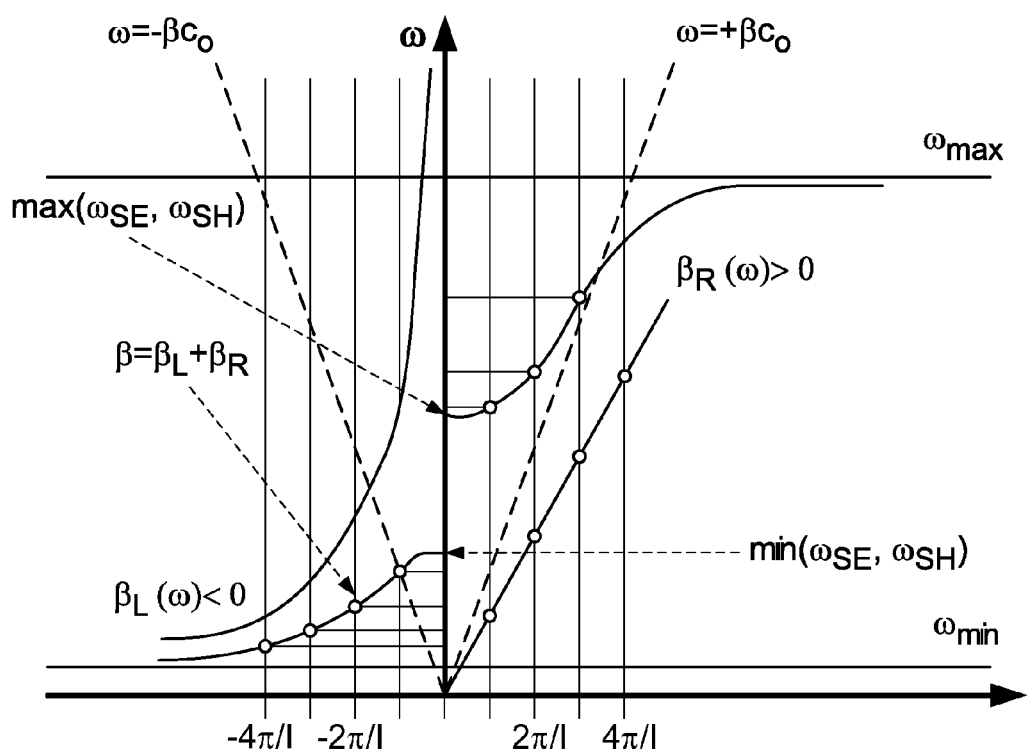
FIG. 7B illustrates an example of a dispersion curve for the unbalanced case.

The dispersion curve $\beta$ as a function of frequency $\omega$ is illustrated in FIGS. 7A and 7B for the $\omega_{SE} = \omega_{SH}$ (balanced, i.e., LR CL=LL CR) and $\omega_{SE} \neq \omega_{SH}$ (unbalanced) cases, respectively. In the latter case, there is a frequency gap between min($\omega_{SE}, \omega_{SH}$) and max ($\omega_{SE}, \omega_{SH}$). The limiting frequencies $\omega_{min}$ and $\omega_{max}$ values are given by the same resonance equations in Eq. (5) with $\chi$ reaching its upper bound $\chi$=4 as stated in the following equations:

$$\omega_{min}^2 = \frac{\omega_{SH}^2 + \omega_{SE}^2 + 4\omega_R^2}{2} - \sqrt{\left(\frac{\omega_{SH}^2 + \omega_{SE}^2 + 4\omega_R^2}{2}\right)^2 - \omega_{SH}^2 \omega_{SE}^2} \quad (6)$$

$$\omega_{max}^2 = \frac{\omega_{SH}^2 + \omega_{SE}^2 + 4\omega_R^2}{2} + \sqrt{\left(\frac{\omega_{SH}^2 + \omega_{SE}^2 + 4\omega_R^2}{2}\right)^2 - \omega_{SH}^2 \omega_{SE}^2}.$$

In addition, FIGS. 7A and 7B provide examples of the resonance position along the dispersion curves. In the RH region (n>0) the structure size l=Np, where p is the cell size, increases with decreasing frequency. In contrast, in the LH region, lower frequencies are reached with smaller values of Np, hence size reduction. The dispersion curves provide some indication of the bandwidth around these resonances. For instance, LH resonances have the narrow bandwidth because the dispersion curves are almost flat. In the RH region, the bandwidth is wider because the dispersion curves are steeper. Thus, the first condition to obtain broadbands, $1^{st}$ BB condition, can be expressed as follows:

$$COND1: 1^{st} BB \text{ condition} \left|\frac{d\beta}{d\omega}\right|_{res} = \qquad \text{Eq. (7)}$$

$$\left|-\frac{\frac{d(AN)}{d\omega}}{\sqrt{(1-AN^2)}}\right|_{res} \ll 1 \text{ near } \omega = \omega_{res} = \omega_0, \omega_{\pm 1},$$

$$\omega_{\pm 2} \ldots \Rightarrow \left|\frac{d\beta}{d\omega}\right| = \left|\frac{\frac{d\chi}{d\omega}}{2p\sqrt{\chi\left(1-\frac{\chi}{4}\right)}}\right|_{res} \ll 1 \text{ with } p =$$

$$\text{cell size and} \frac{d\chi}{d\omega}\bigg|_{res} = \frac{2\omega_{\pm n}}{\omega_R^2}\left(1-\frac{\omega_{SE}^2\omega_{SH}^2}{\omega_{\pm n}^4}\right),$$

where $\chi$ is given in Eq. (4) and $\omega_R$ is defined in Eq. (1). The dispersion relation in Eq. (4) indicates that resonances occur when $|AN|=1$, which leads to a zero denominator in the $1^{st}$ BB condition (COND1) of Eq. (7). As a reminder, AN is the first transmission matrix entry of the N identical unit cells (FIG. 4B and FIG. 6B). The calculation shows that COND1 is indeed independent of N and given by the second equation in Eq. (7). It is the values of the numerator and $\chi$ at resonances, which are shown in Table 1, that define the slopes of the dispersion curves, and hence possible bandwidths. Targeted structures are at most $Np=\lambda/40$ in size with the bandwidth exceeding 4%. For structures with small cell sizes p, Eq. (7) indicates that high $\omega_R$ values satisfy COND1, i.e., low CR and LR values, since for n<0 resonances occur at $\chi$ values near 4 in Table 1, in other terms $(1-\chi/4 \rightarrow 0)$.

As previously indicated, once the dispersion curve slopes have steep values, then the next step is to identify suitable matching. Ideal matching impedances have fixed values and may not require large matching network footprints. Here, the word "matching impedance" refers to a feed line and termination in the case of a single side feed such as in antennas. To analyze an input/output matching network, Zin and Zout can be computed for the TL circuit in FIG. 4B. Since the network in FIG. 3 is symmetric, it is straightforward to demonstrate that Zin=Zout. It can be demonstrated that Zin is independent of N as indicated in the equation below:

$$Zin^2 = \frac{BN}{CN} = \frac{B1}{C1} = \frac{Z}{Y}\left(1-\frac{\chi}{4}\right), \qquad \text{Eq. (8)}$$

which has only positive real values. One reason that B1/C1 is greater than zero is due to the condition of $|AN| \leq 1$ in Eq. (4), which leads to the following impedance condition:

$$0 \leq -ZY = \chi \leq 4.$$

The $2^{nd}$ broadband (BB) condition is for Zin to slightly vary with frequency near resonances in order to maintain constant matching. Remember that the real input impedance Zin' includes a contribution from the CL series capacitance as stated in Eq. (3). The $2^{nd}$ BB condition is given below:

$$COND2: 2^{ed} BB \text{ condition near resonances,} \qquad \text{Eq. (9)}$$

$$\left.\frac{dZin}{d\omega}\right|_{near res} \ll 1.$$

Different from the transmission line example in FIG. 2 and FIG. 3, antenna designs have an open-ended side with an infinite impedance which poorly matches the structure edge impedance. The capacitance termination is given by the equation below:

$$Z_T = \frac{AN}{CN}, \qquad \text{Eq. (10)}$$

which depends on N and is purely imaginary. Since LH resonances are typically narrower than RH resonances, selected matching values are closer to the ones derived in the n<0 region than the n>0 region.

To increase the bandwidth of LH resonances, the shunt capacitor CR should be reduced. This reduction can lead to higher $\omega_R$ values of steeper dispersion curves as explained in Eq. (7). There are various methods of decreasing CR, including but not limited to: 1) increasing substrate thickness, 2) reducing the cell patch area, 3) reducing the ground area under the top cell patch, resulting in a "truncated ground," or combinations of the above techniques.

The structures in FIGS. 1 and 5 use a conductive layer to cover the entire bottom surface of the substrate as the full ground electrode. A truncated ground electrode that has been patterned to expose one or more portions of the substrate surface can be used to reduce the area of the ground electrode to less than that of the full substrate surface. This can increase the resonant bandwidth and tune the resonant frequency. Two examples of a truncated ground structure are discussed with reference to FIGS. 8 and 11, where the amount of the ground electrode in the area in the footprint of a cell patch on the ground electrode side of the substrate has been reduced, and a remaining strip line (via line) is used to connect the via of the cell patch to a main ground electrode outside the footprint of the cell patch. This truncated ground approach may be implemented in various configurations to achieve broadband resonances.

Figure 8:
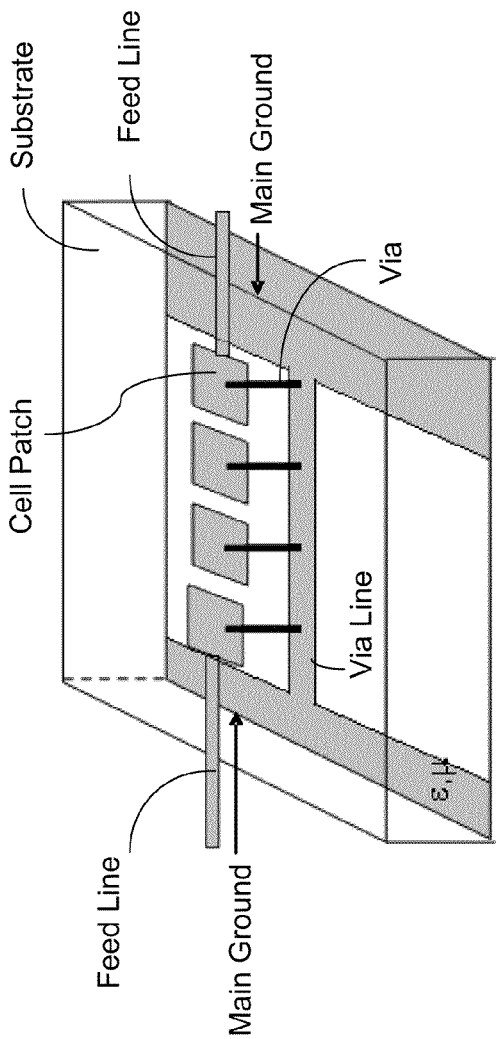
FIG. 8 illustrates an example of a 1D CRLH MTM TL with a truncated ground based on four unit cells.

FIG. 8 illustrates one example of a truncated ground electrode for a four-cell transmission line where the ground has a dimension that is less than the cell patch along one direction underneath the cell patch. The ground conductive layer includes a via line that is connected to the vias and passes through underneath the cell patches. The via line has a width that is less than a dimension of the cell path of each unit cell. The use of a truncated ground may be a preferred choice over other methods in implementations of commercial devices where the substrate thickness cannot be increased or the cell patch area cannot be reduced because of the associated decrease in antenna efficiencies. When the ground is truncated, another inductor Lp (FIG. 9) is introduced by the metallization strip (via line) that connects the vias to the main ground as illustrated in FIG. 8. FIG. 10 shows a four-cell antenna counterpart with the truncated ground analogous to the TL structure in FIG. 8.

Figure 11:
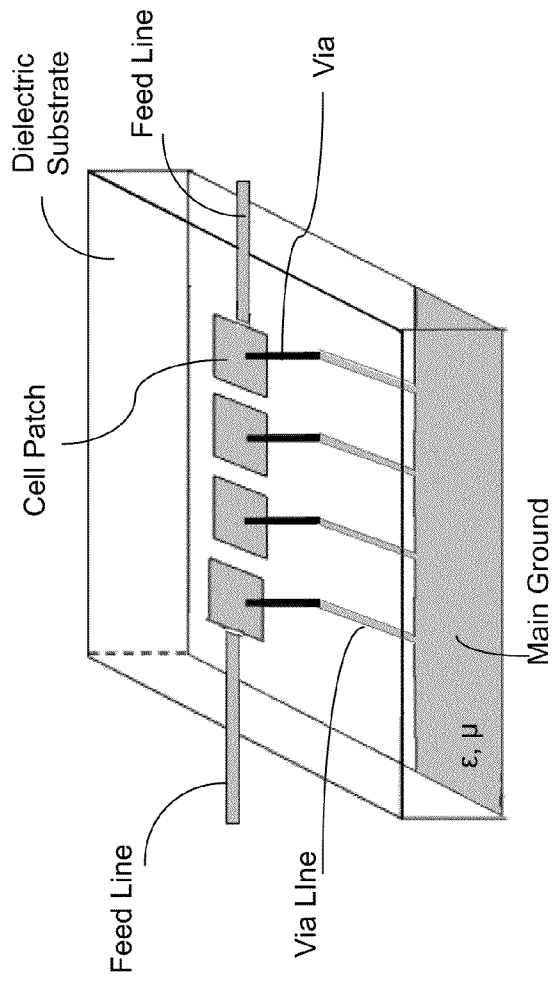
FIG. 11 illustrates another example of a 1D CRLH MTM TL with a truncated ground based on four unit cells.

FIG. 11 illustrates another example of a truncated ground structure. In this example, the ground conductive layer includes via lines and a main ground that is formed outside the footprint of the cell patches. Each via line is connected to the main ground at a first distal end and is connected to the via at a second distal end. The via line has a width that is less than a dimension of the cell path of each unit cell.

Figure 9:
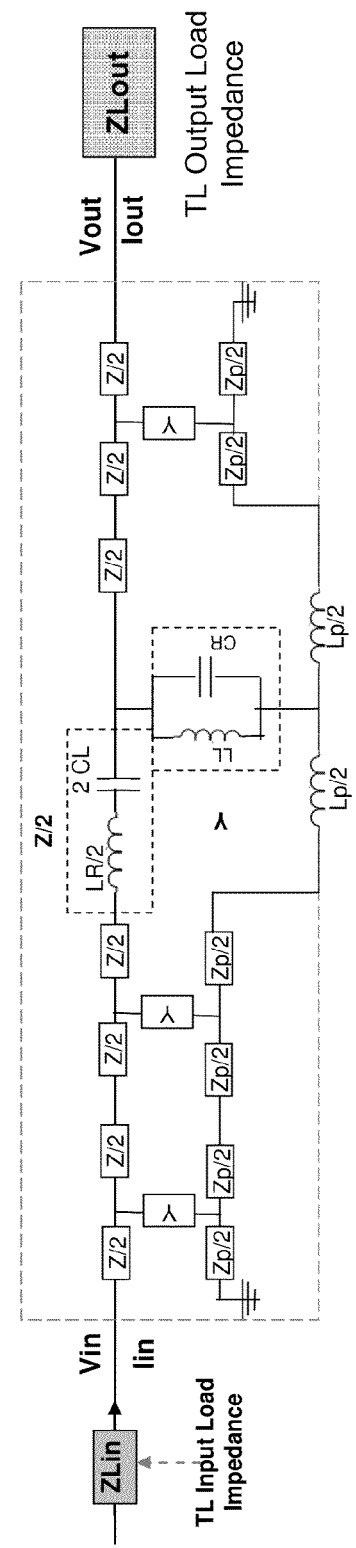
FIG. 9 illustrates an equivalent circuit of the 1D CRLH MTM TL with the truncated ground shown in FIG. 8.
Figure 10:
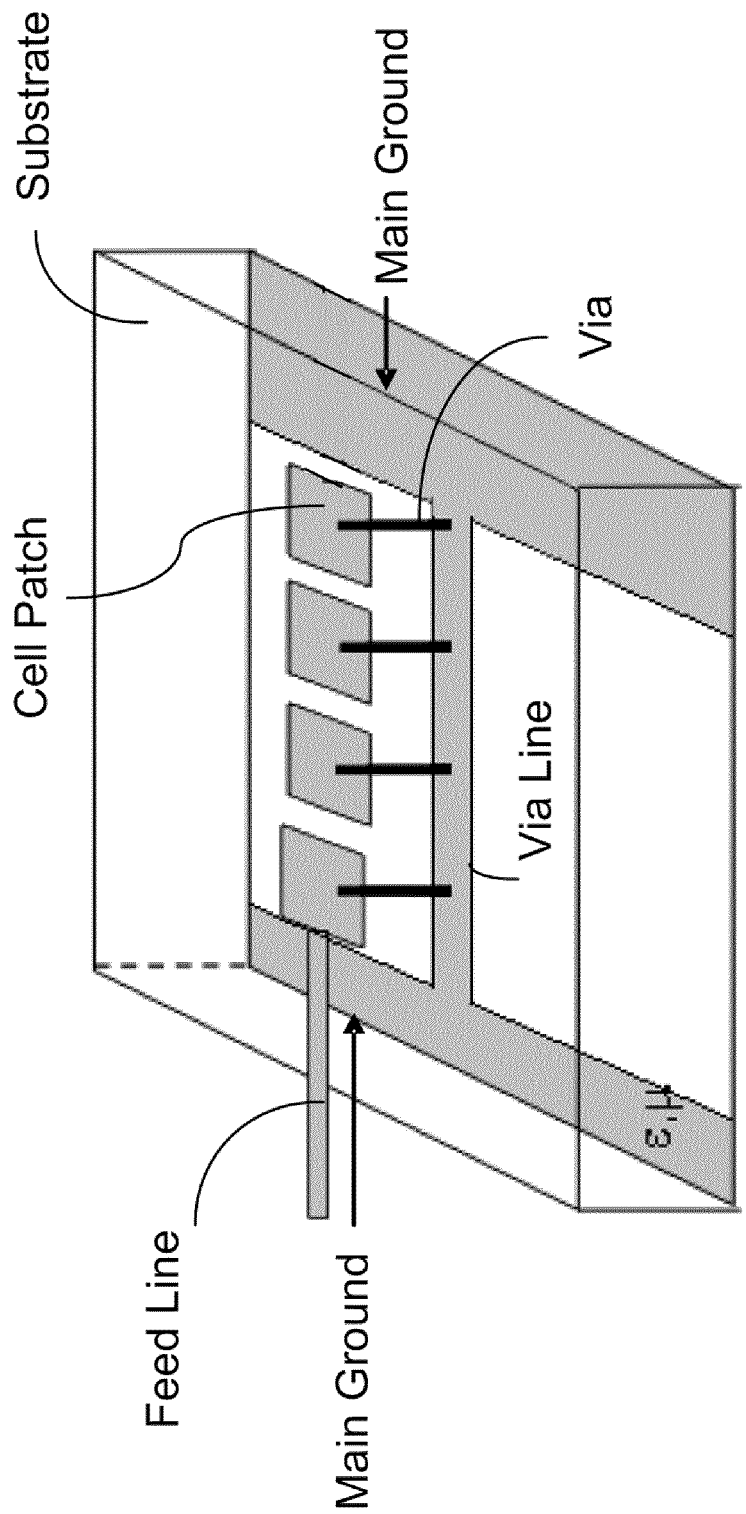
FIG. 10 illustrates an example of a 1D CRLH MTM antenna with a truncated ground based on four unit cells.

The equations for the truncated ground structure can be derived. In the truncated ground examples, CR becomes very small, and the resonances follow the same equations as in Eqs. (1), (5) and (6) and Table 1 as explained below:

Approach 1 (FIGS. 8 and 9)

Resonances are the same as in Eqs. (1), (5) and (6) and Table 1 after replacing LR by LR+Lp. For $|n| \neq 0$, each mode has two resonances corresponding to (1) $\omega \pm n$ for LR being replaced by LR+Lp; and (2) $\omega \pm n$ for LR being replaced by LR+Lp/N where N is the number of cells.

The impedance equation becomes:

$$Zin^2 = \frac{BN}{CN} = \frac{B1}{C1} = \frac{Z}{Y}\left(1 - \frac{\chi + \chi_p}{4}\right)\frac{(1-\chi-\chi_p)}{(1-\chi-\chi_p/N)}, \quad \text{Eq. (11)}$$

where $\chi = -YZ$ and $\chi = -YZ_p$, where $Zp = j\omega Lp$ and Z, Y are defined in Eq. (2).

The impedance equation in Eq. (11) suggests that the two resonances $\omega$ and $\omega'$ have low and high impedances, respectively. Thus, it is easy to tune near the $\omega$ resonance in most cases.

Figure 12:
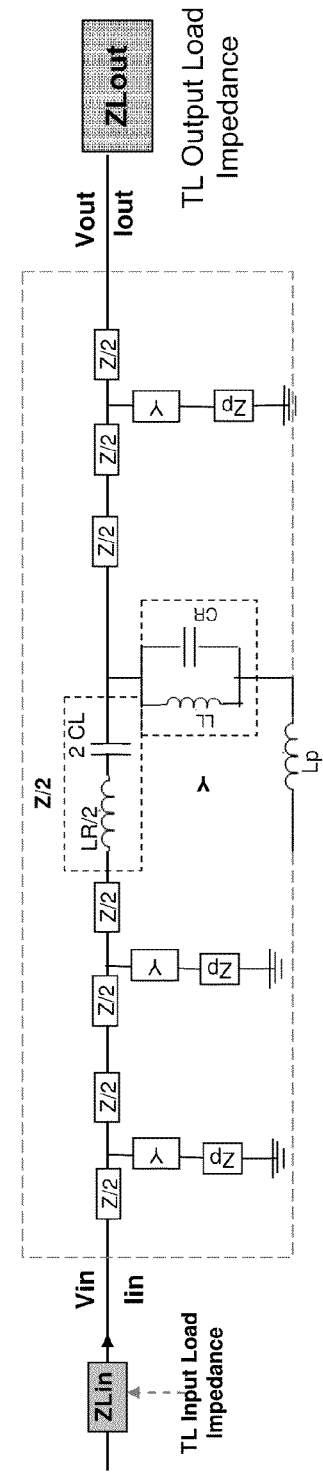
FIG. 12 illustrates an equivalent circuit of the 1D CRLH MTM TL with the truncated ground shown in FIG. 11.

Approach 2 (FIGS. 11 and 12)

Resonances are the same as in Eqs. (1), (5), and (6) and Table 1 after replacing LL by LL+Lp. In the second approach, the combined shunt inductor (LL+Lp) increases while the shunt capacitor CR decreases, which leads to lower LH frequencies.

The present technique and circuit designs can be implemented in several CRLH type filter designs as shown in Table 2 based on circuit resonances defined in Eq. (12) below. Variations, modifications and enhancements of filter designs shown in Table 2 can be made given the variety of filter designs available in the field and the disclosure of this document.

TABLE 2

List and description of filter designs

| E-CRLH | C-CRLH |
|---|---|
| I. Design 1 BE (Balanced Extended) | III. Design 3 BC (Balanced Conventional): |
| BE 1: Side band filter rejection can be steep | Balanced structure. That is $\omega_{SH1} = \omega_{SE1} = \omega_{SH2} = \omega_{SE2} = \omega_0$. |
| | We use both isotropic and anisotropic structures, where anisotropic Structure has different unit cells along the TL. |
| | Broadband filter |
| | Low-band: 800 MHz to 2.1 GHz |
| | Can be scaled to higher frequency bands |
| | major issue: Tough to meet steep side band filter rejection |
| II. Design 2 UE (Unbalanced Extended) | IV. Design 4 AC (Anisotropic Conventional): |
| UE 2.1: High Q filter targeting 700 MHz filter market | Unbalanced structure with $\omega_{SH1} = \omega_{SH2}$ and $\omega_{SE1} = \omega_{SE2} \neq \omega_{SH1}$. |
| Design approach is scalable to any band. | AC4.1: Narrow |
| UE 2.2: Broadband filter with sharp side band rejection. | |
| Diplexer design with impedance switching | |

TABLE 2-continued

List and description of filter designs

| E-CRLH | C-CRLH |
|---|---|
| UE 2.3: Narrowband filter with sharp side band rejection. | |

Figure 13:
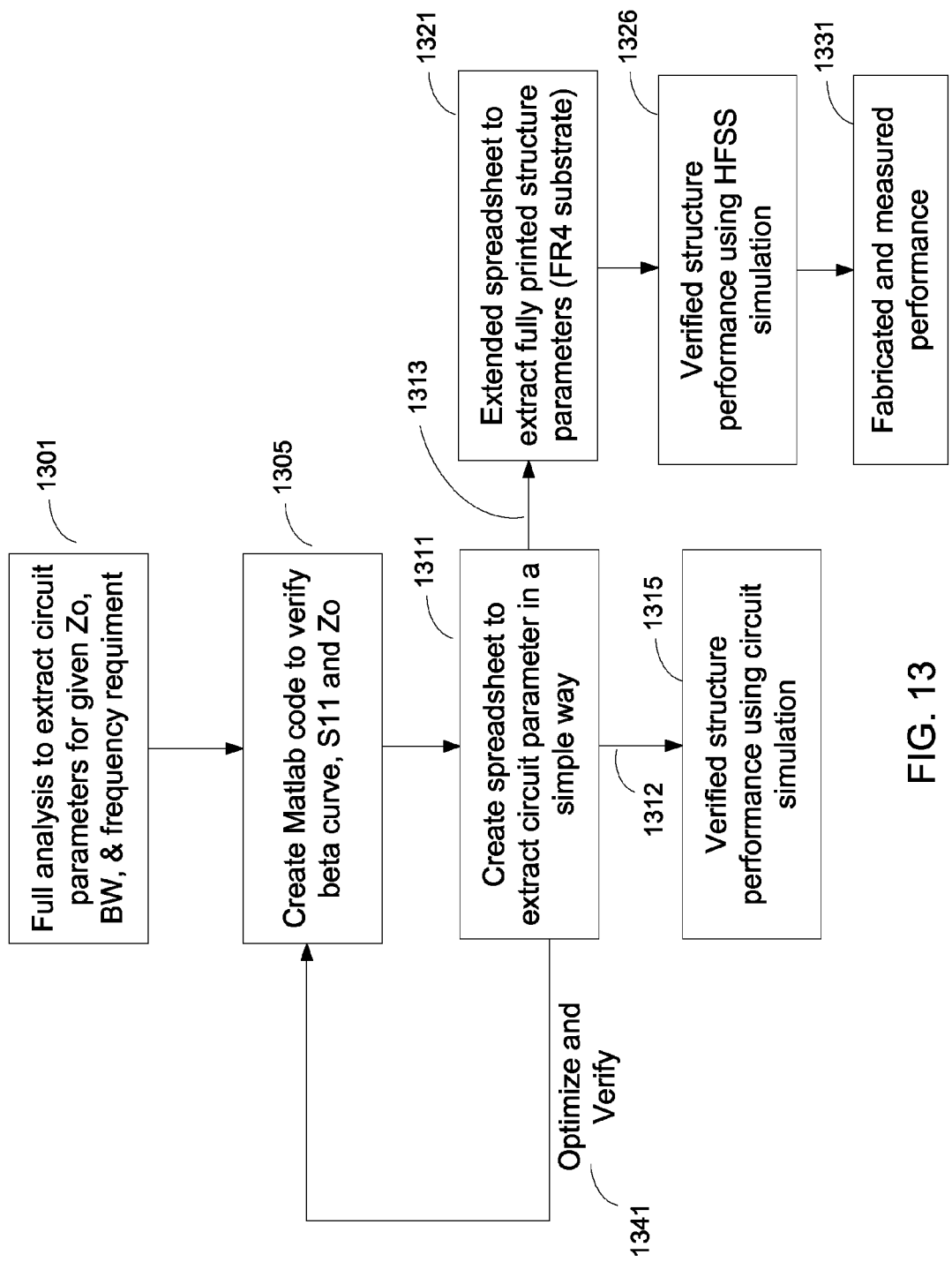
FIG. 13 illustrates C-CRLH and E-CRLH analysis, design, and fabrication steps.

In one implementation, a design approach is provided and shown in FIG. 13 for optimizing and verifying filter designs with or without MTM structures. Steps 1 through 6, described below, provide a process methodology to extract circuit parameters that are considered in the filter designs listed in Table 2.

Step 1 1301: Identify a filter circuit, for example, two different C-CRLH unit cell for Design 4. Next, solve for impedance and a frequency band to extract circuit parameters in order to realize the filter. In other words, provide a full analysis on how to derive cell parameters given specific target bands, bandwidth, and matching conditions.

Step 2 1305: Create a Matlab code or equivalent technical computing software to verify beta curves, return loss, transmission band, and impedance of the filter.

Step 3 1311: Create an Excel spreadsheet or equivalent spreadsheet software program for parameter extraction that allows fast iterative optimization and verification 1341 with the Matlab code or equivalent technical computing software.

Step 4 1315: For discrete circuit designs 1312, verify circuit performance using Ansoft Circuit Designer or equivalent circuit design software tool.

Step 5 1321: For fully printed circuit designs 1313, use the Extended Excel spreadsheet or equivalent spreadsheet software program version to map fully printed design parameters to the circuit design parameters for filter realization. It may be understood by those of ordinary skilled in the art that alternative realizations can include a combination of fully printed and discrete inductors and capacitors.

Step 6 1331: Build and verify the design on FR4 or equivalent substrate for a quick verification. In other words, fabricate multiple designs using discrete components and printed lumped elements, which can be easily combined to create hybrid discrete and printed designs. Printed, discrete, or hybrid printed/discrete filter design can be easily modified to target alternative substrates, such as silicon or ceramic, or fabrication techniques, such as LTCC. In addition, this design methodology can be applied to in designing a filter to tune the target filter quality factor Q and the filter operating frequency.

Figure 14:
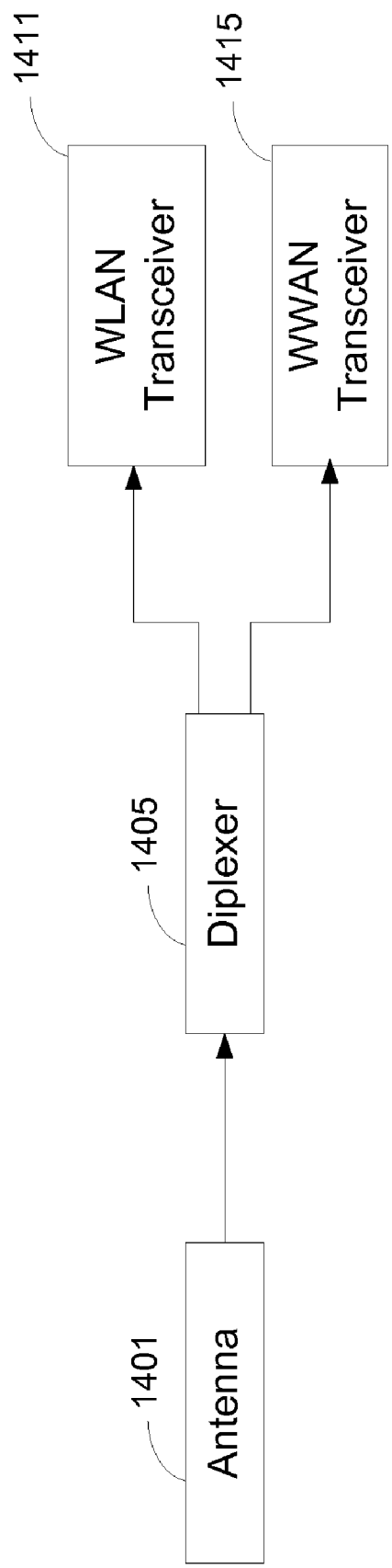
FIG. 14 illustrates functional block diagram of a WWAN/WLAN diplexer.

One application of the filter designs described in Table 2 is in wireless network systems. For example, these filter designs can be applied to a Wireless Local Area Network (WLAN) and a Wireless Wide Area Network (WWAN) diplexer system as discussed in U.S. Patent application Ser. No. 61/050,954 entitled "Single Cable Antenna Solution for Laptop Computer" and filed on May 6, 2008. In some wireless communication applications, it may be desirable to combine and split the WLAN and WWAN signals and route them to their corresponding radio transceivers as illustrated in FIG. 14, for example, where a functional block diagram of a diplexer 1405 is connected to an antenna 1401 and a WLAN 1411 and WWAN 1415 transceivers. Since both WWAN and WLAN radios share a single antenna, the diplexer is responsible to split and combine WWAN and WLAN signals to and from their corresponding transceivers, respectively.

Such a diplexer apparatus can include a main input/output port capable of transmitting and receiving a plurality of signals having a low-band frequency range and a high-band frequency range, a low-band input/output port capable of transmitting and receiving a first signal operating at the low-band frequency, a low-pass filter connecting the main input/output port to the low-band input/output port having a low insertion loss and a sharp upper band edge; a high-band input/output port capable of transmitting and receiving a second signal operating at the high-band frequency; and a high-pass filter connecting the main input/output port to the high-band port having a low insertion and a sharp lower band edge. The isolation defined between the upper edge of the low-band filter and the lower edge of the high-band filter defines is low. As an example, the isolation may be below −25 dB in some applications.

Figure 15A:
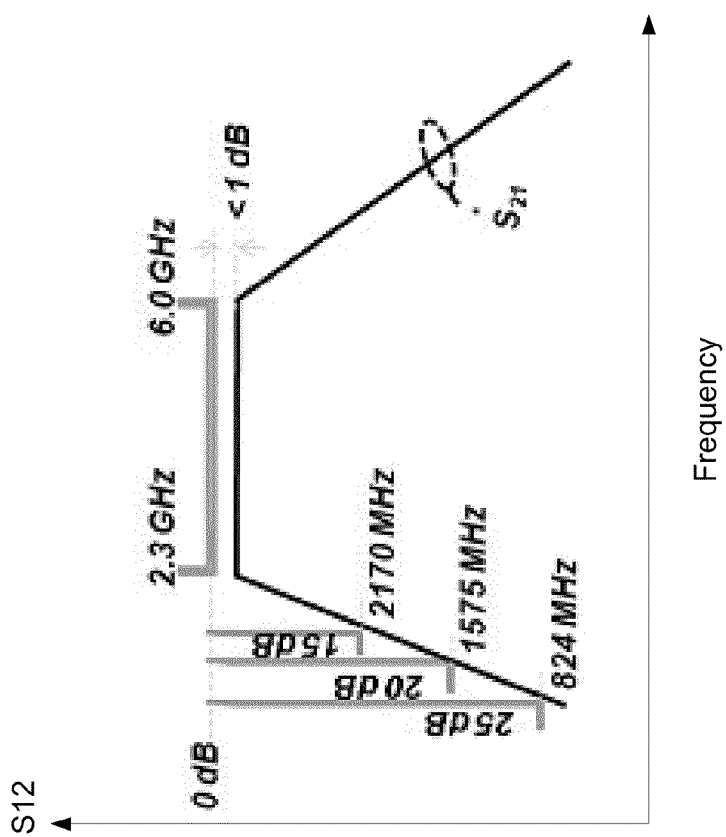
FIG. 15A illustrates a diplexer filter for a low-pass filter with sharp cut-off near 2.2 GHz.
Figure 15B:
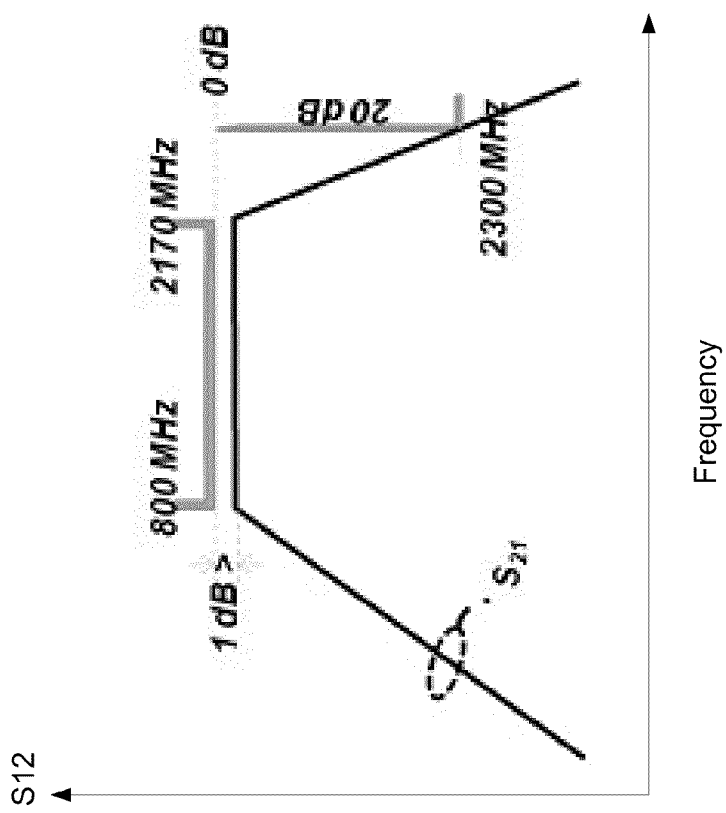
FIG. 15B illustrates a diplexer filter for a high-pass filter with sharp cut-off near 2.2 GHz.

In the example in FIG. 14, the diplexer can be designed using a low-pass filter and a high-pass filter which can have a sharp side band rejection between the two filters as illustrated in the S12 responses as a function of the frequency shown in FIGS. 15A and 15B, respectively. The low-pass filter generally covers the WWAN frequency band 800-2170 MHz and has an insertion loss that is less than 1 dB while the high-pass filter typically covers the WLAN frequency band 2.3-6.0 GHz and has an insertion loss that is less than 1 dB. The side band rejection restriction is such that the WWAN filter can be better than −20 dB at 2.3 GHz and the WLAN filter can be better than −15 dB, −20 dB, and −25 dB rejection at 2.17 GHz, 1.575 GHz, and 0.825 GHz respectively.

Figure 16A:
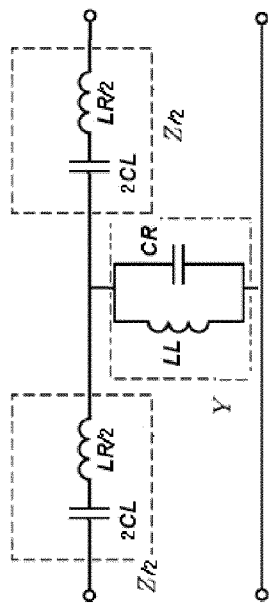
FIGS. 16A-16C illustrates an equivalent circuit of a symmetric CRLH unit cell: (a) Conventional, (b) Dual, (c) Extended.
Figure 16B:
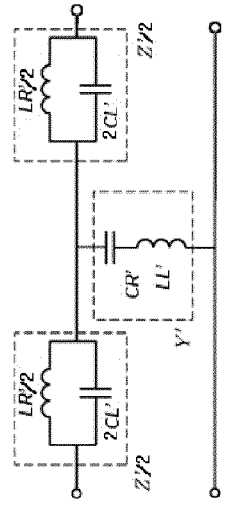
Figure 16C:
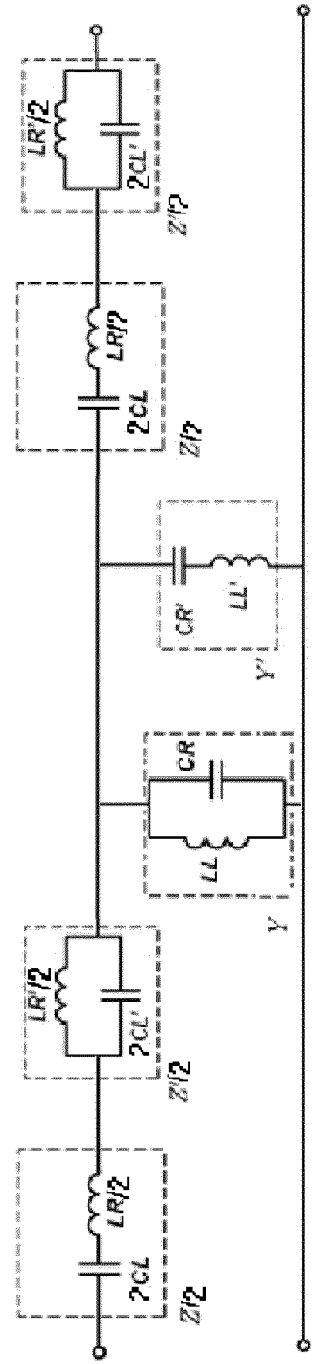

E-CRLH (Designs 1 and 2):

An Extended Composite Right Left Handed (E-CRLH) single cell is illustrated in FIG. 16C. This E-CRLH cell includes a series inductor LR and a series capacitance CL that in combination produce a series resonance $\omega_{SE}$, a shunt inductor LL and a shunt capacitance CR that in combination produce a shunt resonance $\omega_{SH}$, a series inductor LR' and a series capacitance CL' that in combination produce a series resonance $\omega_{SE'}$, and a shunt inductor LL' and a shunt capacitance CR' that in combination produce a shunt resonance $\omega_{SH'}$. The circuit elements in this E-CRLH cell are arranged to form a symmetric cell structure for the E-CRLH unit cell where the input and output of the E-CRLH unit cell have a common circuit structure. In this example, the series inductor LR, the series capacitance CL, the shunt inductor LL, the shunt capacitance CR, the series inductor LR', the series capacitance CL', the shunt inductor LL' and the shunt capacitance CR' are selected to have values that render $\omega_{SE}$ and $\omega_{SH'}$ to be substantially equal, and $\omega_{SH}$ and $\omega_{SE'}$ to be substantially equal.

To an extent, the E-CRLH cell in FIG. 16C can be viewed as a non-linear combination of a Conventional CRLH (C-CRLH) cell (FIG. 16A) and its Dual CRLH (D-CRLH) cell (FIG. 16B). A C-CRLH structure resonates in the LH region at low frequency bands and resonates in the RH region at high frequency bands. In this case, the C-CRLH structure effectively behaves like a band-pass filter that gets sharper as the number of cells is increased. Increasing the number of cells can lead to undesirable conditions such as an increase in transmission loss and larger structure sizes.

A D-CRLH structure, unlike the C-CRLH structure, resonates in the RH region at low frequencies, resonates in the LH region at high frequencies, and acts like stop-band filter. C-CRLH and D-CRLH structures can be combined linearly because each is easier to analyze and implement than the E-CRLH structure, however, this linear combination generally yields to structures that are dominated by the stop-band feature associated with the D-CRLH structure rather than the band-pass properties of C-CRLH.

As previously presented and in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007, full analysis and methodology to design a fully printed and a fully discrete C-CRLH structure for given resonance bands and bandwidth (Q) is provided for cells with full bottom GND. The same methodology and principles used in designing C-CRLH type filters are followed in the E-CRLH filter design except for the use a more complex unit cell structure E-CRLH as illustrated in FIG. 16C. In comparison to CRLH structures, the result differences for E-CRLH structures can be attributed to the presence of the additional LR', CR', LL', CL' parameters.

Four zero order $\omega_{01}$, $\omega_{02}$, $\omega_{03}$, and $\omega_{04}$ resonances that an E-CRLH cell exhibits are listed below in Eq. (12) and Eq. (13). Examples of a fully printed E-CRLH design (FIGS. 27A-E and FIG. 17) and a fully discrete E-CRLH design with pads for components (FIG. 18) are illustrated. Alternatively, a hybrid printed/discrete structure can also be used to realize E-CRLH filter designs.

$$\omega_{SH} = \frac{1}{\sqrt{LLCR}};$$

$$\omega_{SE} = \frac{1}{\sqrt{LRCL}};$$

$$\omega'_{SH} = \frac{1}{\sqrt{LL'CR'}};$$

$$\omega'_{SE} = \frac{1}{\sqrt{LR'CL'}}$$

$$Q_1 = \omega_{SE}^2 + \omega_{SE}'^2 + \frac{1}{LRCL'}$$

$$Q_2 = \omega_{SH}^2 + \omega_{SH}'^2 + \frac{1}{CRLL'}$$

$$\omega_{0,1}^2 = \frac{1}{2}\left|Q_1 - \sqrt{Q_1 - 4\omega_{SE}^2\omega_{SE}'^2}\right|$$

$$\omega_{0,2}^2 = \frac{1}{2}\left|Q_1 + \sqrt{Q_1 - 4\omega_{SE}^2\omega_{SE}'^2}\right|$$

$$\omega_{0,3}^2 = \frac{1}{2}\left|Q_2 - \sqrt{Q_2 - 4\omega_{SH}^2\omega_{SH}'^2}\right|$$

$$\omega_{0,4}^2 = \frac{1}{2}\left|Q_2 + \sqrt{Q_2 - 4\omega_{SH}^2\omega_{SH}'^2}\right|$$

Eq. (12)

Eq. (13)

The impedance is given by Eqs. (14A):

$$Z_C = \sqrt{\frac{Z}{Y}\left(1 + \frac{ZY}{4}\right)};$$

where $$Z = j\omega LR\left(1 - \frac{\omega_{SE}^2}{\omega^2}\right) + \frac{1}{j\omega CL'\left(1 - \frac{\omega_{SE}'^2}{\omega^2}\right)} \text{ and}$$

$$Y = j\omega CR\left(1 - \frac{\omega_{SH}^2}{\omega^2}\right) + \frac{1}{j\omega LL'\left(1 - \frac{\omega_{SH}'^2}{\omega^2}\right)}$$

Eqs. (14A)

Figure 19:
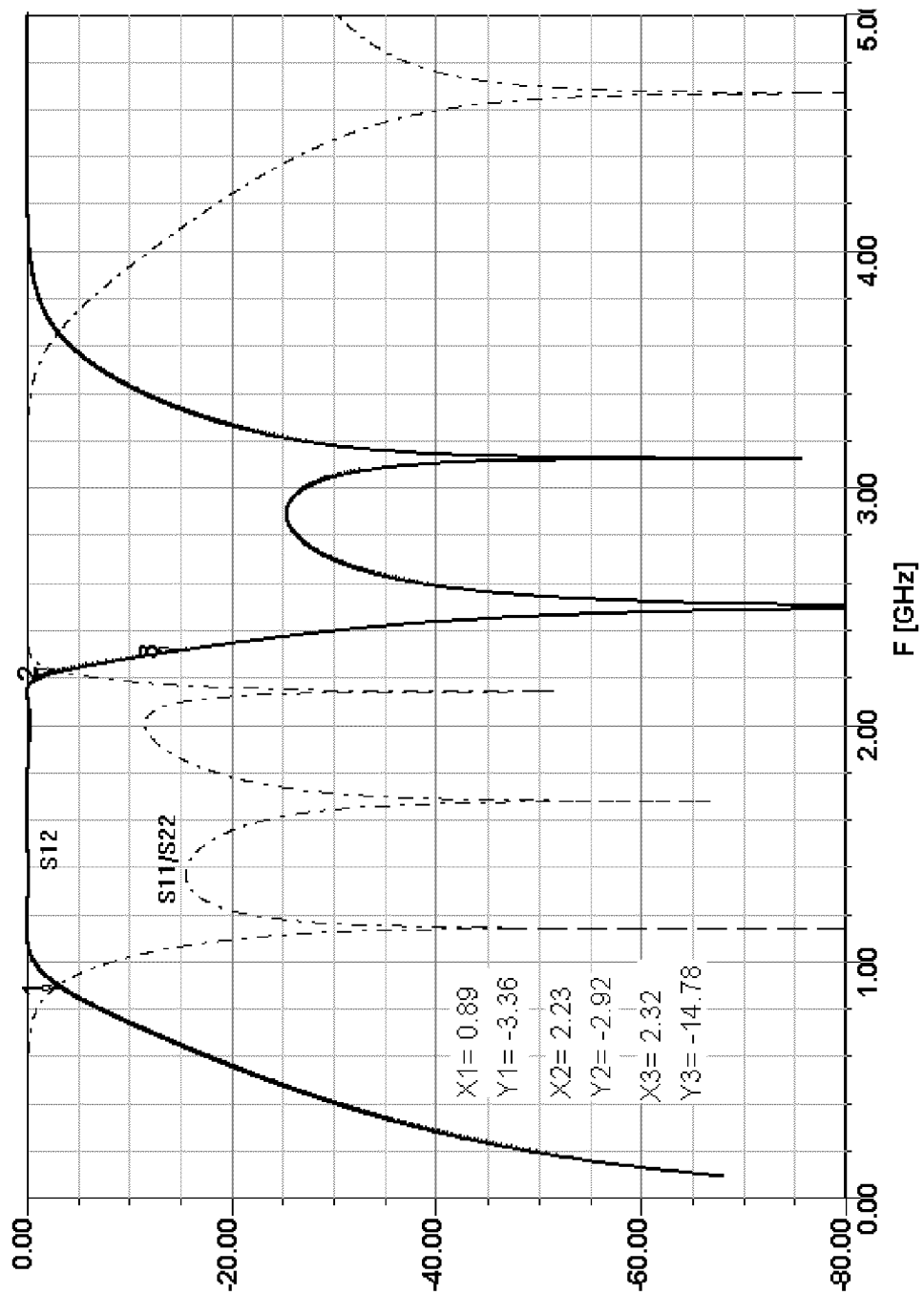
FIG. 19 illustrates a circuit response of the parameters in Table 3.
Figure 20A:
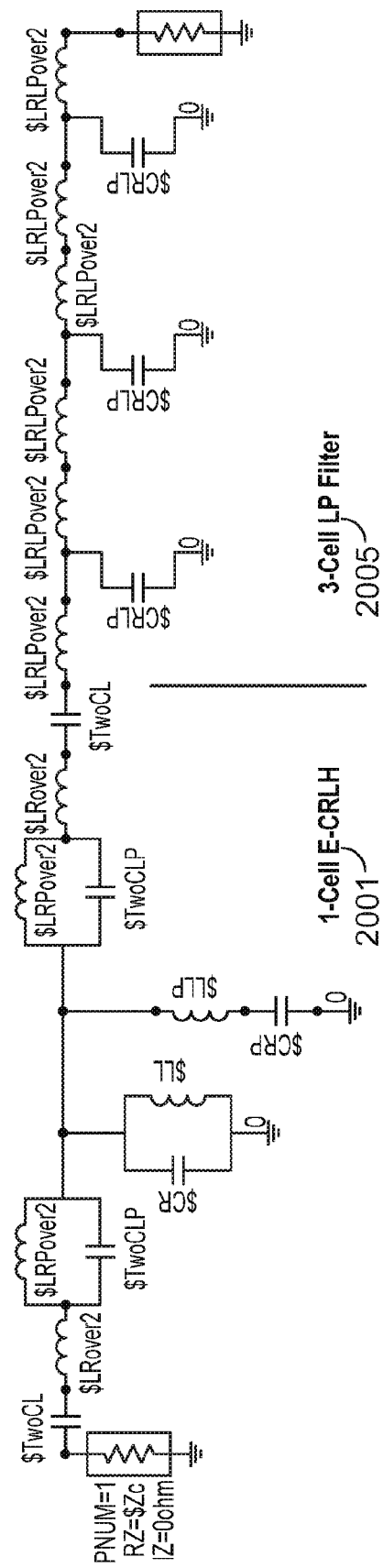
FIG. 20A illustrates a filter design using 1-cell E-CRLH with parameters listed in Table 3 and LP filter described in FIG. 18A-18B.
Figure 20B:
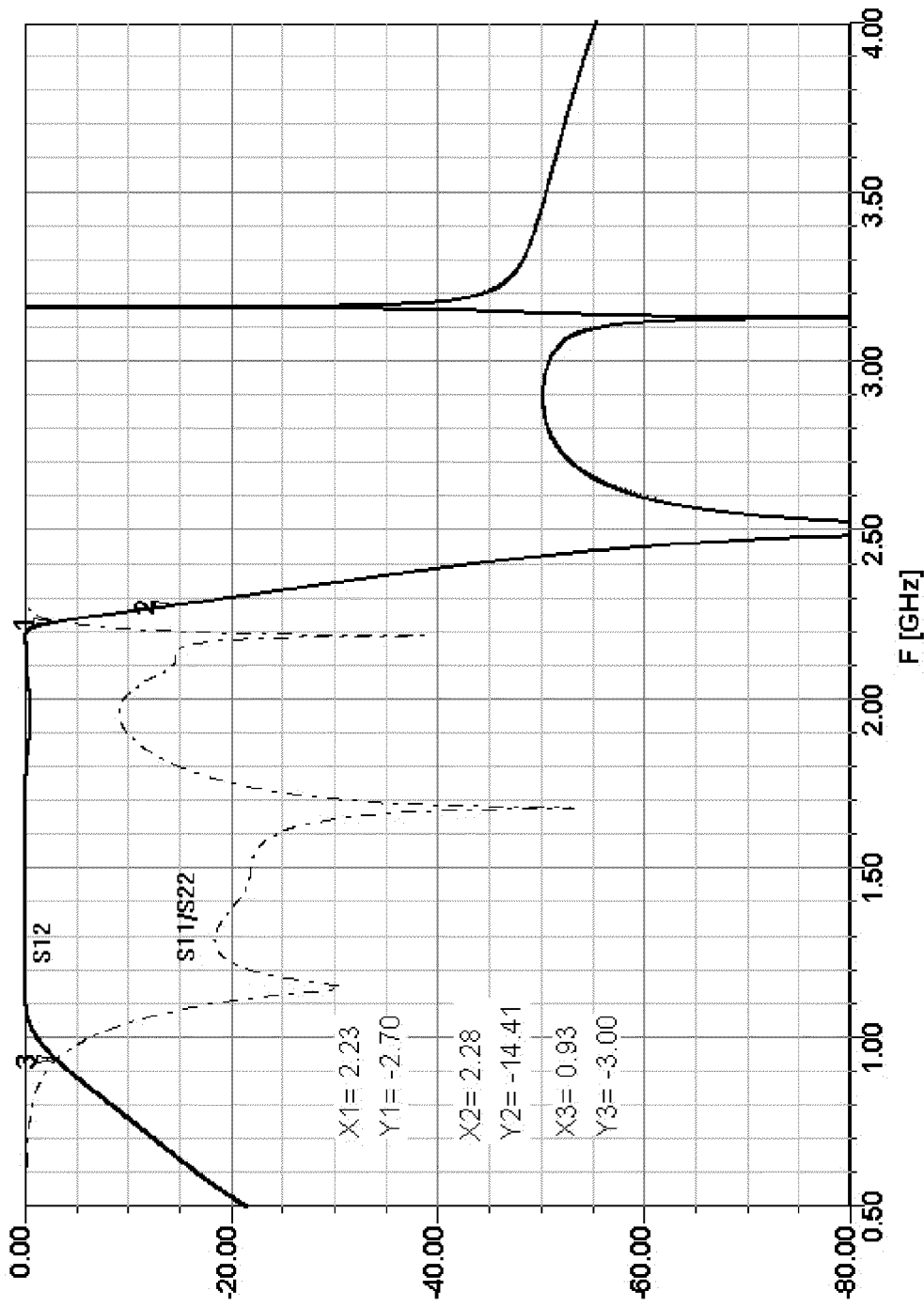
FIG. 20B illustrates a bandpass filter response of the circuit in FIG. 20A.
Figure 21A:
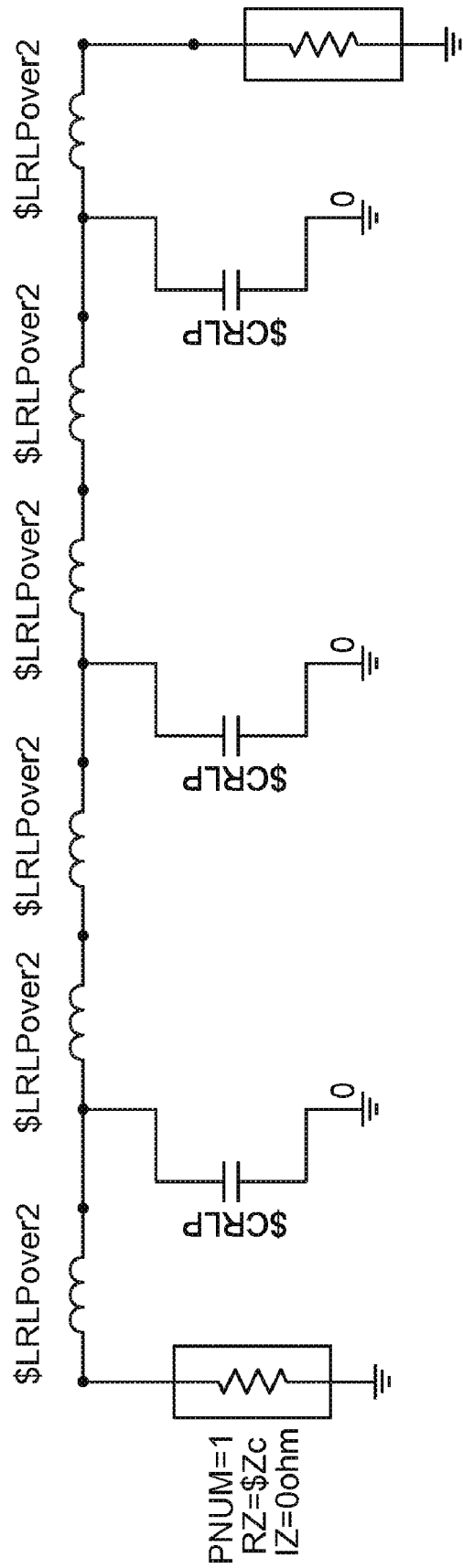
FIG. 21A illustrates a 3-cell LP Filter circuit where LRLPover2=9.33 nH/2 and CRLP=1.9 pF.
Figure 21B:
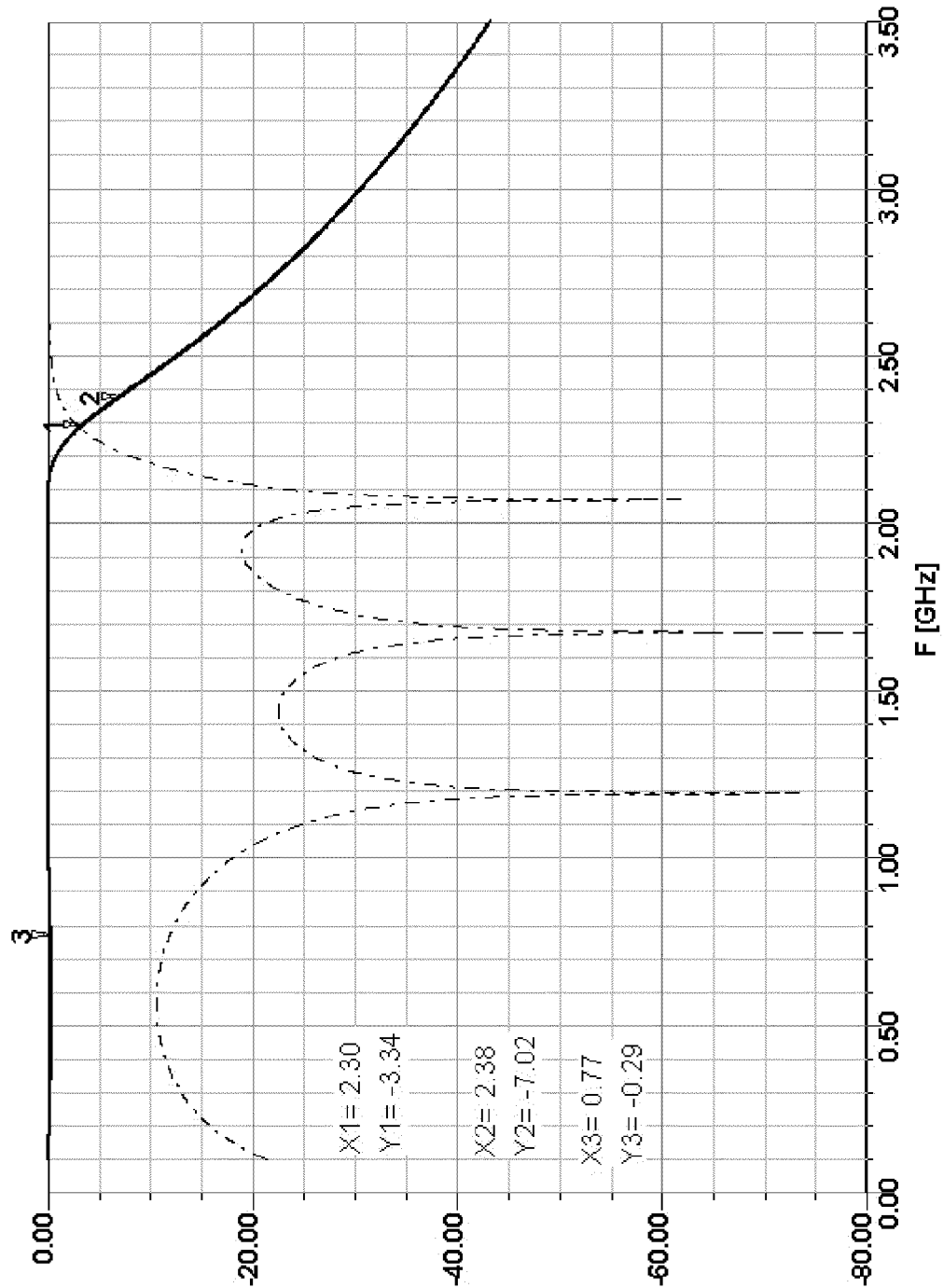
FIG. 21B illustrates an LP Filter response of the circuit in FIG. 21A.

I. Filter Design BE 1 (Balance Extended):

The present techniques may be used to particular advantage in context of a balanced extended design. An example of a broadband filter using the E-CRLH structure is illustrated in FIG. 16C. The values of the corresponding circuit parameters are listed in the table below, while the filter responses of the E-CRLH unit cell and E-CRLH unit cell with LP are depicted in FIG. 19 and FIG. 20B, respectively. Referring to FIG. 19, a 1-cell E-CRLH filter spans the range of about 0.89 GHz to 2.23 GHz at −3 dB and has a sharp side band rejection edge on the upper edge of the band. To eliminate higher bands, a LP pass can be added after the main E-CRLH filter. This LP filter may be comprised of three symmetric cells with series inductor LRLP=0.33 nH and shunt capacitor CRLP=1.9 pF. The response plot of the LP filter is illustrated in FIG. 21B. The upper edge of the LP filter is about 2.3 GHz at −3 dB making it a good candidate to eliminate bands above 2.3 GHz in the main filter response shown in FIG. 19. The combined 1-cell E-CRLH 2001 and 3-cell LP filter circuit 2005 is illustrated in FIG. 20A and its response plot is illustrated in FIG. 20B. In some designs, only the lower band, with its sharp upper filter band edge, may be achieved while maintaining near zero insertion loss (i.e., no ripples).

TABLE 3

E-CRLH parameters

| Parameter | Value | Units |
|---|---|---|
| $Zc | 50 | Ohm |
| $LRover2 | 2.5/2 | nH |
| $CR | 1 | pF |
| $LRPover2 | 3.67/2 | nH |
| $CRP | 0.94 | pF |
| $LL | 4 | nH |
| $TwoCL | 2 * 1 | pF |
| $LLP | 2.75 | nH |
| $TwoCLP | 2 * 1.1 | pF |

A low-pass post-filter may be used to eliminate all bands higher than 3 GHz. An example of a 3-cell Low-Pass (LP) filter is provided in FIG. 21A.

II.A. Filter Design UE 2.1 (Unbalanced Extended):

Recent debate between several wireless telecommunication companies over the January 2008 auction of and rights to use Spectrum D (758-763 MHz and 788-793 MHz), which can enable more robust wireless communication, is one example where wireless providers must operate in narrow bands constraints. In the case of Spectrum D, the basic challenge is to operate in two separate 5 MHz bands without interfering with adjacent Public Safety Bands BB (763-768 MHz and 793-799 MHz) that have stringent side band rejection requirements. Thus, a very sharp, high-Q filter may offer a viable and practical solution to address the basic challenge of operating in Spectrum D.

The present techniques and filters may be configured to address such challenges in context of an unbalanced extended design where an E-CRLH is used as part of the design and construction of a high-Q filter.

Figure 22:
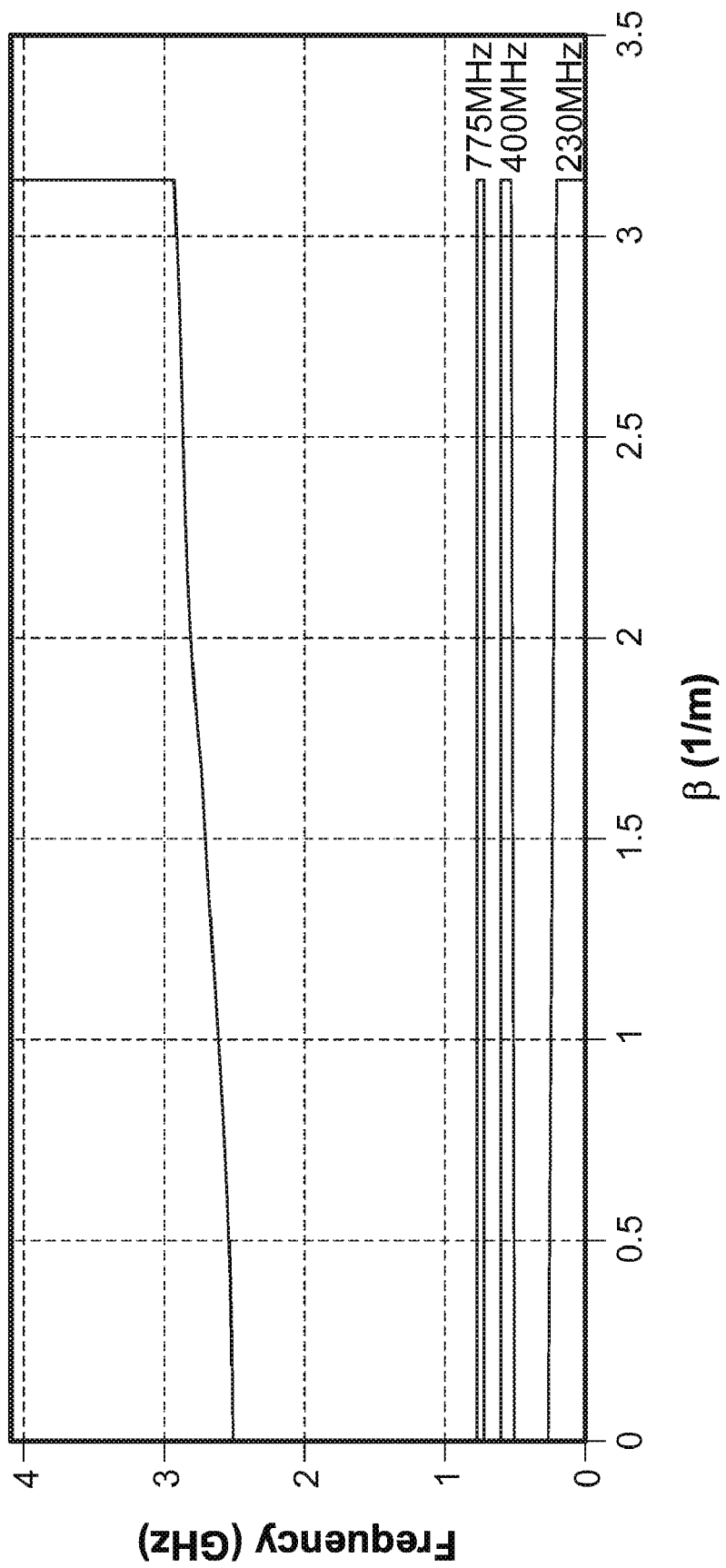
FIG. 22 illustrates an example of an E-CRLH unit cell propagation constant $\beta$ versus frequency

FIG. 22 depicts an example of an E-CRLH beta curve. In this example, the E-CRLH design may start with low-frequency resonances in the 260 MHz band, and then move to the RH region to excite the 390 MHz band. Subsequently, the dispersion curve can move back to the LH region to excite the 780 MHz band before continuing in the RH region.

Figure 23:
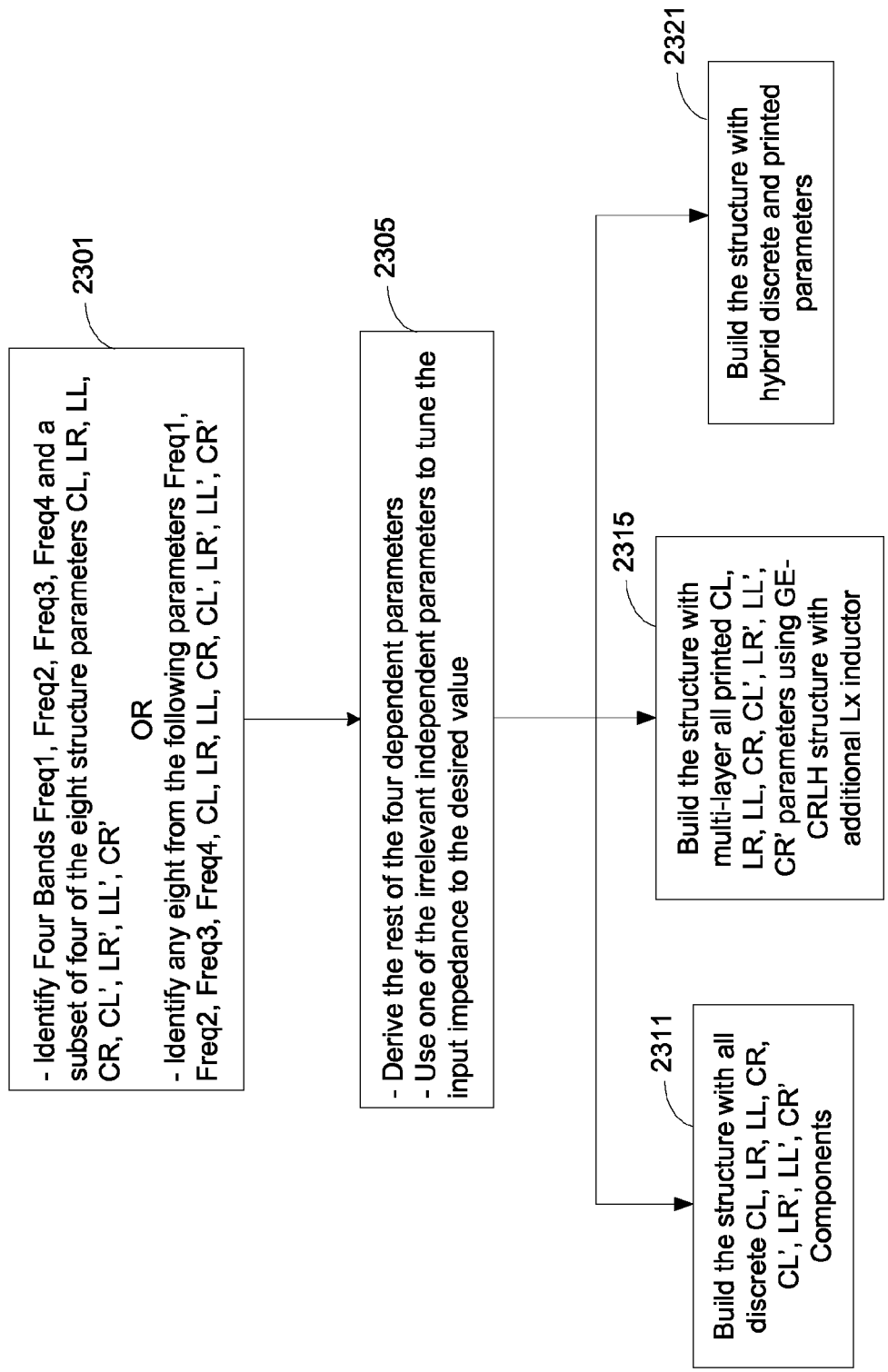
FIG. 23 illustrates a flowchart for deriving dependent parameters and building CRLH structures.

FIG. 23 illustrates a flow chart that represents the methodology and steps to design and construct all printed, discrete, or hybrid printed/discrete E-CRLH structure. Referring to FIG. 23, step 1 2301 includes identifying four bands Freq1, Freq2, Freq3, Freq4 and a subset of four of the eight structure parameters CL, LR, LL, CR, CL', LR', LL', CR'. By doing so, the target filter bands are specified by the four frequency inputs and the rest of the four independent parameters selected from CL, LR, LL, CR, CL', LR' LL', CR' are used to match the structure at these target frequency bands. Alternatively, any eight from the following parameters Freq1, Freq2, Freq3, Freq4, CL, LR, LL, CR, CL', LR' LL', CR' can be selected as independent parameters. Step 2 2305 includes deriving the rest of the four dependent parameters followed by using one of the irrelevant independent parameters to tune the input impedance to the desired value. Step 4 2311, step 5 2315, and step 6 2321 involves constructing various E-CRLH structures such as a discrete component, a multi-layer printed GE-CRLH structure, and a hybrid discrete printed structure, respectively.

The E-CRLH rich dispersion characteristics can provide a unique means to manipulate its dispersion curves to excite a higher number of frequency bands with target values of Q (bandwidth). In particular, a high-Q filter can be used to enable wireless communication devices to operate over very narrow bands without interfering with adjacent bands.

Fully Discrete E-CRLH

An example of fully discrete E-CRLH structure is illustrated in FIG. 16C and is based on the following parameters as illustrated in Table 4:

Freq1=0.3876 GHz

Freq2=2.3461 GHz

Freq3=0.2584 GHz

Freq4=0.78 GHz

LR=5.4 nH

CR=18 pP

LL'=18 nH

CL'=6 pF

A proprietary parameter extraction software can be used to derive the rest of the parameters:

LR'=23.9978169 nH

CR'=2.71641771 pF

LL=17.9823 nH

CL=0.99996 pF

TABLE 4

Parameter extraction of FIGS. 18, 22, 24, 25, and 26 fully-discrete E-CRLH

| N Inputs | 1 | | Outputs | | |
|---|---|---|---|---|---|
| Freq0_1 | 0.3876 | GHz | Freq0_3 | 0.2584 | GHz |
| Freq0_2 | 2.3461 | GHz | Freq0_4 | 0.78 | GHz |
| LR | 5.4 | nH | LL | 17.9823 | nH |
| CR | 18 | pF | CL | 0.99996 | pF |
| LR' | 23.9978169 | nH | LL' | 18 | nH |
| CR' | 2.71641771 | pF | CL' | 6 | pF |
| LRover2 | 2.7 | nH | LR'over2 | 11.9989 | nH |
| 2CL | 1.9999268 | pF | 2CL' | 12 | pF |

Figure 18:
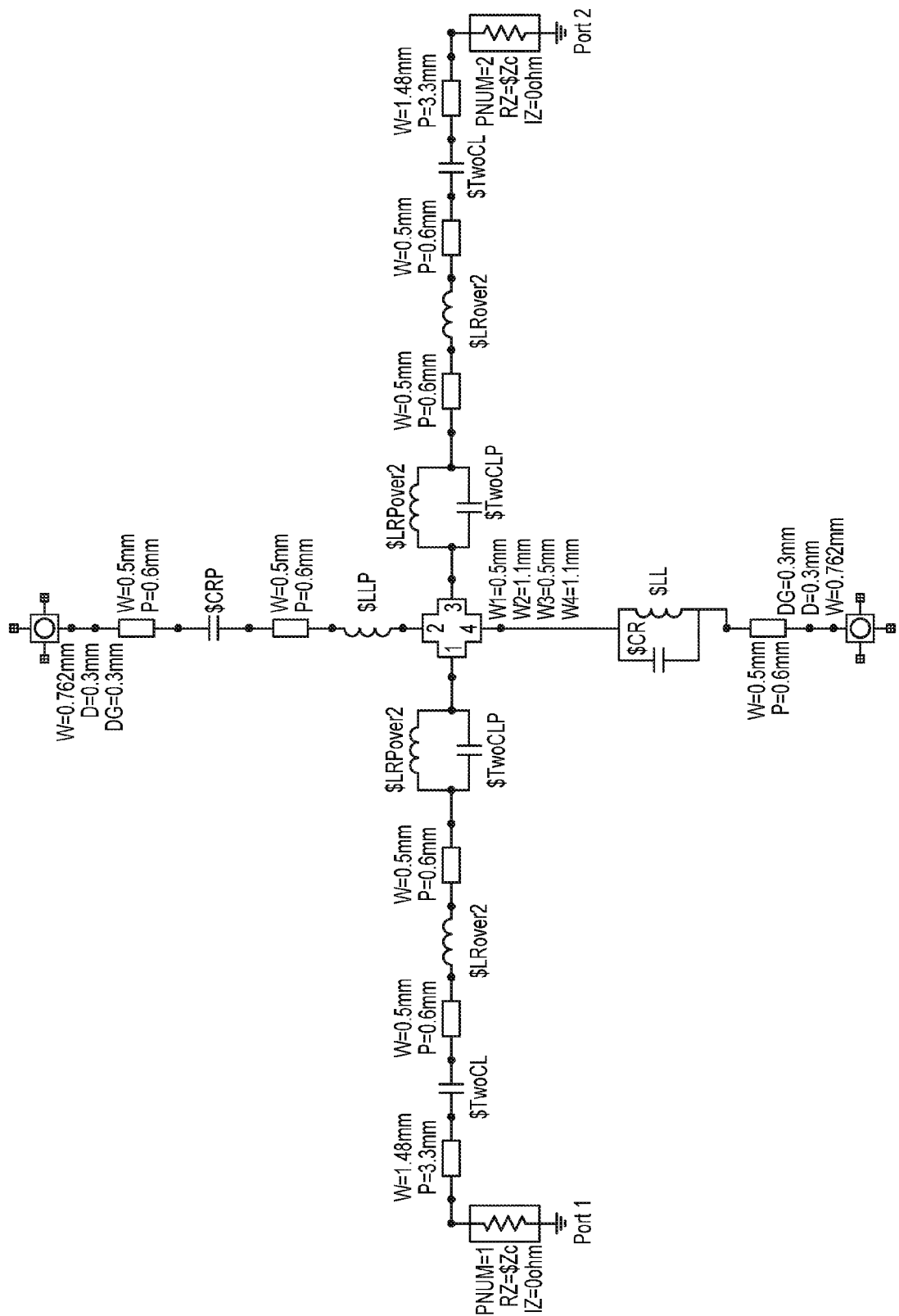
FIG. 18 illustrates an equivalent circuit of the E-CRLH high-Q filter in FIG. 25.

FIG. 22 illustrates a dispersion curve of the circuit shown in FIG. 18. This chart suggests that a given constraint in designing such a structure is exciting high-Q bands, which can be easily seen by the near-flat beta curves at the three desired 260 MHz, 390 MHz, and 780 MHz bands. One advantage of such a design is the ability to match the three bands with a 50 Ohm input impedance feed-line.

Simulation for this design approach can be conducted using a designer software tool such as Ansoft. The results of which are presented in FIG. 24. The three extremely sharp bands are summarized in Table 5 at a −3 dB return loss.

TABLE 5

Figure 24:
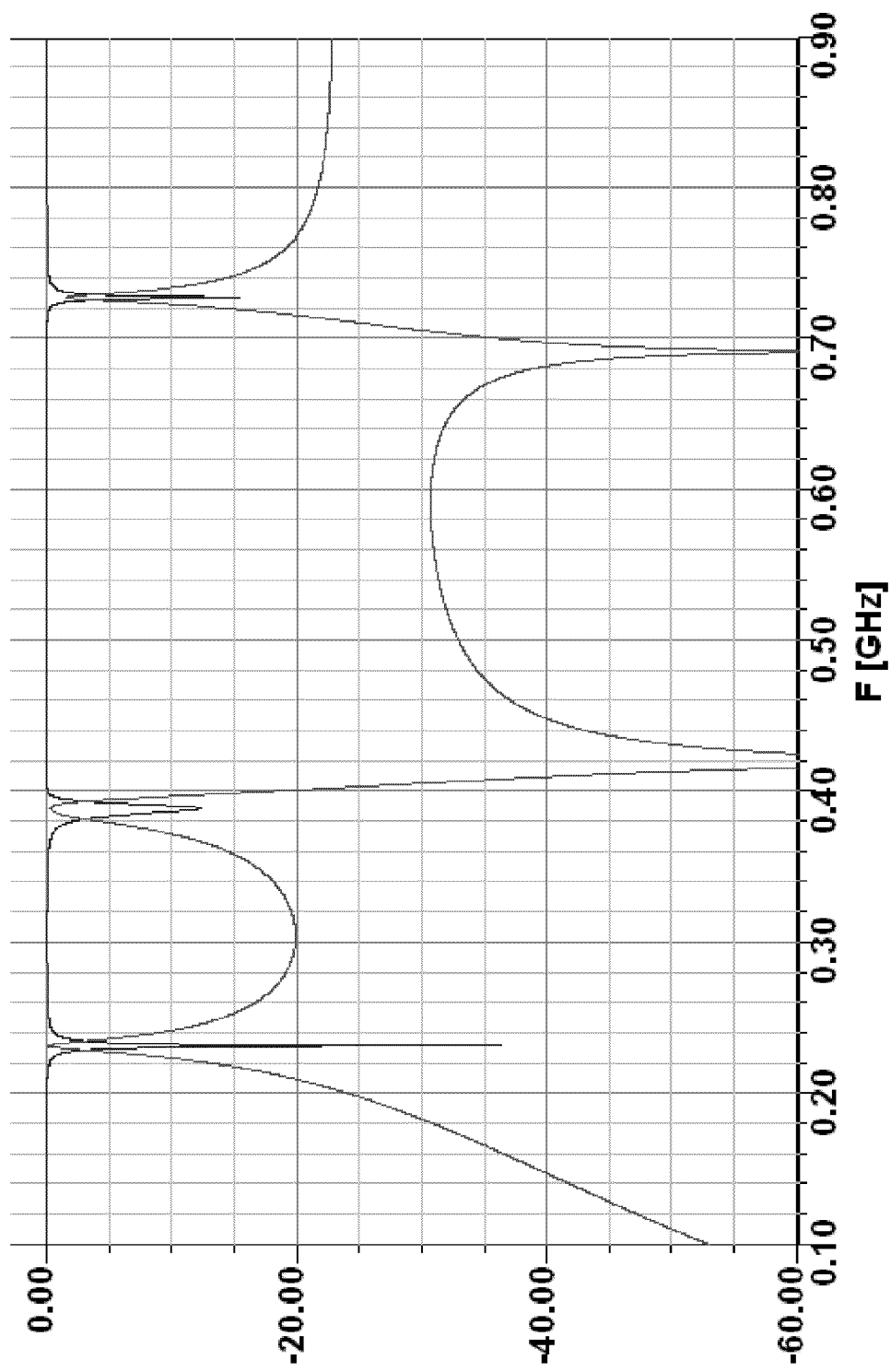
FIG. 24 illustrates simulated S11 and S12 of the E-CRLH circuit in FIG. 25.

The three frequency band of structure simulated in
FIGS. 18, 22, and 24 at a −3 dB return loss.

| MinFreq | MaxFreq | CtrFreq | Q |
|---|---|---|---|
| 228 | 234 | 231 | 38.5 |
| 382 | 393 | 387.5 | 35.22727 |
| 725 | 730 | 727.5 | 145.5 |

Figure 25:
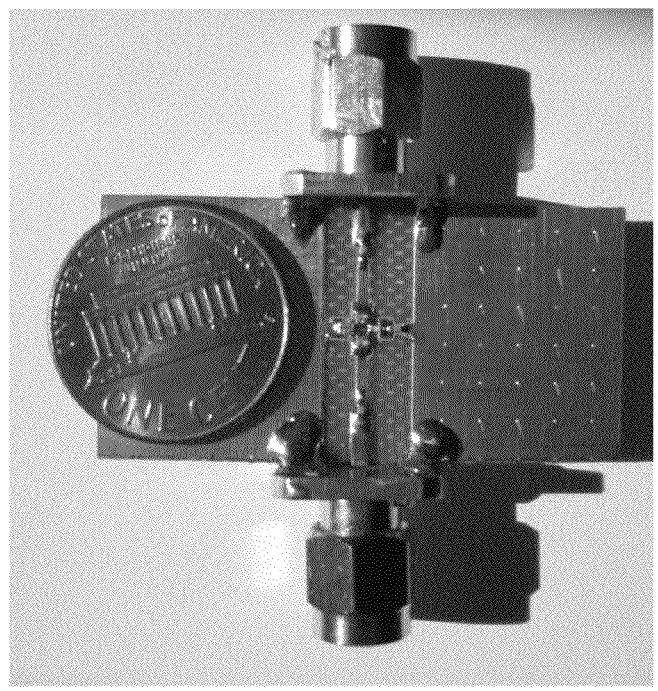
FIG. 25 illustrates a picture of a high-Q filter built with discrete components.
Figure 26:
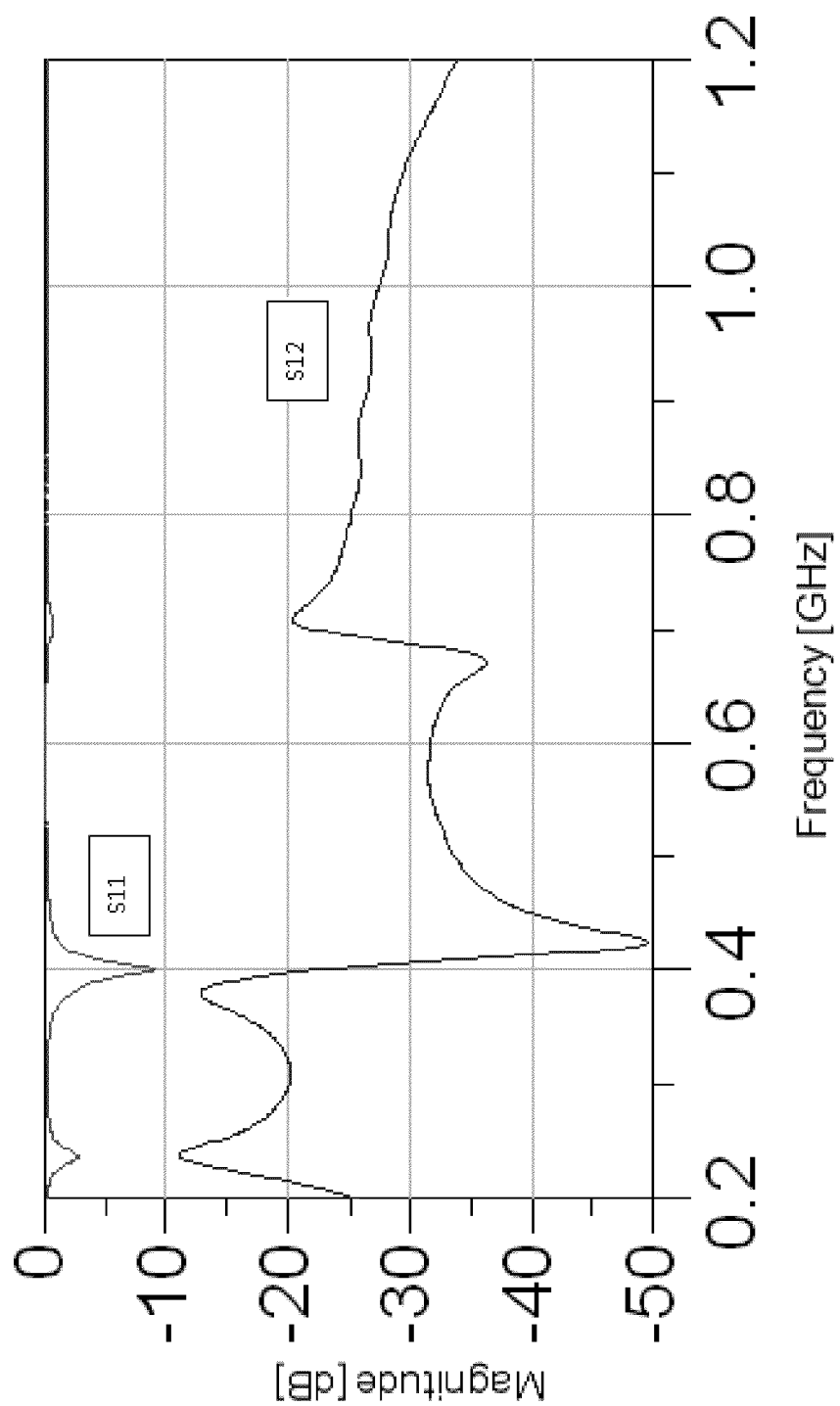
FIG. 26 illustrates preliminary results of S11 and S12 of the filter in FIG. 25.
Figure 27A:
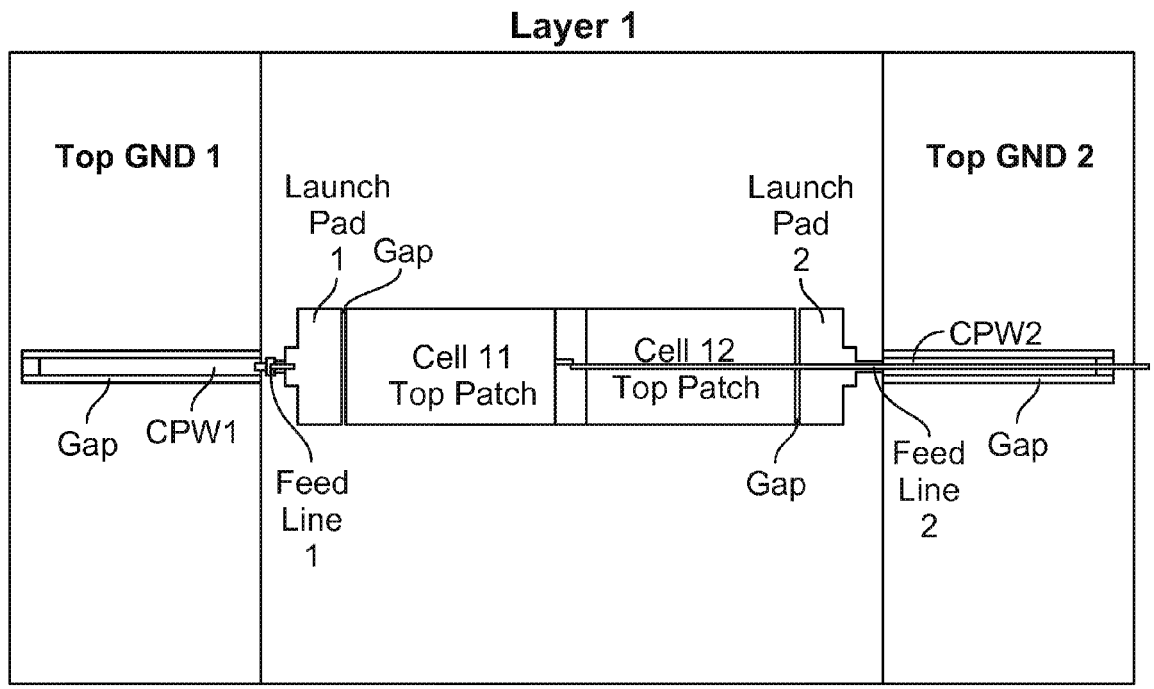
Figure 27B:
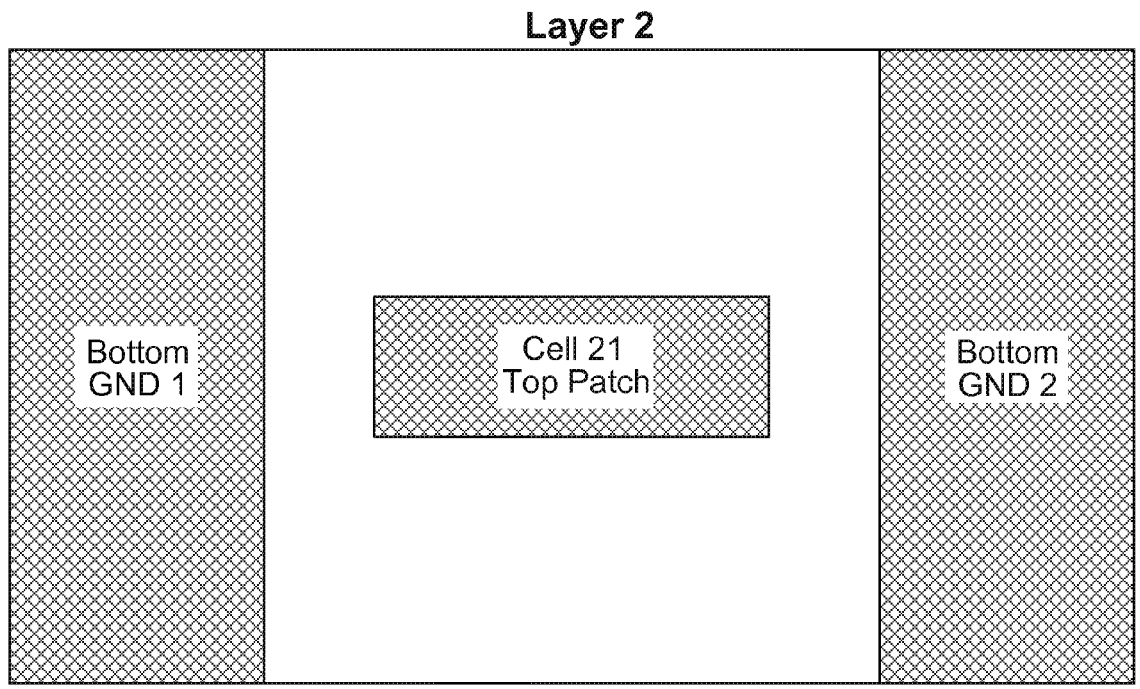
Figure 27C:
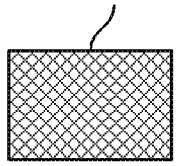
Figure 27D:
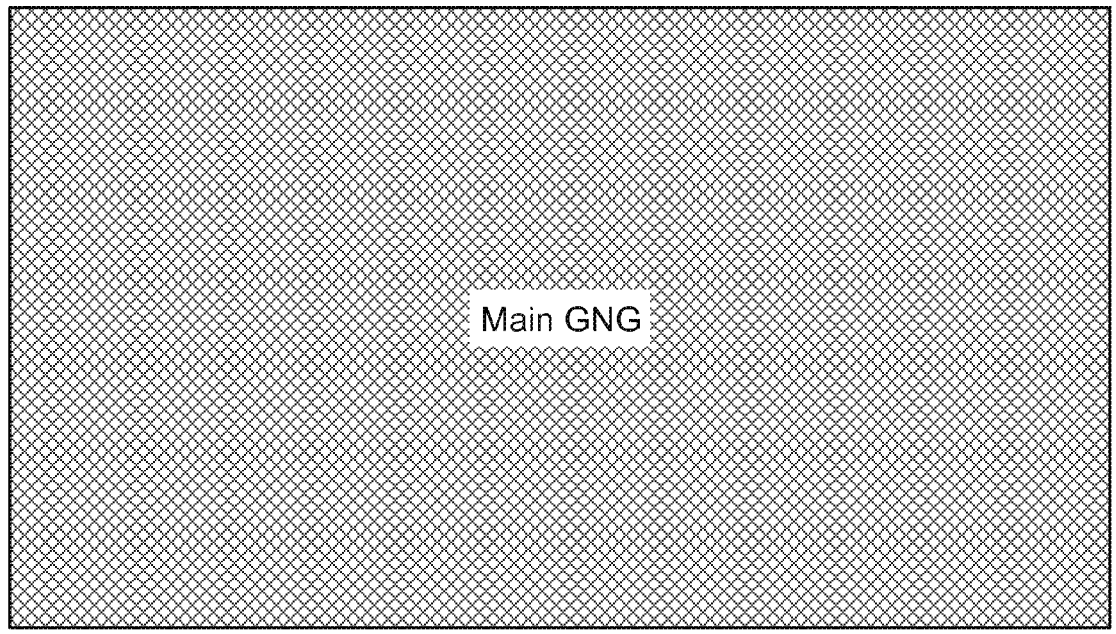
Figure 27E:
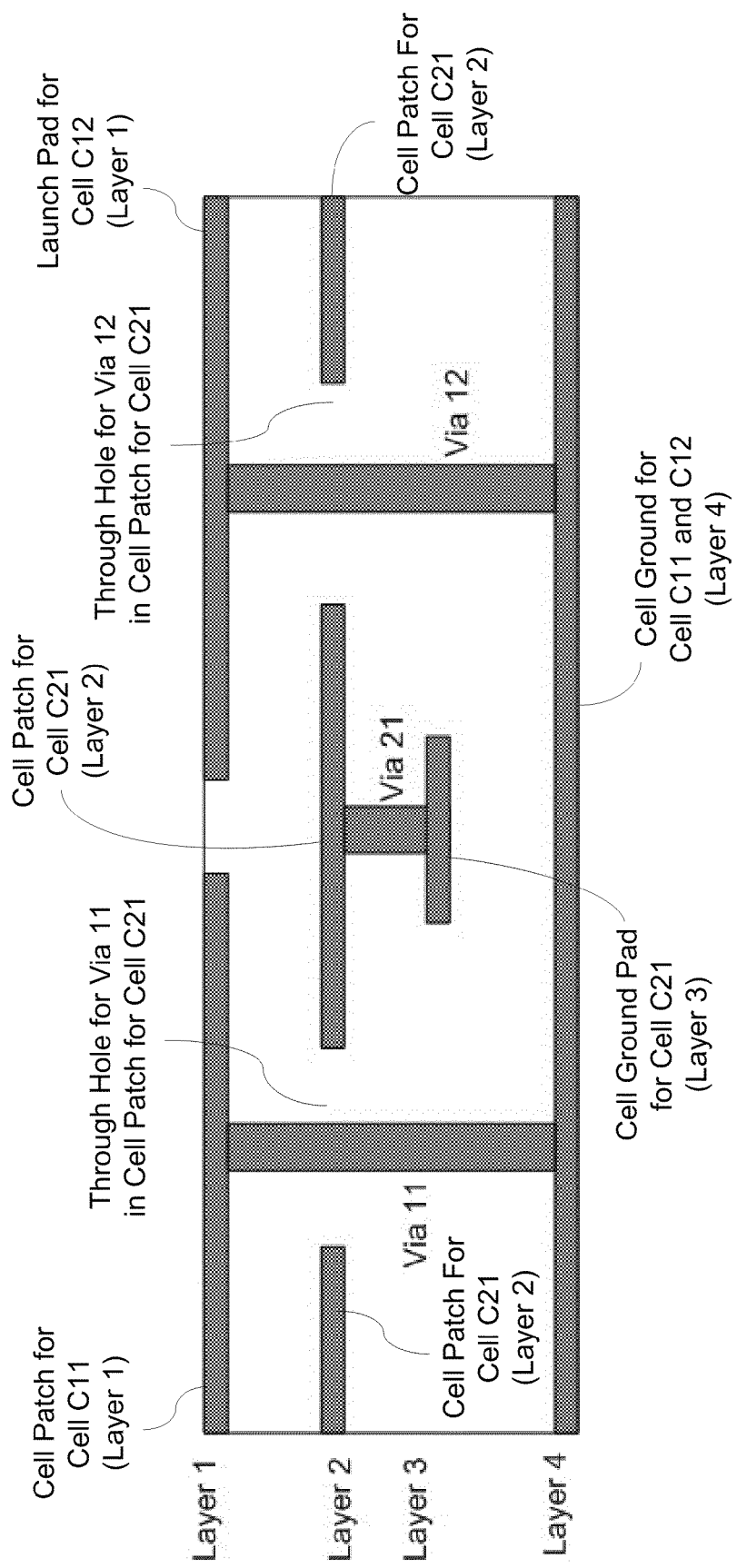

A photograph of a preliminary 1-cell E-CRLH fabrication is illustrated in FIG. 25. The goal of fabricating this structure is intended to demonstrate the existence of these three resonances rather than optimize losses. FIG. 26 illustrates measured results for S11 and S12. By comparing the simulated results in Table 5 to the measured results in FIG. 26, it is apparent that the three resonances 236 MHz, 400 MHz, and 704 MHz are very close to the theoretical model.

In this design, a high-pass post-filter can be used to eliminate the lower two bands, 236 MHz and 400 MHz, and preserve the 700 MHz bandpass.

Fully Printed E-CRLH

Figure 17:
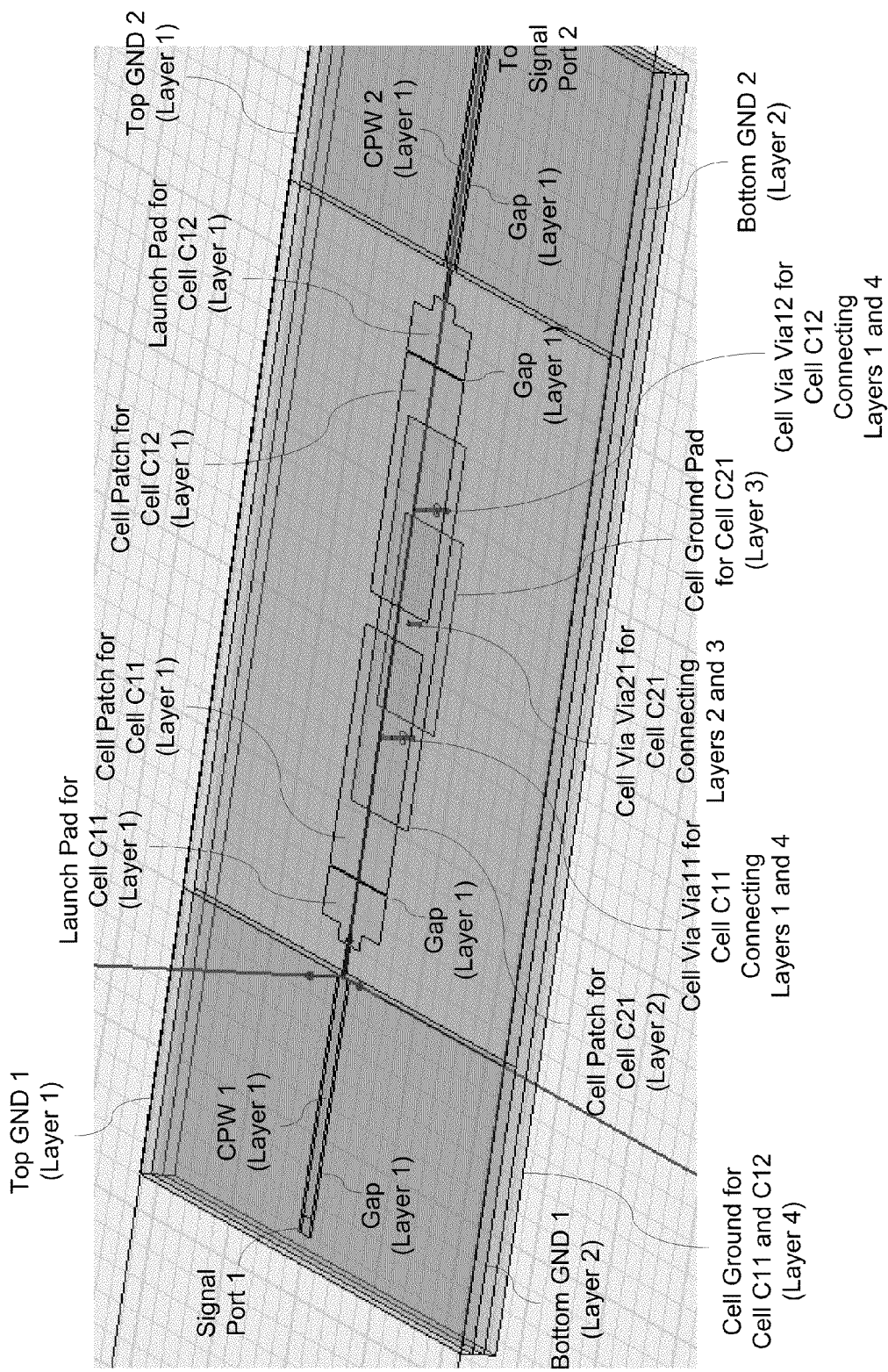
FIG. 17 illustrates a 3D view of Four-layer all printed design of unit Generalized E-CRLH (GE-CRLH)

An example of fully printed E-CRLH structure is illustrated in FIG. 17, and is based on a 4-layer design as illustrated in FIGS. 27A-27E and detailed in Table 7. This particular E-CRLH unit cell has a printed circuit structure formed in four separated metallization layers which that are parallel to one another. The first metallization layer is patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line. The second metallization layer is patterned to comprise a first conductive cell patch positioned underneath the first metallization layer between the first and second cell patches and to enhance electromagnetic coupling across the gap. The third metallization layer is patterned to comprise a second conductive cell underneath the first conductive cell patch in the second metallization layer. The first conductive via is provided to connect the first conductive cell patch in the second metallization layer and the second conductive cell patch in the third metallization layer. This design also includes a fourth metallization layer to provide a ground electrode for the apparatus, a first cell via and a second cell via between the first metallization layer and the ground electrode. The first cell via connects the first cell patch on the first metallization layer and the ground electrode in the fourth metallization layer and is separate from and without direct contact with the first and second conductive cell patches. The second cell via connects the second cell patch on the first metallization layer and the ground electrode in the fourth metallization layer, is separate from and without direct contact with the first and second conductive cell patches. Vias connecting inter-layer metallization are commonly referred to by "buried vias," such as the via 21 between the second and the third layers. In some fabrication techniques, it is challenging to align buried vias when assembling the substrates on top of each other, hence the need to use "though vias" from top to bottom layers. This is accomplished by clearing metallization around a "pass through via" on a layer where the via is not connected to the metallization.

In one implementation as shown in FIGS. 17, and 27A-E, the first metallization layer is patterned to comprise a first top ground electrode adjacent to the first launch pad and a second top ground electrode adjacent to the second launch pad and the second metallization layer is patterned to comprise a first bottom ground electrode underneath the first top ground electrode and a second bottom ground electrode underneath the second top ground electrode. The first top ground electrode is patterned to support, in combination with the first bottom ground electrode, a first co-planar waveguide (CPW) that is coupled between the first signal port and the first feed line, and the second top ground electrode is patterned to support, in combination with the second bottom ground electrode, a second CPW that is coupled between the second signal port and the second feed line.

Figure 28A:
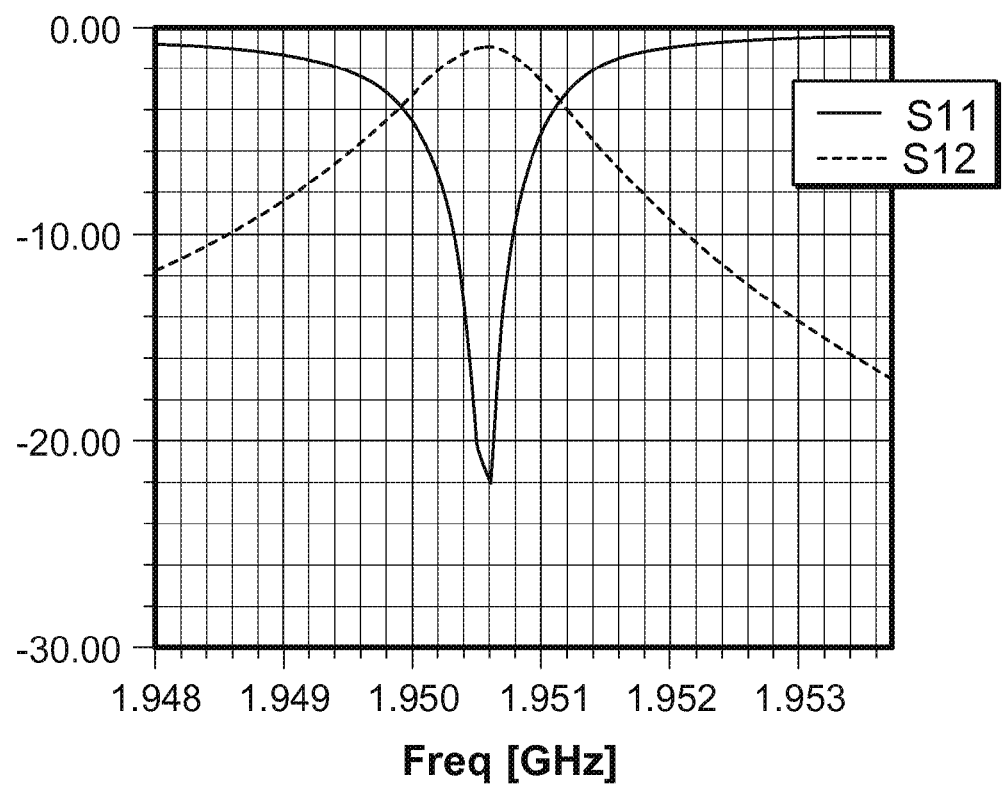
FIGS. 28A-28B illustrate ...
Figure 28B:
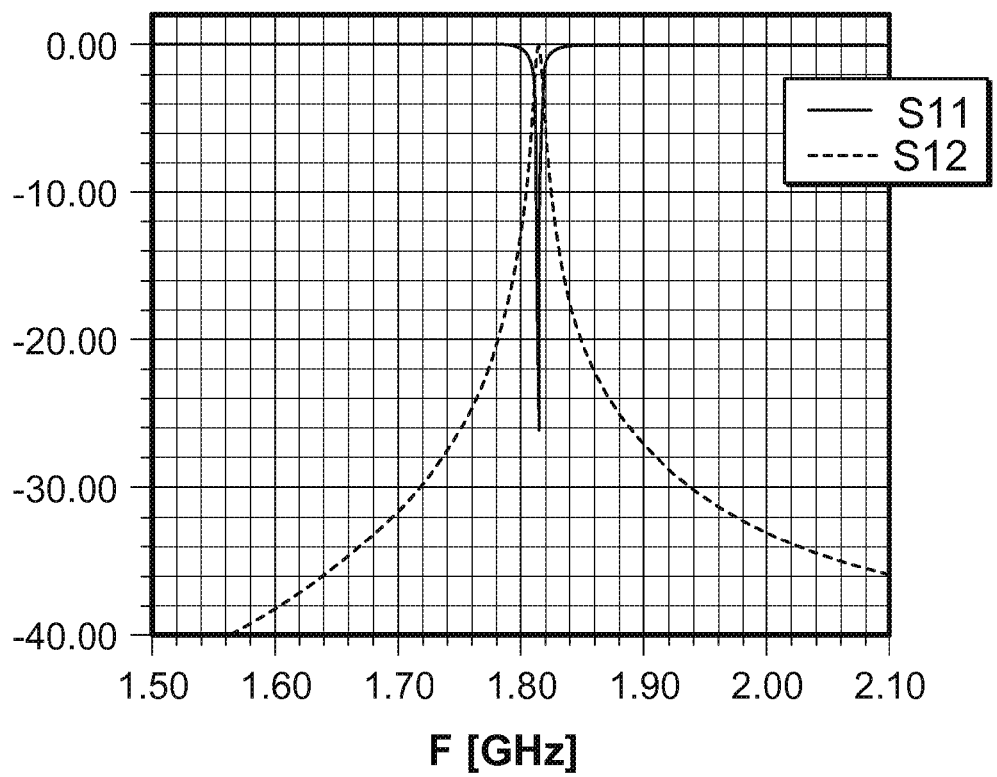

The same parameter extraction is followed as in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007. However, for this parameter extraction, a more complex E-CRLH structure and analysis is utilized. The parameter extraction results for the fully printed E-CRLH structure are provided in Table 6. HFSS simulation results (FIGS. 28A-28B) show very sharp resonance frequencies at 1.95 GHz, which is a MHz shift between analysis and 3D HFSS modeling of the structure. Next, the fabrication of a 4-layer structure using the LPKF protomat S60 to compare results with analysis and HFSS results is presented. Note, the sharp resonance is at 1949.75 MHz-1.951 MHz at −3 dB return loss. High-Q filters with low insertion loss are difficult to design because of its narrow band and high side-band rejection.

TABLE 6

Corresponding circuit parameter of the structure in FIG. 16C

| N Inputs | 1 | | Outputs | |
|---|---|---|---|---|
| Freq0_1 | 2.85 | GHz | Freq0_3 | 1.8387 GHz |
| Freq0_2 | 12.3675 | GHz | Freq0_4 | 5 GHz |
| LR | 1.5 | nH | LL | 0.62361 nH |
| CR | 5.2 | pF | CL | 0.11271 pF |
| LR' | 0.51015111 | nH | LL' | 0.5 nH |
| CR' | 4.69155134 | pF | CL' | 6 pF |
| LRover2 | 0.75 | nH | LR'over2 | 0.25508 nH |
| 2CL | 0.22542211 | pF | 2CL' | 12 pF |

TABLE 7

Detailed printed structure in FIGS. 17 and 27A-27E

| Layer 1: Top Layer | CPW feed line | 15 mm long 50 Ohm line grounded CPW line with CPW-GND located on layer 2 layer 2 |
|---|---|---|
| | Launch Pad (LP) | Section1: 0.5 × 2 mm; Section2: 3 × 1 mm; Section3: 8 × 3 mm, gap between LP and Cell 11 is 0.1 mm |
| | Cell 11 & Cell 12 | 8 mm wide and 15 mm long |
| Substrate 1 | 80 mm long 45 mm wide 0.787 mm thick | Via 11 with 12 mil diameter and located at 15 mm from left GND edge Via 12 with 12 mil diameter and located at 15 mm from right GND edge |
| Layer 2 | CPW GND | 45 mm wide and 17.9 mm long |
| | Cell 21 | 8 mm wide and 24 mm long located at 10.1 mm from left GND in layer 2 |

TABLE 7-continued

Detailed printed structure in FIGS. 17 and 27A-27E

|  | GND Line | Connects Bottom Cell Patch with the main GND |
|---|---|---|
| Substrate 2 | 80 mm long 45 mm wide 0.787 mm thick | Via 11 with 12 mil diameter and located at 15 mm from left GND edge Via 12 with 12 mil diameter and located at 15 mm from right GND edge Via 21 with 12 mil diameter and located between Via 11 and Via 12 |
| Layer 3 | Cell 31 | 8 mm wide and 12 mm long located at 16.1 mm from left GND in layer 2 |
| Substrate 3 | 80 mm long 45 mm wide 0.787 mm thick | Via 11 with 12 mil diameter and located at 15 mm from left GND edge Via 12 with 12 mil diameter and located at 15 mm from right GND edge |

II.B. Design UE 2.2 (Unbalanced Extended):

In another embodiment of the present technique, a detailed E-CRLH design for unbalanced extended structure is presented where:

$$\omega_{SE}=\omega_{SH'} \text{ and } \omega_{SE'}=\omega_{SH} \text{ and } LR\,CL'=CR\,LL' \quad \text{Eq. (14B)}$$

In this case, $\omega_{0,1}=\omega_{0,3}<\omega_{0,2}=\omega_{0,4}$, Z and Y equations can be simplified leading to a simpler Zc function for improved matching. A excel sheet can be tailored to satisfy the above constraints. In this design, the following filter characteristics are observed and noted.

A. The filter is comprised of two bandpass regions separated by a stop-band region. Either band-pass regions can be eliminated by using a low-pass or high-pass filter at the output of the E-CRLH unit cell.

B. The outer filter edges are generally sharper and the bandwidth is generally narrower for higher LR.

C. The inner filter edges are characteristically steeper when $\omega_{0,1}$ and $\omega_{0,2}$ are brought closer.

D. For fixed values of $\omega_{0,1}$ and $\omega_{0,2}$, tend to select lowest values of LL' and CR and play with LR to fine tune bandwidth and outer band edges.

E. Item D, noted above, can be repeated by keeping LR and LL' and modifying CR. For higher values of CR, the filter upper outer edge may become steeper.

F. Item E, noted above, can be repeated by keeping LR and CR and modifying LL'. For higher values of LL', the filter upper outer edge may become steeper.

G. $\omega_{0,1}$ and $\omega_{0,2}$ define the stop-band region between the two band-pass regions.

H. It may be clear to those of ordinary skill in the art that LR, CR, and LL' can be modified to match the structure to other input impedances. Examples of this matching, as described in the following two cases, are derived for different input impedance values.

UE 2.2 Case 1: Broadband Filter with a Sharp Lower or Upper Edge:

In one implementation of the present technique, the special case of the E-CRLH complying with equation (14B) mentioned above is applied to design the two filters that constitute the previously presented diplexer shown in FIG. 14. The E-CRLH filter parameters are listed in Table 8 and Table 9.

TABLE 8

E-CRLH filter parameters of FIG. 16C

| Parameter | Value | Units | Value |
|---|---|---|---|
| $Zc | 15 | ohm | 15 ohm |
| $LRover2 | 1.5/2 | nH | 0.75 nH |

TABLE 8-continued

E-CRLH filter parameters of FIG. 16C

| Parameter | Value | Units | Value |
|---|---|---|---|
| $CR | 2.6 | pF | 2.6 pF |
| $LL | 2.4 | nH | 2.4 nH |
| $TwoCL | 2 * 3.85 | pF | 7.7 pF |
| $LRPover2 | 0.63/2 | nH | 0.315 nH |
| $TwoCLP | 2 * 10 | pF | 20 pF |
| $LLP | 5.8 | nH | 5.8 nH |
| $CRP | 1 | pF | 1 pF |

TABLE 9

Corresponding circuit parameter of the structure in FIG. 16C depicting target four frequencies

| Freq0_1 | 1.5 | GHz | Freq0_3 | 1.5 |
|---|---|---|---|---|
| Freq0_2 | 2.8 | GHz | Freq0_4 | 2.8 |
| LR | 1.5 | nH | LL | 2.429247 |
| CR | 2.6 | pF | CL | 3.847039 |
| LR' | 0.62825347 | nH | LL' | 5.8 |
| CR' | 0.99492392 | pF | CL' | 10.05333 |
| Need = 0 |  | 0 0 | 0 |  |
| Zc | 24.01922307 | Ohm |  |  |

Figure 29A:
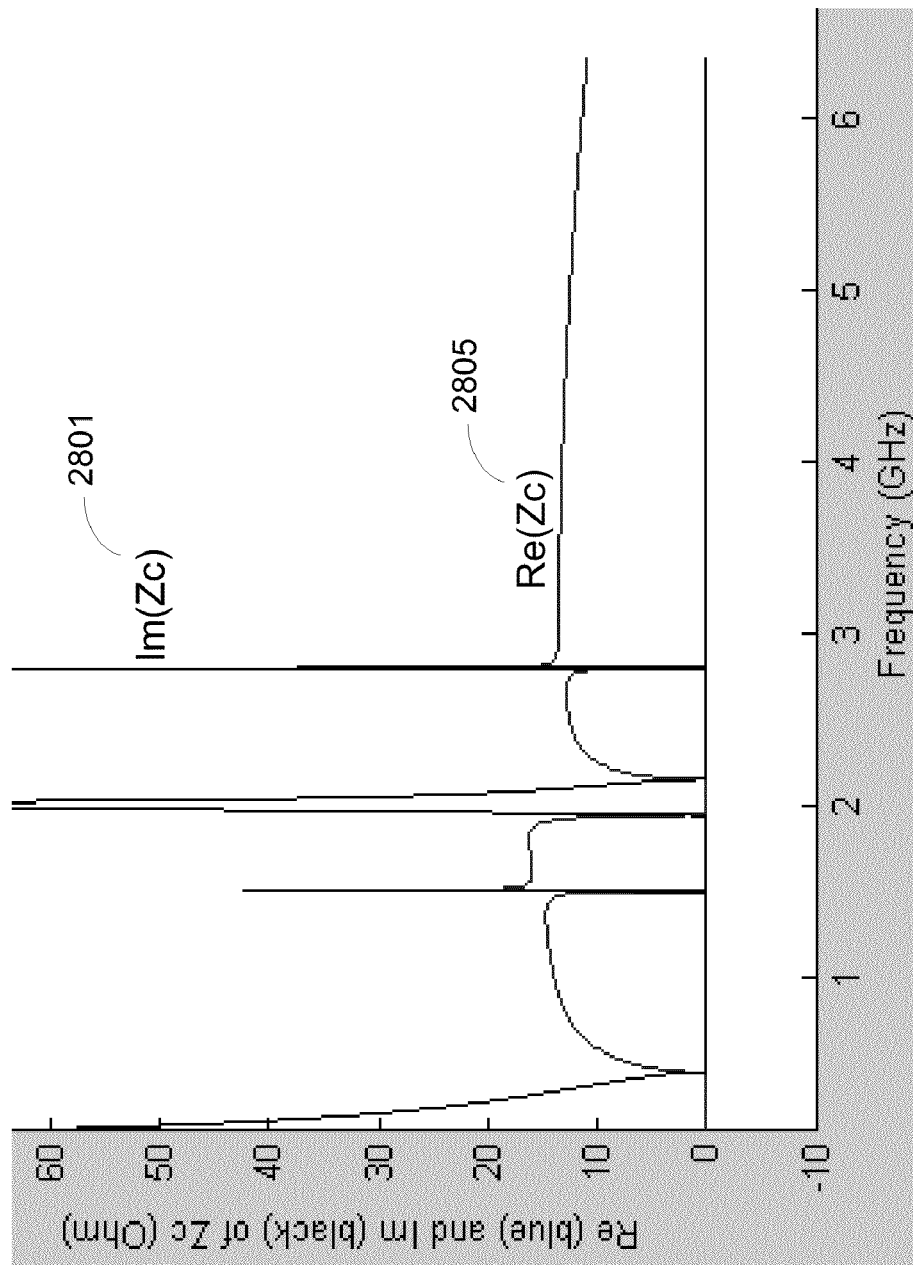
FIG. 29A illustrates broadband impedance matched at 15 Ohm for a broadband filter with sharp lower or upper edge.
Figure 29B:
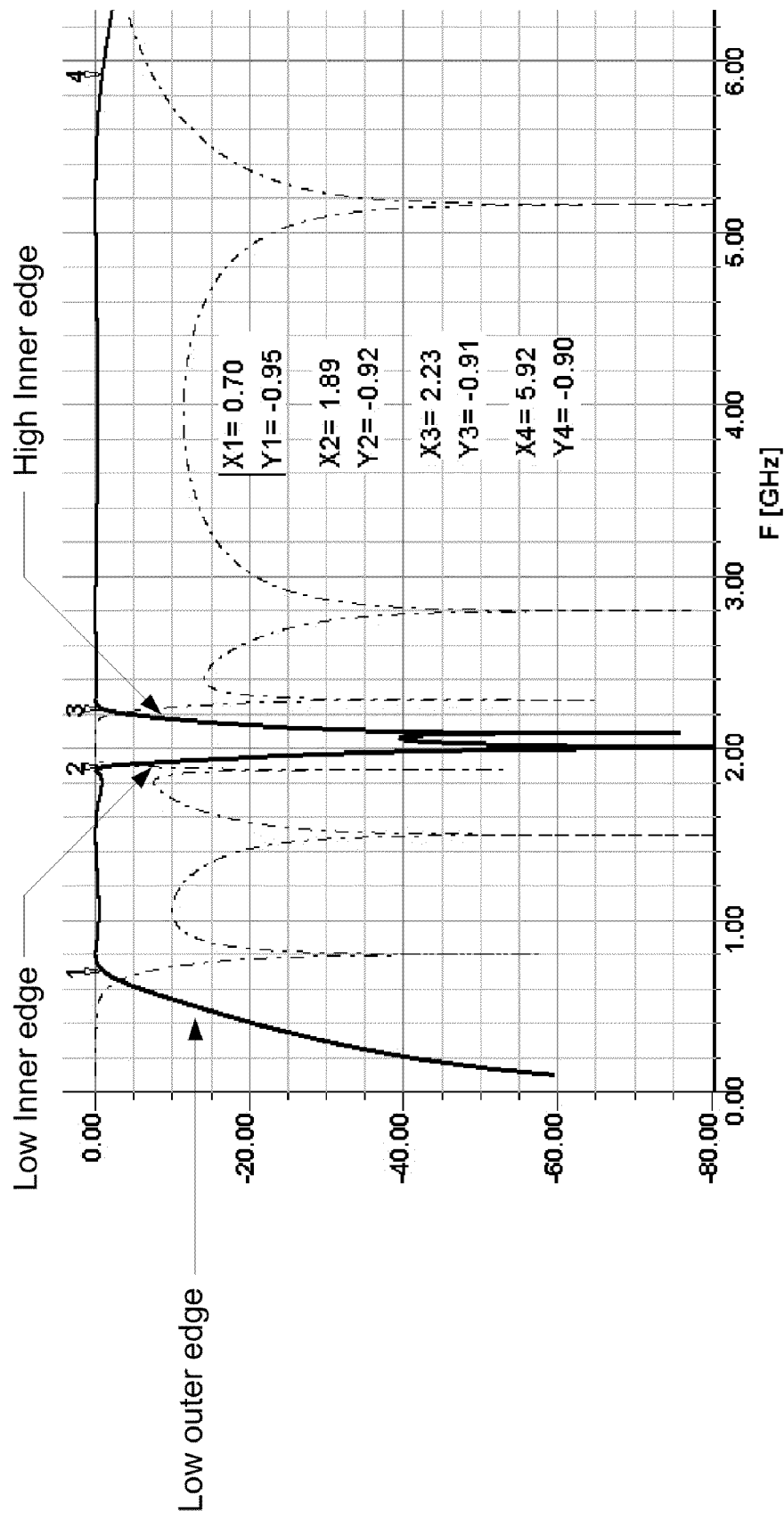
FIG. 29B illustrates a circuit simulation response for a broadband filter with sharp lower or upper edge.

The two frequencies Freq0_1, Freq_02, LR, CR, and LL' are considered the free parameters, whereas the rest Freq0_3, Freq0_4, LR', CR', LL, CL, and CL' are derived from the constraints in Eq (14B). These parameters can be used in a matlab code to verify the frequency bands and the impedance matching. In this case, two broadband regions matched at 15 Ohm can be clearly seen in FIG. 29A. In order to couple energy to the filter, the structure needs to be matched to the input/output impedance Zc. That means the Real part of the impedance Re(Zc) needs to be near constant while keeping its imaginary (reactive) part Im(Zc) near zero. The Ansoft designer circuit simulation tool can provide the circuit design in FIG. 16C response as illustrated in FIG. 29B.

A simple low-pass filter with less than −15 dB at 2.1 GHz can be used to select the lower band-pass filter range of about 700 MHz to 1.89 GHz with a side-band rejection of about −40 dB at 2 GHz. Or, a simple high-pass filter with less than −15 dB at 2.1 GHz can be used to select the upper band-pass filter range of about 2.23 MHz to 5.92 GHz with side-band rejection of about −40 dB at 2.1 GHz.

UE 2.3 Case 2: Narrowband Filter with Sharp Lower or Upper Edge:

In another implementation of the present technique, narrower band filters, described below, can be derived using the special E-CRLH case complying with the constraints in Eq (14A). The E-CRLH filter parameters and corresponding circuit parameters are listed in Table 10 and Table 11, respectively.

TABLE 10

E-CRLH filter parameters

| Parameter | Value | Units | Value |
|---|---|---|---|
| $Zc | 25 | ohm | 25 ohm |
| $LRover2 | 120/2 | nH | 60 nH |
| $CR | 29 | pF | 29 pF |
| $LRPover2 | 1.2/2 | nH | 0.6 nH |
| $LL | 0.22 | nH | 0.22 nH |
| $TwoCL | 2 * 0.05 | pF | 0.1 pF |
| $LLP | 22 | nH | 22 nH |

TABLE 11

| Corresponding circuit parameter of the structure | | | |
|---|---|---|---|
| Freq0_1 | 1.9 GHz | Freq0_3 | 1.9 |
| Freq0_2 | 2.1 GHz | Freq0_4 | 2.1 |
| LR | 120 nH | LL | 0.2209 |
| CR | 29 pF | CL | 0.052534 |
| LR' | 1.204909004 nH | LL' | 22 |
| CR' | 0.286549246 pF | CL' | 5.316667 |
| Need = 0 | 0 | 0 | 0 |
| Zc | 64.32675209 Ohm | | |

Figure 30:
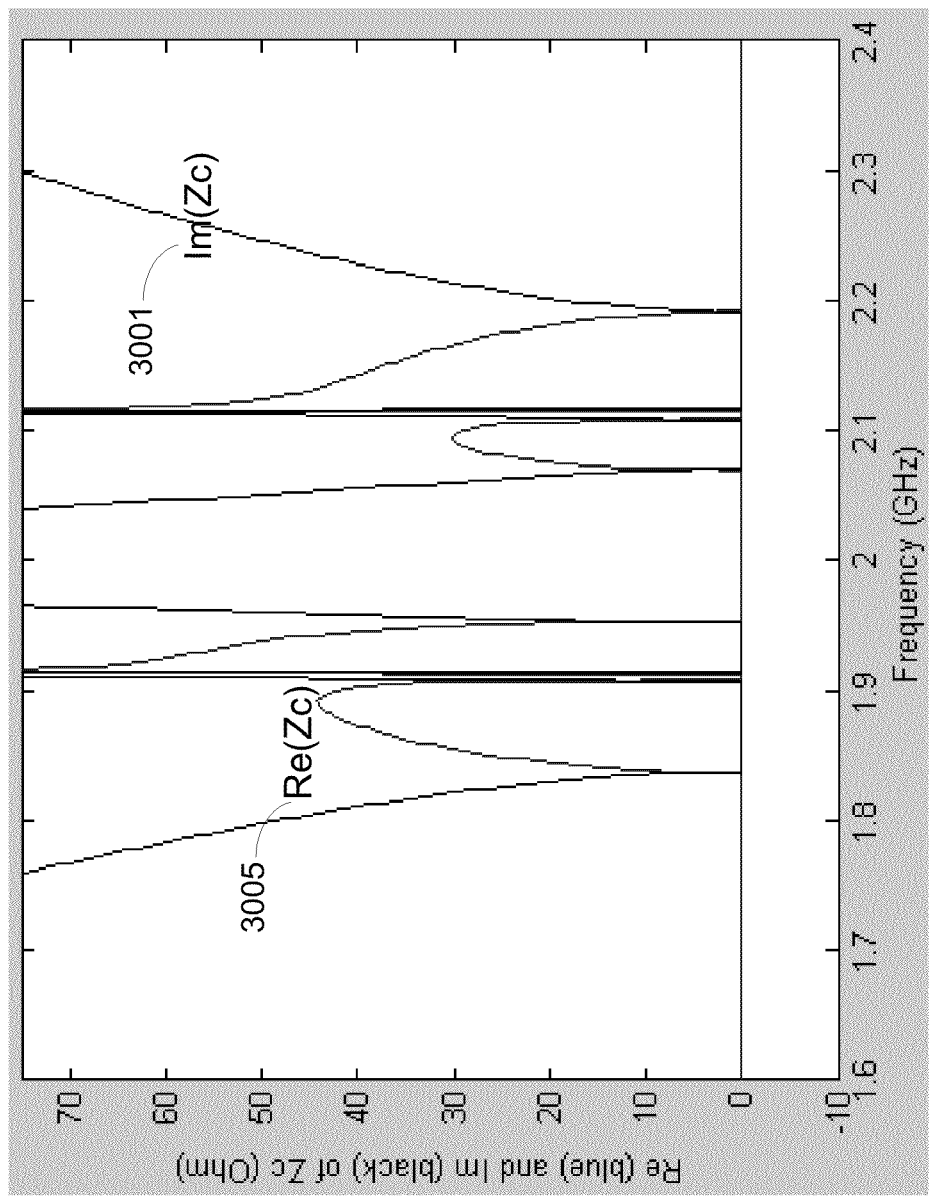
FIG. 30 illustrates two narrow-band band-pass regions with the upper region is matched at 25 Ohm for a narrowband filter with sharp lower or upper edge.

The matlab code provides two narrow-band band-pass regions. The upper region can be matched at about 25 Ohms as illustrated in FIG. 30, while the lower-band shows a better matching at 45 Ohms. In order to couple energy to the filter, the structure needs to be matched to the input/output impedance Zc. That means the Real part of the impedance Re(Zc) needs to be near constant while keeping its imaginary (reactive) part Im(Zc) near zero. In the examples below, we focus on the upper band by matching the structure to Zc=25 OHMs, similarly these examples can be repeated with Zc=45 Ohms.

The Ansoft designer circuit simulation software provides a structure response as illustrated in FIG. 16C.

Figure 31:
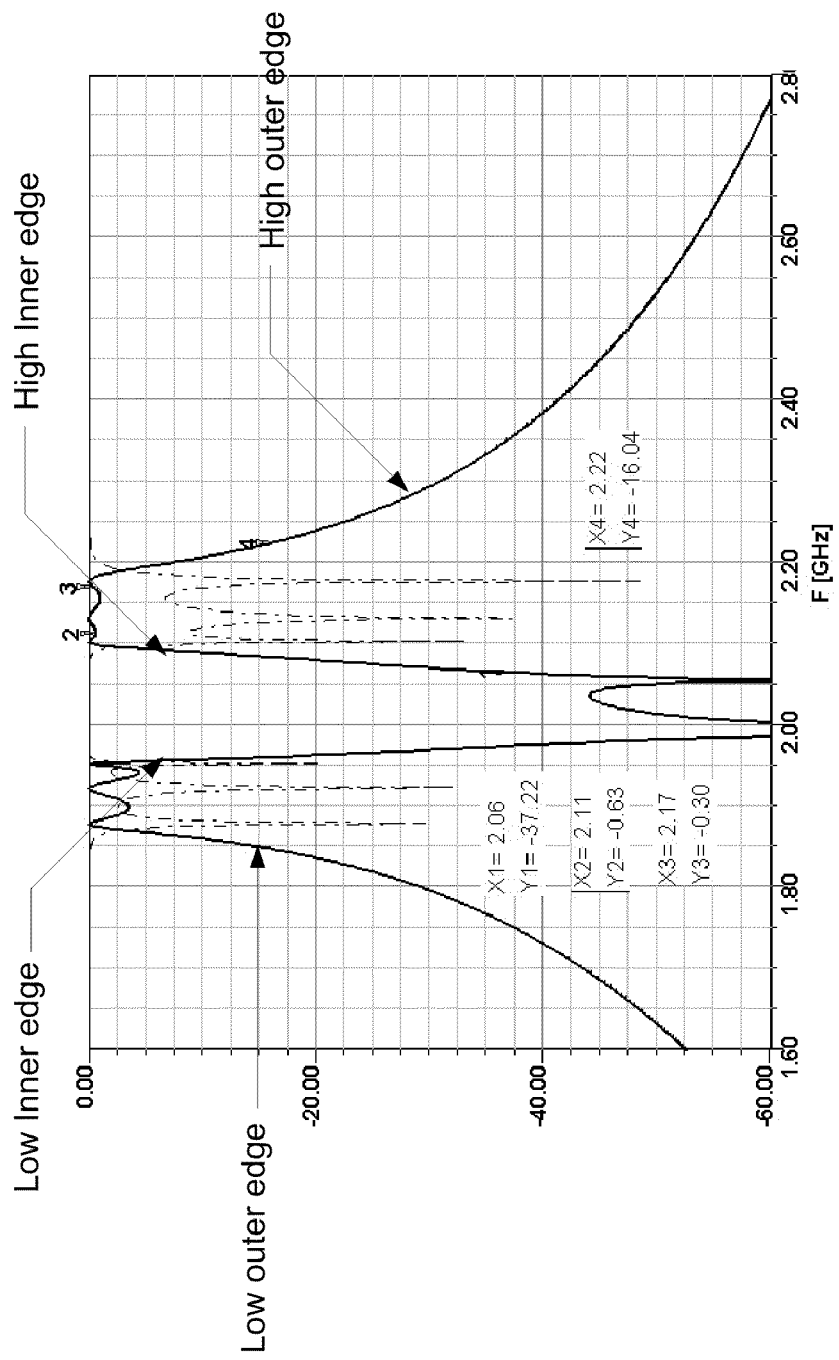
FIG. 31 illustrates a circuit simulation response for a narrowband filter with sharp lower or upper edge.

A simple high-pass filter with less than −15 dB at about 2.1 GHz can be used to select the upper band-pass filter range of about 2.11 MHz to 2.17 GHz with a side-band rejection below −40 dB at about 2.05 GHz. Similar steps can be followed to match the lower band-pass region to select it. In this case, a 40 Ohm matching is more desirable as illustrated in the Matlab impedance results of FIG. 31.

Figure 32:
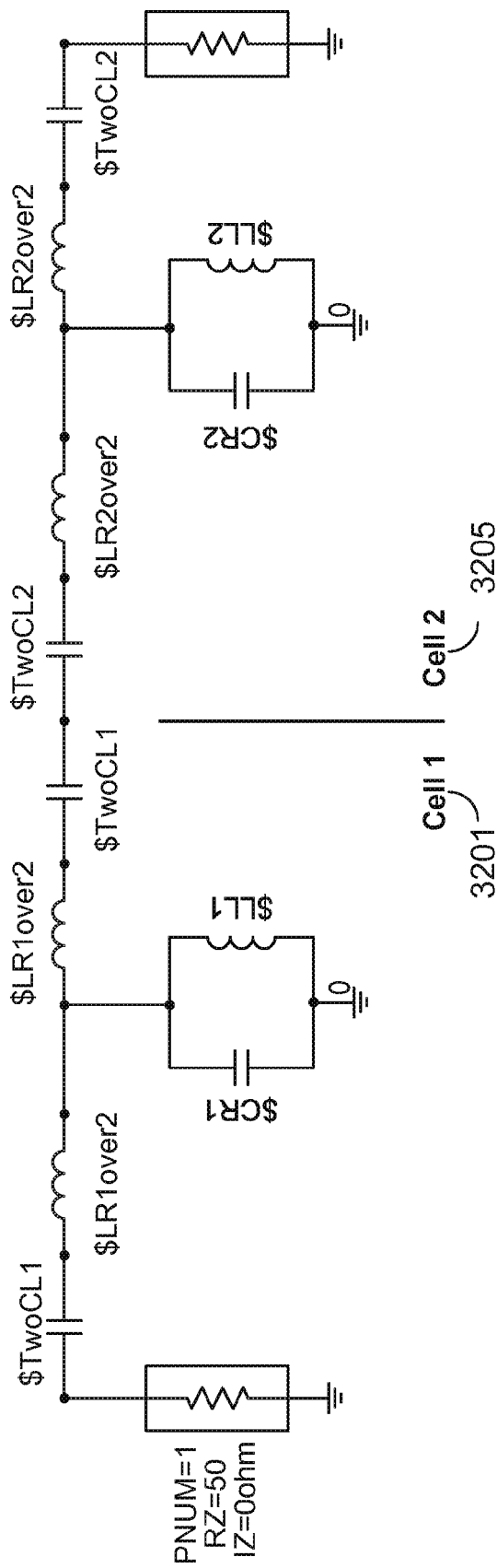
FIG. 32 illustrates a 2-cell Conventional Composite Right Left Handed (C-CRLH) Transmission Line.

C-CRLH (Conventional CRLH—Designs 3 and 4):

A 2-cell Conventional Composite Right Left Handed (C-CRLH) Transmission Line (TL) is illustrated in FIG. 32 where each cell, Cell 1 3201 and Cell 2 3205, can have different parameter values. The special case when both cells are identical or "isotropic" case was analyzed in the previous sections and also covered by Caloz and Itoh, "Electromagnetic Metamaterials", book published by Wiley Publishing company, 2006. As previously presented in the foregoing analysis, the C-CRLH structure resonates in the LH region at low frequency bands and resonates in the RH region at high frequency bands. In this particular instance, the C-CRLH structure effectively behaves like a band-pass filter that gets sharper as the number of cells is increased. Increasing the number of cells, however, can lead to undesirable conditions such as an increase in transmission loss and larger structure sizes.

Figure 33:
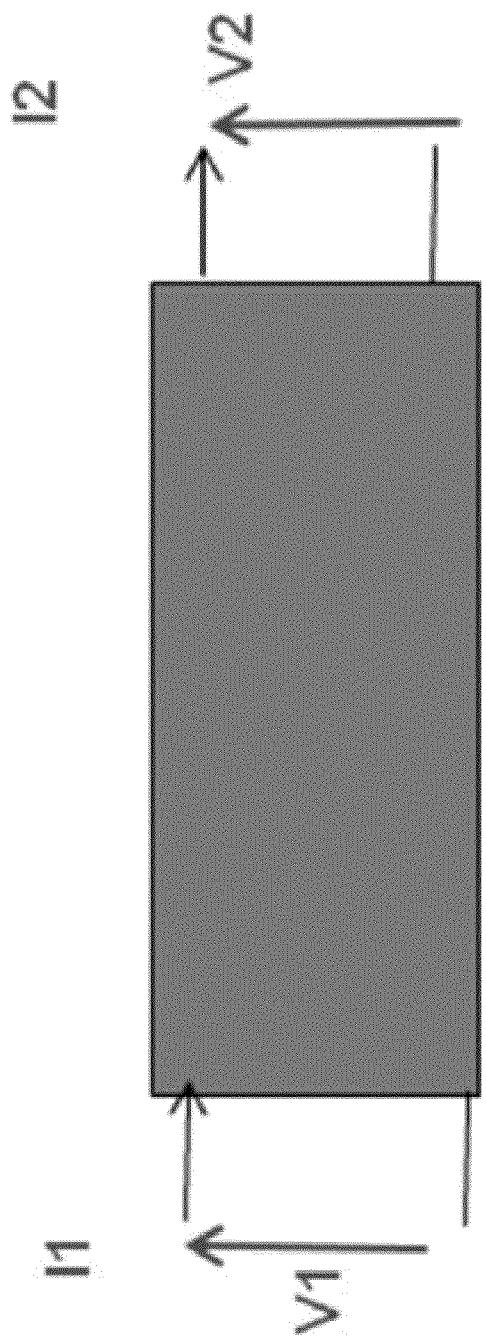
FIG. 33 illustrates a two-port transmission line network where the inner circuit is illustrated in FIG. 32.

Analysis of the anisotropic case, which occurs when both cells are different, is presented next section. The process methodology for extracting circuit parameters, as described in the previous section and shown in FIG. 13, are similarly followed for the anisotropic case. In contrast to the isotropic case, the anisotropic case requires that Zin is different from Zout. That is, for the network in FIG. 33, the following set of conditions apply to the transfer functions:

Condition A.1

$$\begin{pmatrix} V_1 \\ I_1 \end{pmatrix} = \begin{pmatrix} A & B \\ C & D \end{pmatrix} \begin{pmatrix} V_2 \\ I_2 \end{pmatrix}$$ Eq. (15A)

$$\begin{pmatrix} V_2 \\ I_2 \end{pmatrix} = \begin{pmatrix} A' & B' \\ C' & D' \end{pmatrix} \begin{pmatrix} V_1 \\ I_1 \end{pmatrix} \text{ with } Z_{in} = \frac{V_1}{I_1} \text{ and } Z_{out} = \frac{V_2}{I_2}$$

with the resiprocity condition
$AD - BC = 1$ and $A'D' - B'C' = 1$
under condition A3.1 below:
$AA' = DD'$ and $BC' = B'C$ $$Zin = \sqrt{\frac{AB' + BD'}{CA' + DC'}} \text{ and } Zout = \sqrt{\frac{A'B + B'D}{C'A + D'C}}$$

Symmetric Cell ⇒ $AA' = DD'$ and $BC' = B'C$  Eq. (15B)
Even Resonances: $A + D = 1$ ($A + D$ is same as $A' + D'$)
Odd resonances: $A + D = -1$ $$Zi = j\omega LR_i + \frac{1}{j\omega CL_i} Yi = j\omega CR_i + \frac{1}{j\omega LL_i}$$

$$\begin{pmatrix} V_1 \\ I_1 \end{pmatrix} = \begin{pmatrix} 1 + Y_1Z_1/2 & Z_1(1 + Y_2Z_2/4) \\ Y_1 & 1 + Y_1Z_1/2 \end{pmatrix}$$

$$\begin{pmatrix} 1 + Y_2Z_2/2 & Z_2(1 + Y_2Z_2/4) \\ Y_2 & 1 + Y_2Z_2/2 \end{pmatrix} \begin{pmatrix} V_2 \\ I_2 \end{pmatrix}$$

$$\begin{pmatrix} V_2 \\ I_2 \end{pmatrix} = \begin{pmatrix} 1 + Y_2Z_2/2 & Z_2(1 + Y_2Z_2/4) \\ Y_2 & 1 + Y_2Z_2/2 \end{pmatrix}$$

$$\begin{pmatrix} 1 + Y_1Z_1/2 & Z_1(1 + Y_2Z_2/4) \\ Y_1 & 1 + Y_1Z_1/2 \end{pmatrix} \begin{pmatrix} V_1 \\ I_1 \end{pmatrix}$$

In this case, the balanced structure where $\omega_{SE1}=\omega_{SE2}=\omega_{SE}=\omega_{SH1}=\omega_{SH2}=\omega_{SH}=\omega_0$ when both cells are identical (isotropic case) and different (anisotropic case)

The unbalanced structure can be used with "Case 1: $\omega_{SE1}=\omega_{SE2}=\omega_{SE}$ and $\omega_{SH1}=\omega_{SH2}=\omega_{SH}$" or "Case 2: $\omega_{SE1}=\omega_{SH2}=\omega_{SE}$ and $\omega_{SH1}=\omega_{SE2}=\omega_{SH}$" for both cells to better match the structure over desired frequency bands. This condition can automatically verify Condition A3.1 A A'=D D'. Free parameters are LR1, LR2, $\omega_{SE}=\omega_{SH}$, and $\omega_R$. In particular, we noticed that Zin and Zout equations are further simplified when $\omega_{R1}=\omega_{R2}=\omega_R$, that is, LR1 CR1=LR2 CR2.

The input and output impedance values Zin and Zout are given by equations Eq. (16) and Eq. (17) under the condition A.1 listed in equation set Eq. (15A).

Case 1: $\omega_{SE1}=\omega_{SE2}=\omega_{SE}$, $\omega_{SH1}=\omega_{SH2}=\omega_{SH}$, and $\omega_{R1}=\omega_{R2}=\omega_R$ $$Zin^2 = \frac{Z_1}{Y_1}\left(1 + \frac{Z_1Y_1}{4}\right)\frac{(LR_1 + LR_2)(2 + Z_1Y_1)^2 - 4LR_1}{(LR_1 + LR_2)(2 + Z_1Y_1)^2 - 4LR_2}$$ Eq. (16)

$$Zout^2 = \frac{Z_1}{Y_1}\frac{LR_2^2}{LR_1^2}\left(1 + \frac{Z_1Y_1}{4}\right)\frac{(LR_1 + LR_2)(2 + Z_1Y_1)^2 - 4LR_2}{(LR_1 + LR_2)(2 + Z_1Y_1)^2 - 4LR_1}$$ Eq. (17)

Case 2: $\omega_{SE1}=\omega_{SH2}=\omega_{SE}$, $\omega_{SH1}=\omega_{SE2}=\omega_{SH}$, and $\omega_{R1}=\omega_{R2}=\omega_R$ $$Zin^2 = \left(1 + \frac{Z_1Y_1}{4}\right)\frac{\left(CR_1\frac{Z1}{Y1} + LR_2\right)(2 + Z_1Y_1)^2 - 4CR_1\frac{Z1}{Y1}}{\left(CR_1 + LR_2\frac{Y1}{Z1}\right)(2 + Z_1Y_1)^2 - 4LR_2\frac{Y1}{Z1}}$$ Eqs. (18)

-continued $$Zout^2 = \frac{LR_2^2}{CR_1^2}\left(1 + \frac{Z_1Y_1}{4}\right)\frac{\left(CR_1 + LR_2\frac{Y1}{Z1}\right)(2+Z_1Y_1)^2 - 4LR_2\frac{Y1}{Z1}}{\left(CR_1\frac{Z1}{Y1} + LR_2\right)(2+Z_1Y_1)^2 - 4CR_1\frac{Z1}{Y1}}$$

The resonances are given by Eqs. (19):

$$\omega_{\pm n}^2 = \frac{\omega_{SH}^2 + \omega_{SE}^2 + \chi\omega_R^2}{2} \pm \sqrt{\left(\frac{\omega_{SH}^2 + \omega_{SE}^2 + \chi\omega_R^2}{2}\right)^2 - \omega_{SH}^2\omega_{SE}^2} \quad \text{Eq. (19)}$$

where, $$\omega_{SH} = \frac{1}{\sqrt{CR_1LL_1}} = \frac{1}{\sqrt{CR_2LL_2}};$$

$$\omega_{SE} = \frac{1}{\sqrt{LR_1CL_1}} = \frac{1}{\sqrt{LR_2CL_2}};$$

$$\omega_R = \frac{1}{\sqrt{LR_1CR_1}} = \frac{1}{\sqrt{LR_2CR_2}}$$

where, $Z_1Y_1 = Z_2Y_2 = -\chi$, since $\omega_{SE1} = \omega_{SE2} = \omega_{SE}$ and $\omega_{SH1} = \omega_{SH2} = \omega_{SH}$ condition that are set above.

Therefore, when LR1=LR2, the case 1 reduces to the isotropic case discussed in U.S. patent application Ser. No. 11/741,674 entitled "Antennas, Devices, and Systems Based on Metamaterial Structures," filed on Apr. 27, 2007, and U.S. patent application Ser. No. 11/844,982 entitled "Antennas Based on Metamaterial Structures," filed on Aug. 24, 2007. In particular:

$$Zin^2 = Zout^2 = \frac{Z}{Y}\left(1 + \frac{ZY}{4}\right) \quad \text{Eq. (20)}$$

III. Filter Design IC 3 (Balanced CRLH):

Balanced Isotropic Case:

In another embodiment of the present technique, the MTM filter structure may be configured in context of a balanced conventional design. The designs presented in this section are balanced, that is, $\omega_{SH1} = \omega_{SE1} = \omega_{SH2} = \omega_{SE2} = \omega_0$. Specifically, two designs in this section target the WWAN filter of the WLAN/WWAN diplexer application illustrated in FIGS. 14, 15A, and 15B.

The first design may be comprised of an isotropic 2-cell C-CRLH TL structure where LR1=LR2, CR1=CR2, LL1=LL2, and CL1=CL2. Since this is an isotropic structure, both input Zin and output impedances are equal, that is, no impedance transformer can be implemented in this case.

Steps for designing the WWAN filter are as follows:

Step 1: Use of Matlab code or equivalent technical computing software to narrow down parameter values. Set the values of the following free parameters LR1=LR2=9 nH, Zin=Zout=50Ω, and Freq$_{SH}$=Freq$_{SE}$=Freq$_0$=1.4 GHz. The output of the Matlab provides the values of the rest of the parameters: CR1=CR2=3.6 pF, LL1=3.6 nH, and CL1=1.43 pF.

Figure 34A:
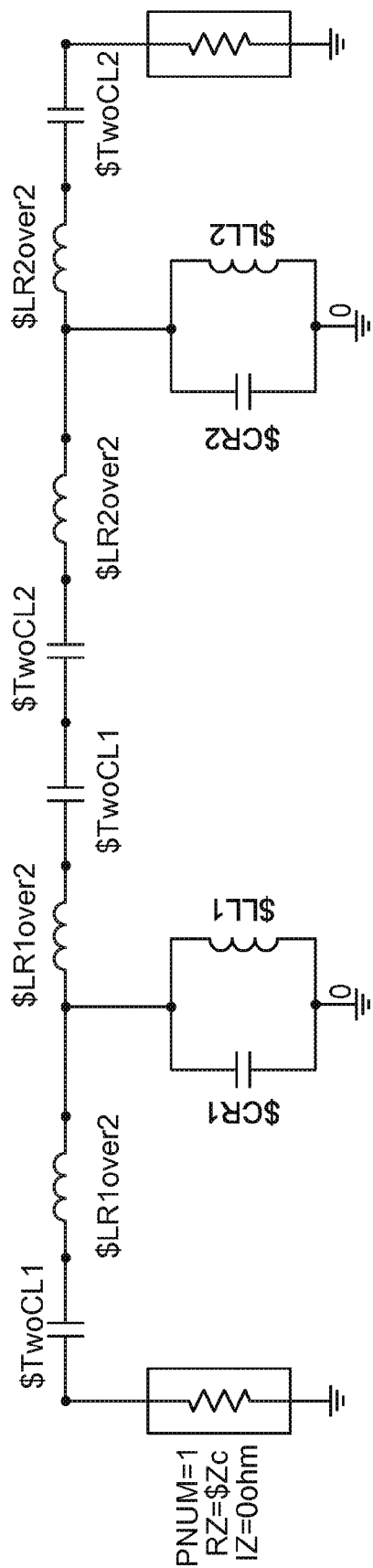
FIGS. 34A-34B illustrates a 2-cell isotropic and balanced TL filter (a) circuit, (b) transmission S12 and return loss S11/S22.
Figure 34B:
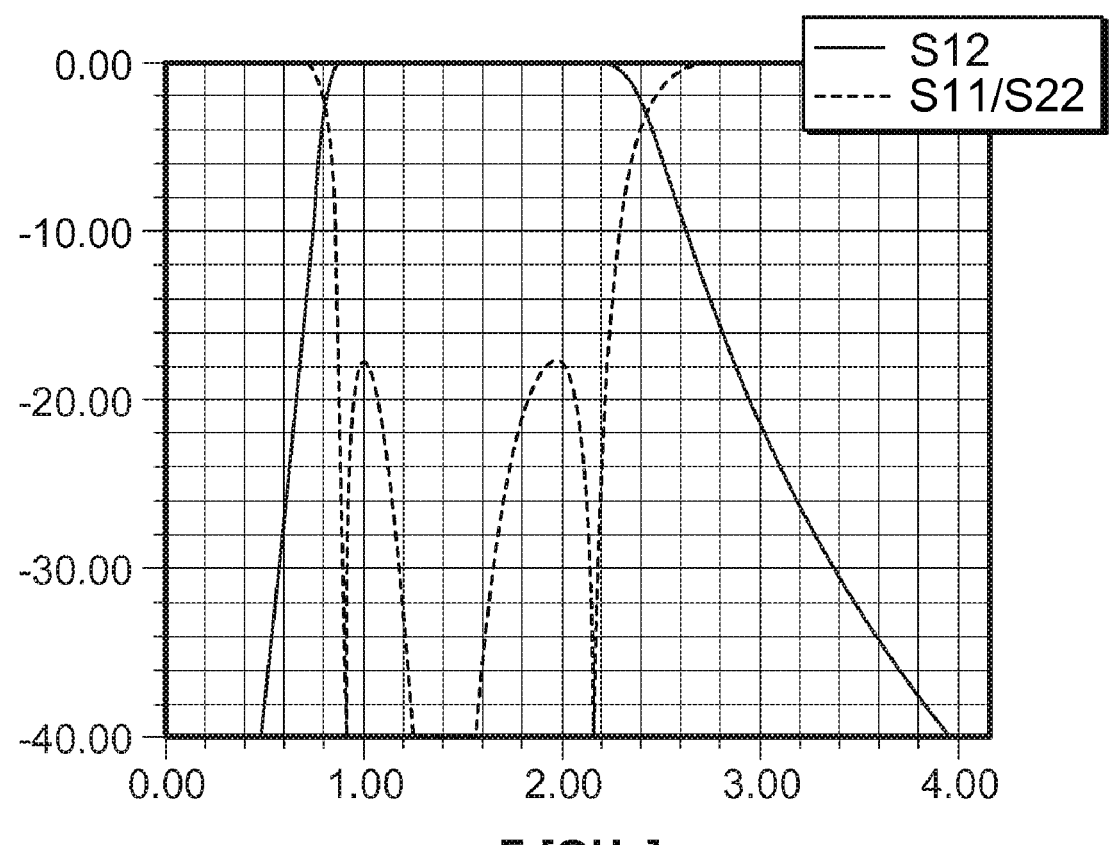
Figure 35A:
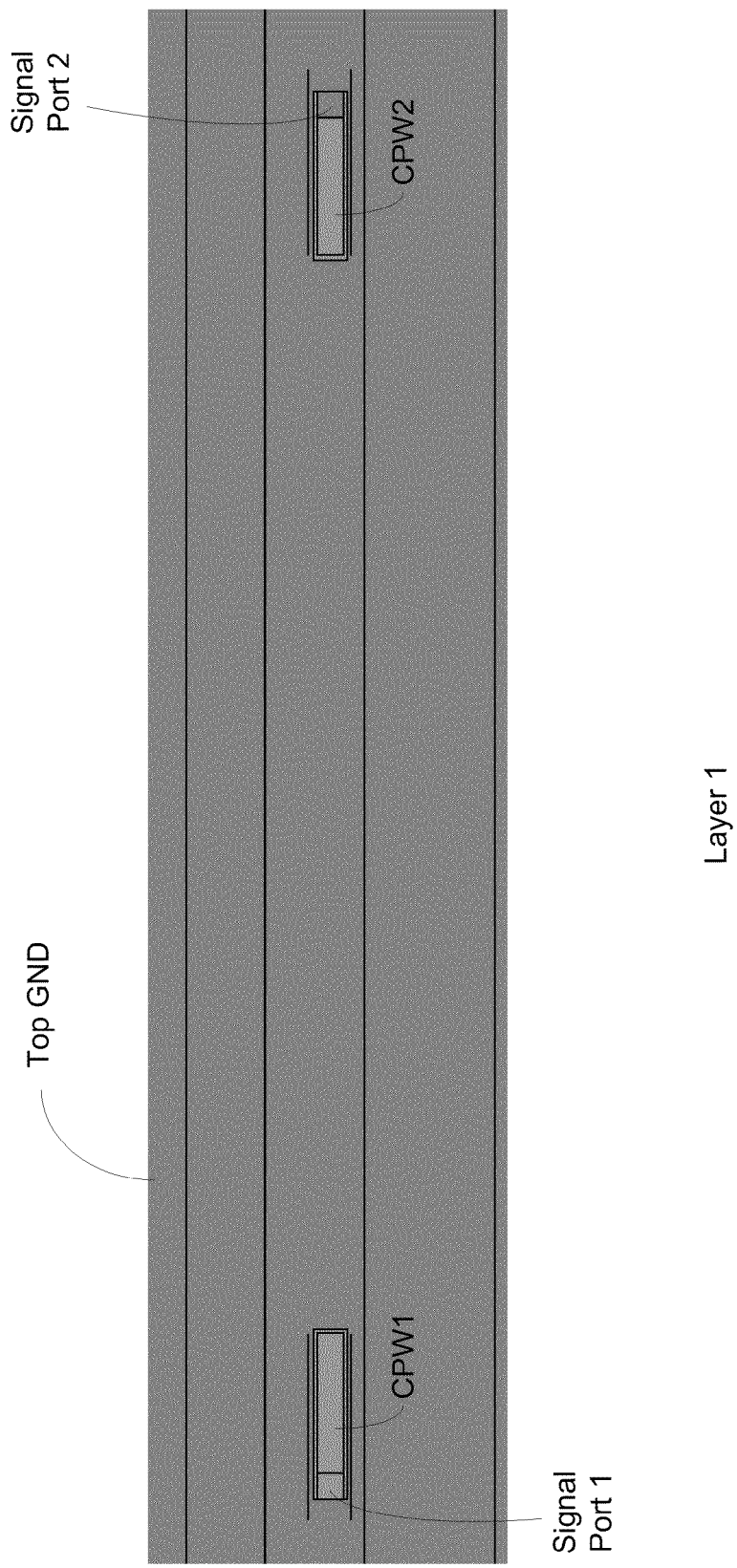
FIGS. 35A-35E illustrate an example of a fully printed E-CRLH structure showing structures of four metallization layers, respectively, where the metallization layer 1 includes two signal ports and two co-planar waveguides, the metallization layer 2 includes two top metal-insulator-metal (MIT) capacitors (MIM1 and MIM2) and inter-layer Via 11, Via 12, Via 21, and Via 22, the metallization layer 3 includes the main structure of two cells, the metallization layer 4 includes three bottom MIM capacitors MIM1, MIM2 and MIM12 capacitors, and the metallization layer 5 is a full bottom ground electrode.
Figure 35B:
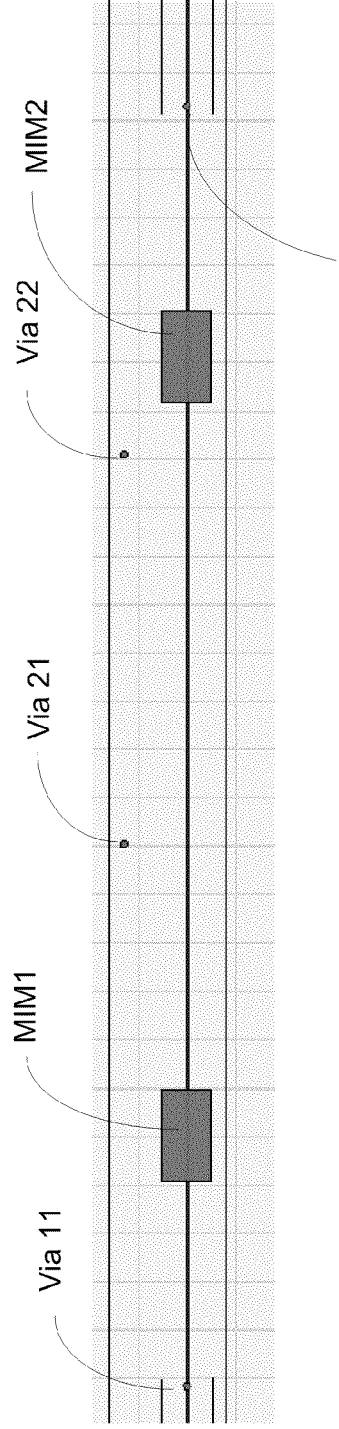
Figure 35C:
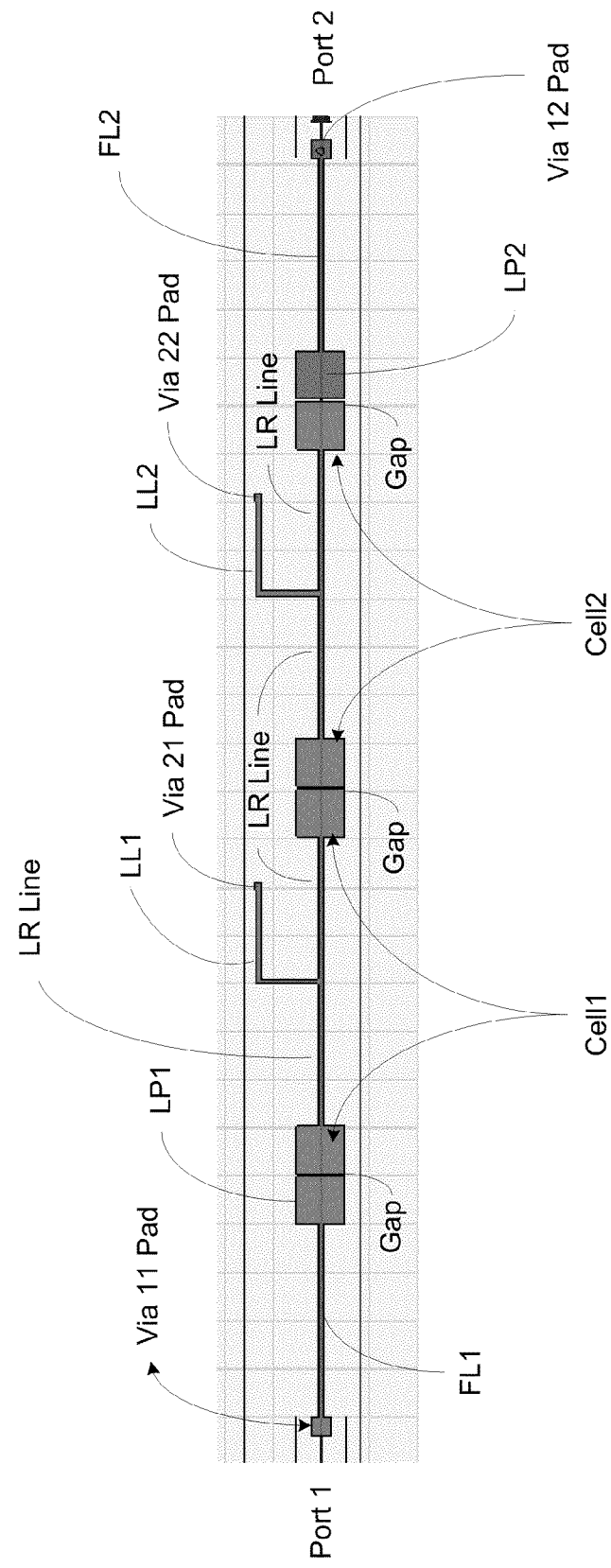
Figure 35D:
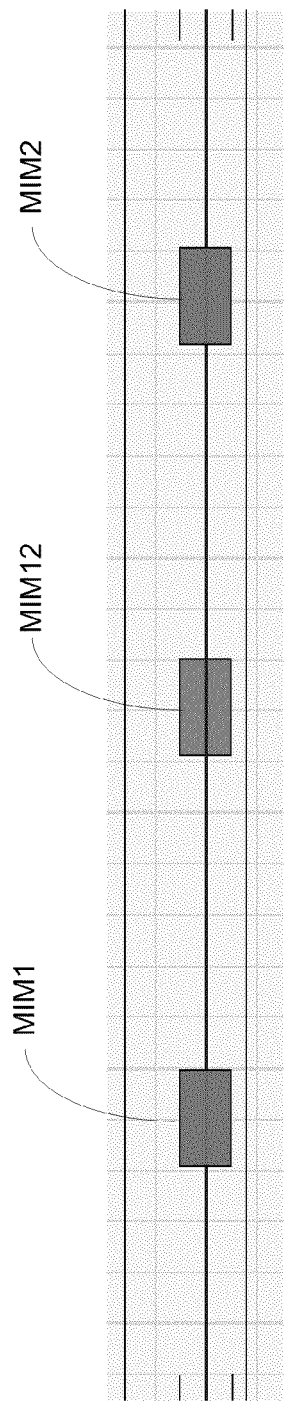
Figure 35E:
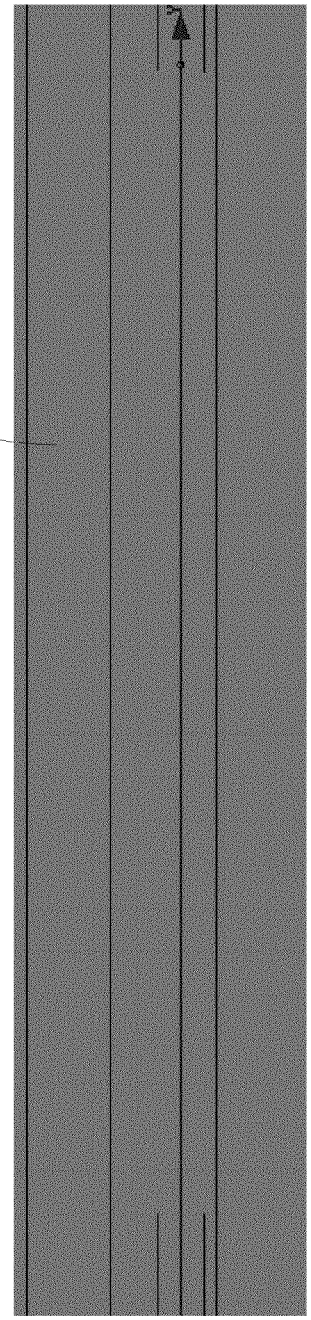

Step 2: simulate these results using circuit designer simulation tools. FIGS. 34A-34B shows the circuit, transmission, and return loss of the bandpass filer.

Step 3: map the structure parameters to a fully printed design with a full GND on the top and bottom layer.

One example for a 3D printed C-CRLH structure is illustrated in FIGS. 35A-35E and the structure detail is provided in Table 12. In this design example, the MTM cell structure includes a top conductive layer below the cell patch and the top ground in a metal-insulator-metal (MIM) structure, and a bottom MIM layer below the cell patch and the bottom ground. This MTM cell design is implemented by using five metallization layers with four inter-layer dielectric insulator layers. The layer 3 shown in FIG. 35C includes two cells 1 and 2 where each cell includes two cell patches that are connected to each other by a LR line which has an extension as the LL line leading to a via pad.

The four inter-layer dielectric insulator layers may be implemented by, for example, four dielectric substrates. Vias connecting inter-layer metallization are commonly referred to by "buried vias". In some fabrication techniques, it is challenging to align buried vias when assembling the substrates on top of each other, hence the need to use "though vias" from top to bottom layers. This is accomplished by clearing metallization around "pass through vias" on layers the vias are not connected to the metallization on these layers.

Therefore, the C-CRLH) structure in FIGS. 35A-35E includes a top layer having a plurality of CPW feed lines, a top ground, and a plurality of ports and a first dielectric substrate having a first surface on a first side and a second surface on a second side opposing the first side. The first surface of the first substrate is attached to the top layer. A second layer having a top metal-insulator-metal (MIM) layer is provided. The second layer is attached to the second surface of the first substrate, and a first set of cell conductive via connectors are formed in the first substrate creating a conductive path from the top layer to the second layer. A second dielectric substrate is provided to have a first surface on a first side and a second surface on a second side opposing the first side and the first surface of the second substrate is attached to the second layer. A third layer is provided to include a main structure, and the third layer is attached to the second surface of the second substrate. A second set of cell conductive via connectors are formed in the second substrate creating a conductive path from the second layer to the third layer. A third dielectric substrate is provided to have a first surface on a first side and a second surface on a second side opposing the first side, and the first surface of the third substrate is attached to the third layer. This device also includes a fourth layer having a bottom MIM layer, and the fourth layer is attached to the second surface of the third substrate. A fourth dielectric substrate is provided to include a first surface on a first side and a second surface on a second side opposing the first side, and the first surface of the fourth substrate is attached to the fourth layer. A fifth layer is provided to include a bottom ground. The fifth layer is attached to the second surface of the fourth substrate, wherein the top layer, the top, second, third, fourth, and fifth layer, the first, second, third, fourth, and fifth substrate, the cell conductive via connectors, top MIM layer, main structure, and bottom MIM layer are structured to form a printed C-CRLH structure.

TABLE 12

3D Printed C-CRLH Structure Parameters

| Layer 1: Top Layer | CPW feed lines | Two, CPW1 and CPW2 lines, of 50 mm long, 1.3 mm wide, 0.3 mm gap, 50 Ohm grounded CPW line with CPW-GND located on bottom layer 5. |
|---|---|---|
| | Top GND | Cover the whole 130 mm long by 40 mm wide substrates |
| | Ports | Two 50 Ohm lumped ports at each end of CPW1 and CPW2. |

TABLE 12-continued

3D Printed C-CRLH Structure Parameters

| | | |
|---|---|---|
| Substrate 1 | 50 mm long 40 mm wide 30 mil thick | Via 11 with 0.3 mm diameter and located at the other of CPW1 to connect feed-line 1 to main C-CRLH printed structure on layers 2, 3, and 4. Via 21 with 0.3 mm diameter and located at the other of CPW2 to connect feed-line 2 to main C-CRLH printed structure on layers 2, 3, and 4. Via 12 with 0.3 mm diameter connecting the via line from cell 1 patch to top ground on layer 1. This via line can be connected to bottom GND on layer 5 instead of top GND on layer 1. Via 22 with 0.3 mm diameter connecting the via line from cell 2 patch to top ground on layer 1. This via line can be connected to bottom GND on layer 5 instead of top GND on layer 1. |
| Layer 2 | Top MIM Layer | Top 2 mm wide (along x-axis) by 3.8 mm (along y-axis) MIM1 above the gap between Launch Pad 1 (LP1) and cell 1 patch Top 2 mm wide (along x-axis) by 3.8 mm (along y-axis) MIM2 above the gap between Launch Pad 2 (LP2) and cell 2 patch |
| Substrate 2 | 50 mm long 40 mm wide 3 mil thick | Continuations of Via 11, Via 21, Via 22, and Via 12. |
| Layer 3 | Main Structure | Two via pads to connect the four vias Two launch pads LP1 and LP2 of 7 mm wide (along x-axes) and 1 mm long (along y-axis). Feed line 1 (FL1) of 0.2 mm wide and 7 mm long connecting the Via11 pad to LP1. Feed line 2 (FL2) of 0.2 mm wide and 7 mm long connecting the Via12 pad to LP2. In order to create large LR, we introduce LR-line along with the cell patch. Both are responsible for realizing LR and CR of the structure. There are also two via LL1-line and LL2-line that extend to connect LR-lines to Via 12 and Via 22. There are four LR lines: 1) connecting the left half of Cell 1 to LL1, 2) LL1 to right half of Cell 1, 3) Left half of Cell 2 to LL2, 4) and LL2 to the right half of Cell 2. |
| Substrate 3 | 50 mm long 40 mm wide 3 mil thick | |
| Layer 4 | Bottom MIM Layer | Bottom 2 mm wide (along x-axis) by 3.8 mm (along y-axis) MIM1 above the gap between Launch Pad 1 (LP1) and cell 1 patch Bottom 2 mm wide (along x-axis) by 3.8 mm (along y-axis) MIM2 above the gap between Launch Pad 2 (LP2) and cell 2 patch Bottom 2 mm wide (along x-axis) by 3.8 mm (along y-axis) MIM12 above the gap between Cell 1 and cell 2 patches. This MIM capacitor has no top layer to realize the cascade of the two equal series capacitors CL1 (MIM1) and CL2 = CL1 (MIM2) that gives half of the MIM1 and MIM2 capacitor values. Hence, the use of only the bottom part of the MIM capacitor. |
| Substrate 4 | 50 mm long 40 mm wide 30 mil thick | |
| Layer 5 | Bottom GND | Full GND |

A snap shot of the printed structure parameterization mapping is shown in Table 13 which shows the results from the detailed excel sheet that is generated to map the circuit parameters in FIG. 34A to the printed structure in FIGS. 35A-35E.

TABLE 13

Mapping between printed structure of Table 12 and FIGS. 35A-35G and circuit parameters in FIGS. 34A-34B.

| CR/mm | LR/mm | Printed Structure Parameters | | Circuit Parameters | |
|---|---|---|---|---|---|
| 0.227 | 0.217 | Cell1_width | 1.5 mm | | |
| | | Cell1_length* | 3 mm | | |
| 0.0882 | 0.56 | LR1_line_width | 8 mil | CR1 | 3.1701 |
| | | LR1_line_length | 7 mm | LR1 | 9.142 |
| 0.0882 | 0.56 | LL1_line_width | 8 mil | | |
| | | LL1_line_length | 6.5 mm | | |
| | | MIM_width | 1 mm | | |
| | | MIM_Length | 1.25 mm | CL1 | 1.278136 |
| | | MIM1_L_Adj | 0 mm | Comply with CL12 | |
| | | MIM12_L_Adj | 0 mm | Comply with CL13 | |
| | | MIM2_L_Adj | 0 mm | 3 | mil |
| | | Thin_layer | 0.0762 mm | 3 | mil |
| | | epsilon | 4.4 | | |
| | | ε0 | 8.854E-12 | | |
| 0.227 | 0.217 | Cell12_width | 1.5 mm | CL12 | 0.639068 |
| | | cell12_length | 3 mm | | CL1 |
| | | | | CL2/(CL1 + CL2) | |
| 0.0882 | 0.56 | LL2_line_width | 8 mil | CL2 | 1.278136 |
| | | LL2_line_length | 6.5 mm | | |
| 0.227 | 0.217 | Cell2_width | 1.5 mm | CR2 | 3.1701 |
| | | Cell2_length | 3 mm | LR2 | 9.142 |
| 0.0882 | 0.56 | LR2_line_width | 8 mil | LL2 | 3.64 |
| | | LR2_line_length | 7 mm | | |

The first two columns in Table 13 provide the capacitance and inductor values per unit mm length for a metallization located on layer 3. The numbers defined in the first two columns can be used to extract estimated values of LR, CR, and LL. CL can be derived from conventional parallel plates capacitance equations Eqs. (21):

$$CL12 = \left(\frac{\varepsilon_0\varepsilon(\text{MIM\_Length} + \text{MIM12\_L\_Adj})MIM - \text{width})}{\text{Substrate\_thickness}}\right)$$ Eq. (21)

$$CL2 = 2\left(\frac{\varepsilon_0\varepsilon(\text{MIM\_Length} + \text{MIM2\_L\_Adj})MIM - \text{width})}{\text{Substrate\_thickness}}\right)$$

$$CL1 = 2\left(\frac{\varepsilon_0\varepsilon(\text{MIM\_Length} + \text{MIM1\_L\_Adj})MIM - \text{width})}{\text{Substrate\_thickness}}\right)$$

MIM1_L_Adj, MIM2_L_Adj, and MIM12_L_Adj are the adjustments to MIM length for MIM1 (CL1), MIM2, (CL2), and MIM3 (CL12=CL1 CL2/(CL1+CL2)) values. Of course, in this special case the adjustment values, MIM1_L_Adj, MIM2_L_Adj, and MIM12_L_Adj, are set to zero since this design is based on an isotropic structure where CL1=CL2=2CL13. The factor "2" in CL1 and CL2 are attributed to having a top and bottom MIM layer, whereas CL12 has only a bottom MIM layer as defined in Table 12.

Note, Table 13 and the HFSS design in FIG. 35A-35G are designed to simulate printed anisotropic structures where LR1≠LR2, CR1≠CR2, LL1≠LL2, and CL1≠CL2.

Figure 36A:
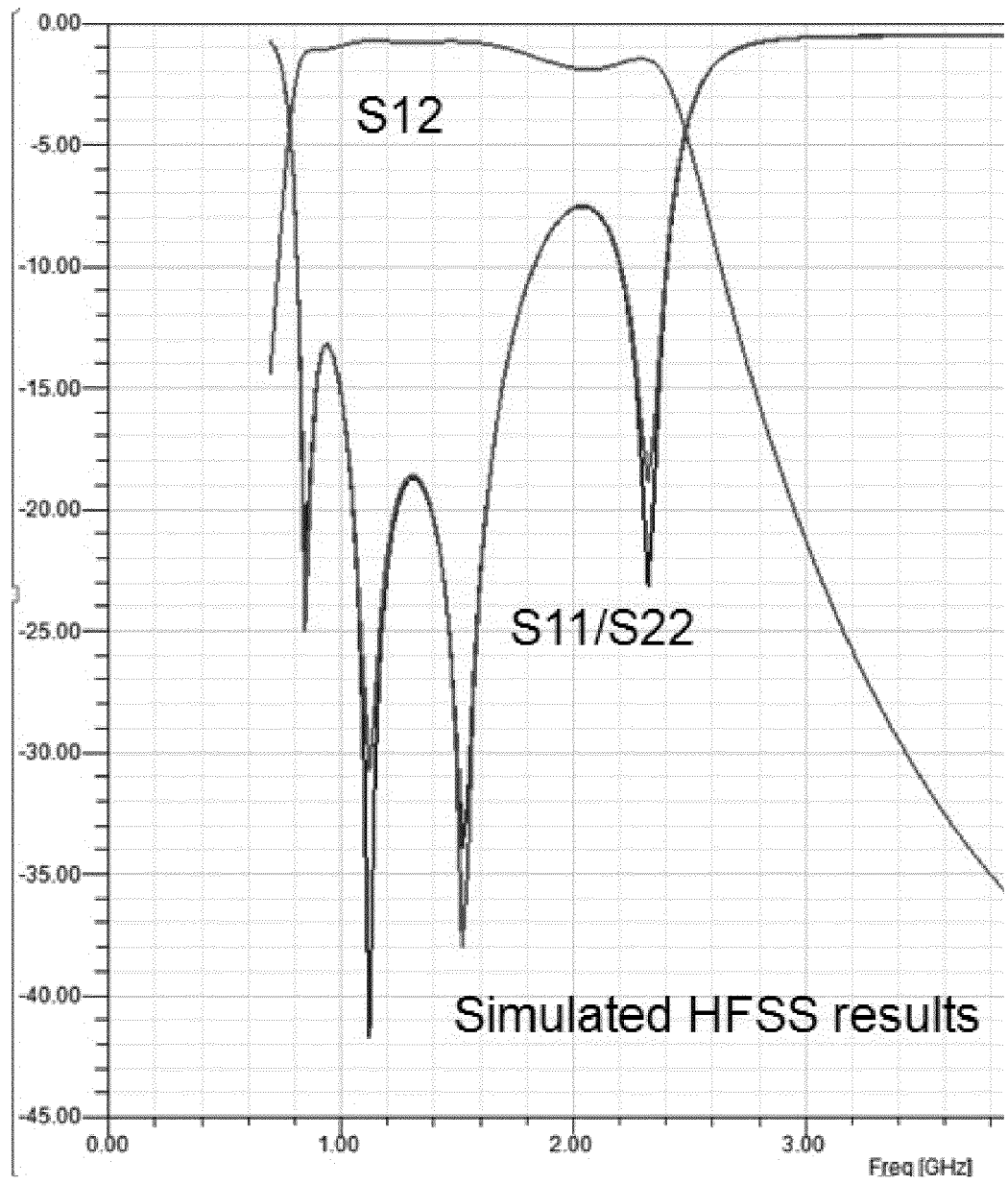
FIG. 36A illustrates HFSS simulation of the fully printed structure of FIGS. 35A-35G and Table 13, which main C-CRLH structure corresponds to the circuit in FIG. 34.
Figure 36B:
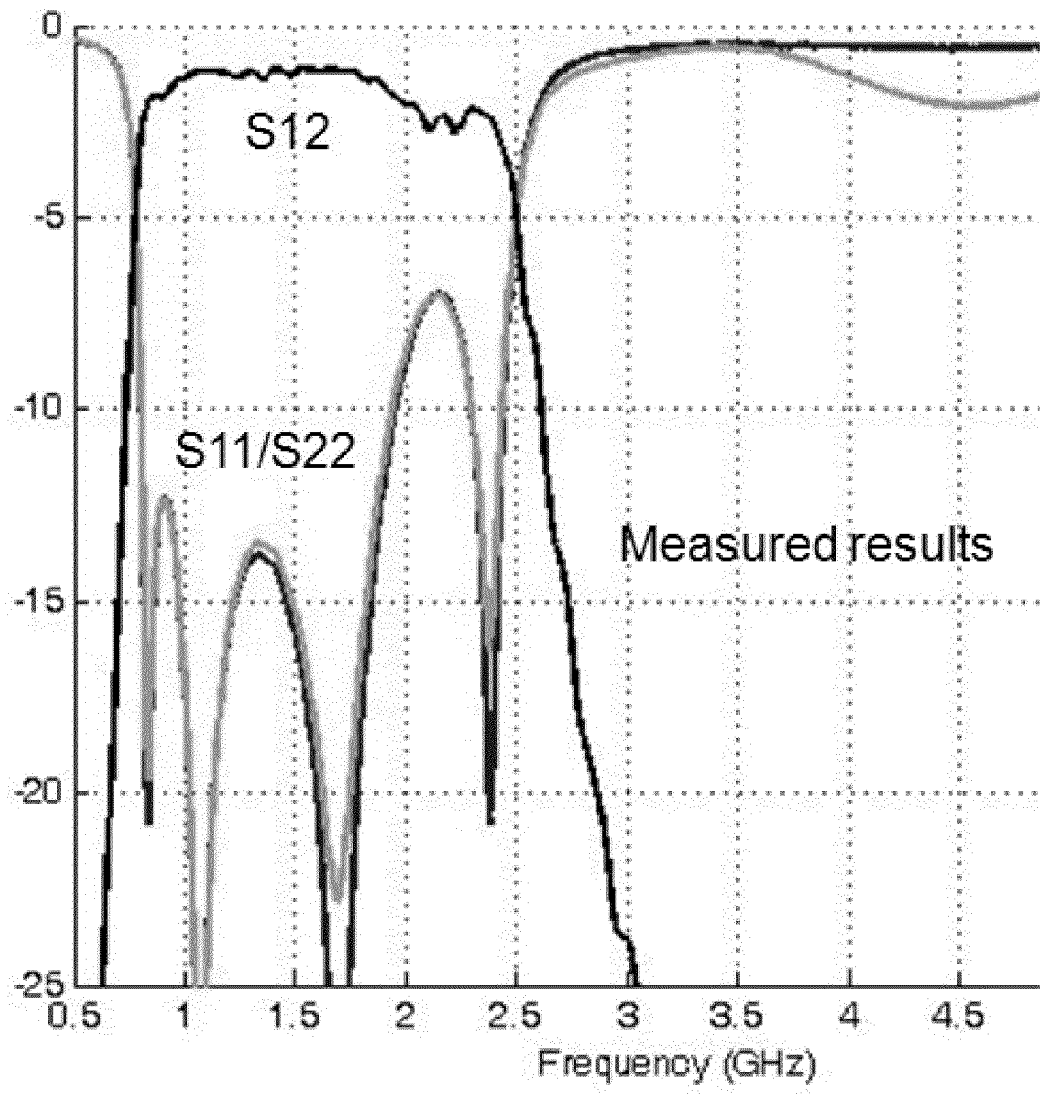
FIG. 36B illustrates measure results of the fully printed structure of FIGS. 35A-35G and Table 13.

The return loss S11/S22 and transmission S12 illustrated in FIG. 36A of the HFSS simulation results of the structure in FIGS. 35A-35G, Table 12, and Table 13 are all in agreement with measured, post fabrication results as depicted in FIG. 36B. Results shown in FIGS. 36A-36B and FIG. 34B are in agreement and confirm the validity of the flowchart strategy in FIG. 13, despite a few unknown factors. Examples of such factors may include the coupling of the two CPW lines to the main C-CRLH printed structures that were not accounted for in the circuit design of FIG. 34B and parameterization mapping chart Table 13.

The −1 dB and −2 dB insertion loss (S12) in the simulated and measured filter response is likely attributed to using the lossy FR4 substrate. Both filter size and insertion loss can be improved by using the same design process on different substrates such as LTCC. The WWAN filter size on FR4 after meandering both via lines and LR-lines is about 18 mm long by 4 mm wide, which is $\lambda/20$ by $\lambda/100$, respectively.

3.2 Balanced Anisotropic Case

Figure 37A:
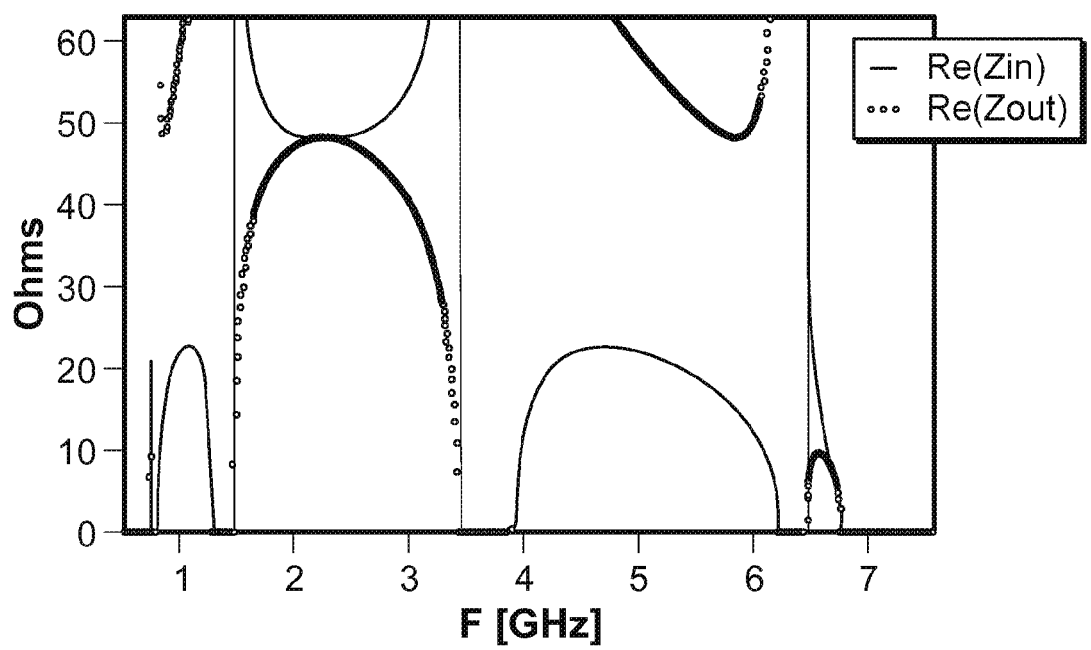
FIG. 37A illustrates a filter that transforms the input impedance from 20 Ohm to 50 Ohm and covers 900 MHz to 6 GHz bandwidth insertion loss for the balanced anisotropic case.
Figure 37B:
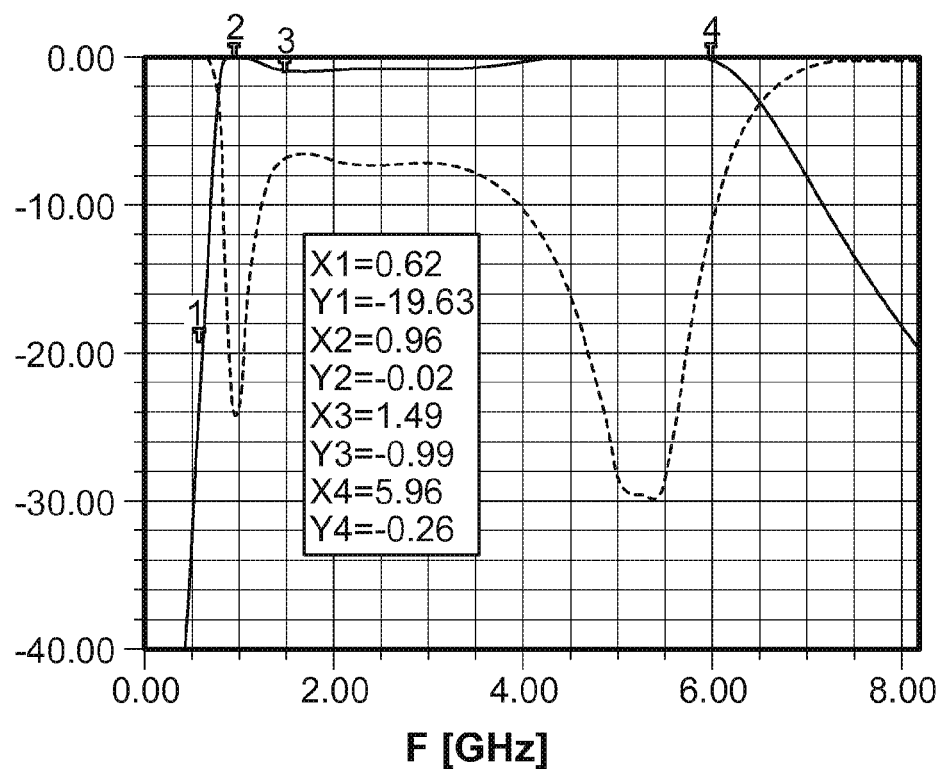
FIG. 37B illustrates the circuit response of the parameters for the balanced anisotropic case.

In another embodiment of the present technique, a broadband filter with impedance transformer can be designed since Zin and Zout can take different values. Notice that case 1 and case 2 are identical when the balanced condition is imposed. Below is an example of a filter that transforms the input impedance from about 20 Ohm to 50 Ohm and covers a range of about 900 MHz to 6 GHz bandwidth insertion loss <−1 dB as illustrated below and in Table 14, FIG. 37A and FIG. 37B.

LR11=2
LR21=3.25
FreqSH=2.25
FreqSE=2.25
FreqR=3

TABLE 14

| Parameter | Value | Units |
|---|---|---|
| $Zc | 20 | ohm |
| $Zc2 | 50 | ohm |
| $LR1 | 2 | nH |
| $LR2 | 3.25 | nH |
| $CR1 | 1.4 | pF |
| $CR2 | 0.9 | pF |
| $LL1 | 3.5 | nH |
| $LL2 | 5.8 | nH |
| $CL1 | 2.5 | pF |
| $CL2 | 1.5 | pF |

IV. Filter Design AC 4 (Anisotropic Conventional):
Design AC 4.1: Unbalanced Anisotropic Case 2

Figure 38A:
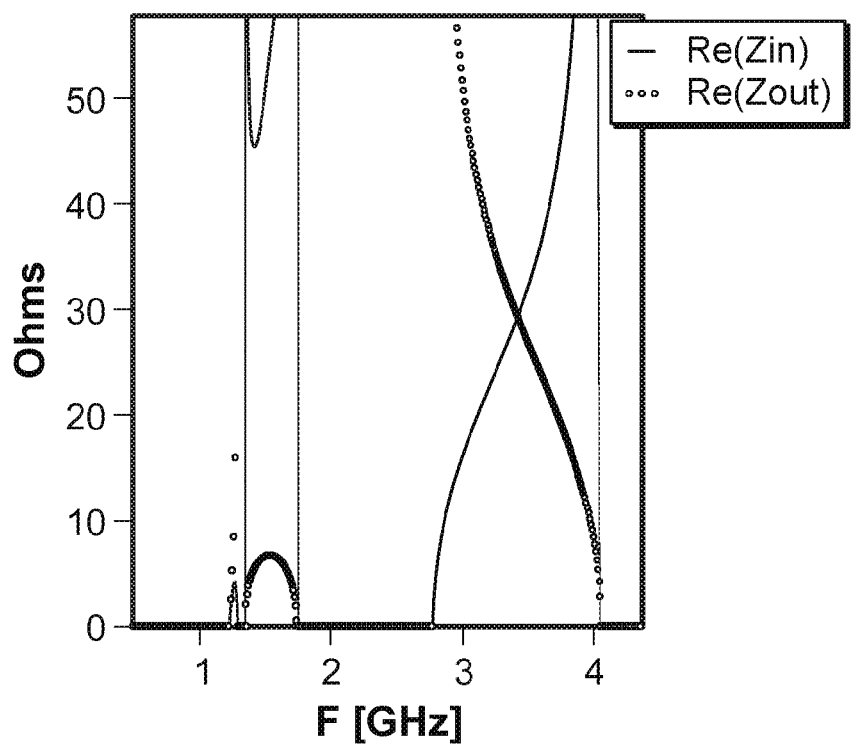
FIG. 38A illustrates a filter that transforms the input impedance from 50 Ohm to 5 Ohm and covers 1 GHz to 1.65 GHz bandwidth near zero insertion loss for the unbalanced anisotropic case.
Figure 38B:
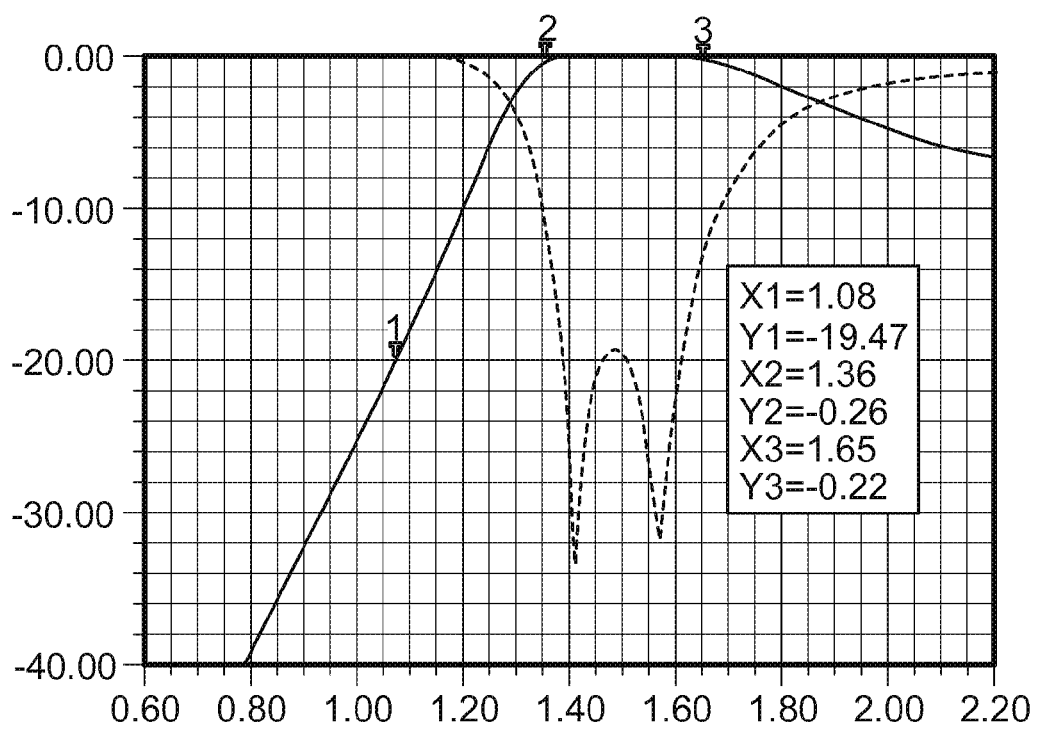
FIG. 38B illustrates the circuit response of the parameters for the unbalanced anisotropic case.

In another embodiment of the present technique, a narrow band impedance transformer using case 2, Eqs. (18) and Eqs. (19) is presented. The parameters shown below and in Table 15 represent an example of a filter that transforms the input impedance from about 50 Ohm to 5 Ohm and covers a range of about 1 GHz to 1.65 GHz bandwidth near zero insertion loss as illustrated in FIG. 38A and FIG. 38B.

LR11=0.25
LR21=2
FreqSH=2.25
FreqSE=8
FreqR=6

TABLE 15

| Parameter | Value | Units |
|---|---|---|
| $Zc | 50 | ohm |
| $Zc2 | 5 | ohm |
| $LR1 | 0.25 | nH |
| $LR2 | 2 | nH |
| $CR1 | 2.8 | pF |
| $CR2 | 0.35 | pF |
| $LL1 | 1.8 | nH |
| $LL2 | 1.1 | nH |
| $CL1 | 1.6 | pF |
| $CL2 | 2.5 | pF |

Figure 39:
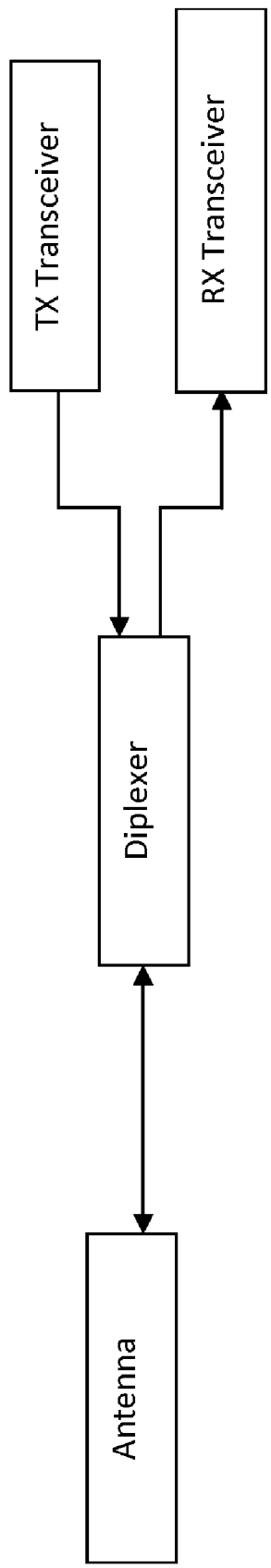
FIG. 39 illustrates a functional block diagram of a WAN/LAN diplexer.

Diplexer for Cell Phone Applications:

One embodiment is directed towards a diplexer for cell-phone applications. In this example, the diplexer receives an input signal from a TX transceiver and transits it to an antenna for transmission as illustrated in FIG. 39. It may also receive the signal from the antenna and transmit it to an RX transceiver. The diplexer design can be used for cell-phone Band VIII (RX: 880-915 MHz & TX: 925-960 MHz) and Band III (RX: 1710-1785 MHz & TX: 1850-1880 MHz) in different implementations. For example, for a first implementation (Implementation A), a Band III transmit signal (TX: 1850-18880 MHz) can be sent to the antenna while a Band VIIII receive signal (RX: 880-915 MHz) can be sent to the RX transceiver. In another implementation, Implementation B, a Band VIII transmit signal (TX: 925-960 MHz) can be sent to the antenna while a Band IIII received signal (RX: 1710-1785 MHz) can be sent to the RX transceiver.

The diplexer can be also designed to reject all higher transmit frequencies harmonics. In other words, the diplexer's low-band portion near 900 MHz should have at least a −40 dB rejection at the high-band near 1800 MHz. Furthermore, the higher harmonics (i.e., greater than 3 GHz) of the TX high-band near 1800 MHz should also be suppressed.

In this example, the diplexer should maintain at least a −27 dB isolation between the low and high band of the diplexer.

It may be clear for those of ordinary skilled in the art that other diplexers with other frequency bands and band rejection/isolation requirements can be designed using the same methods described in this section.

Figures 1, 40A:
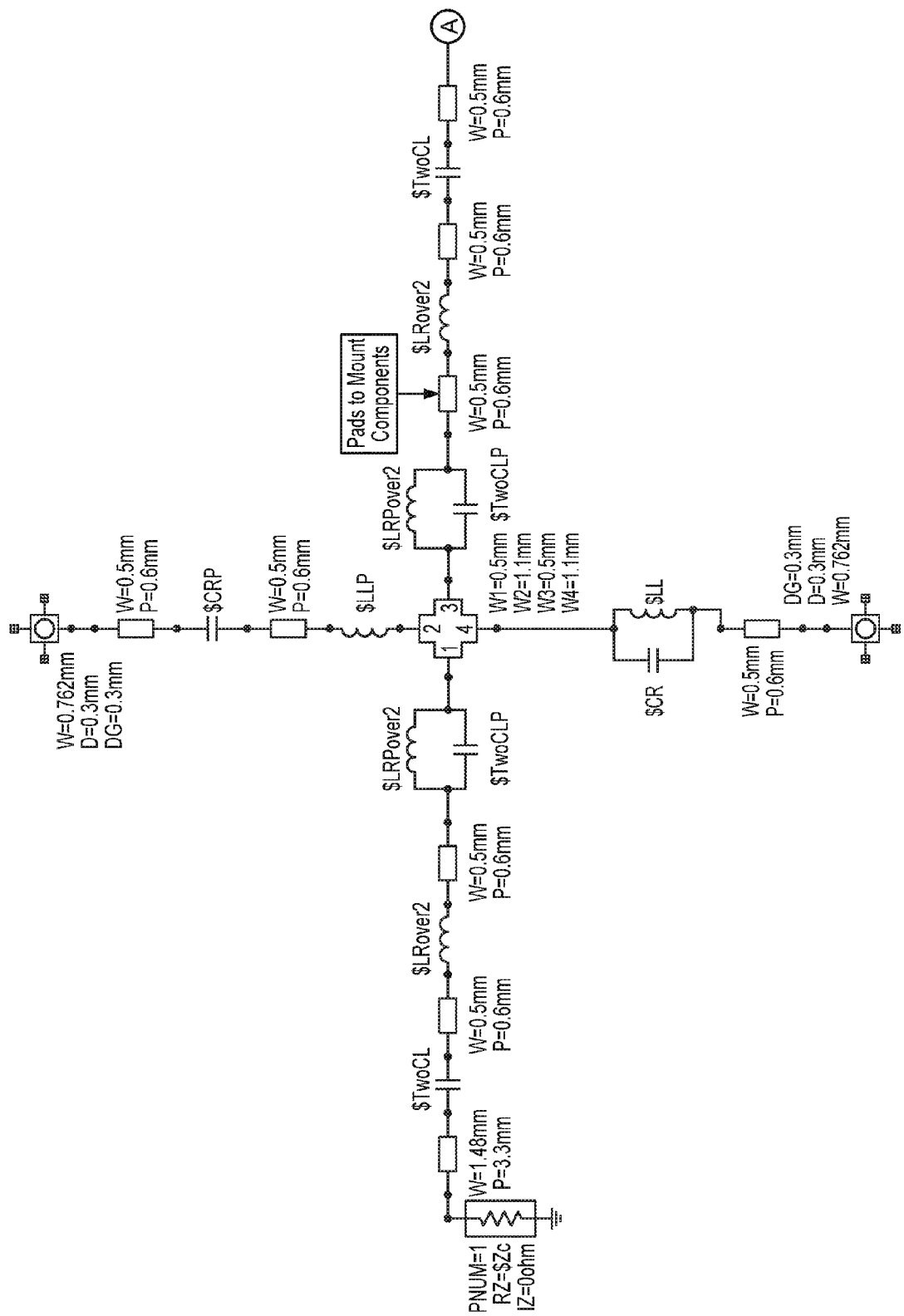
FIGS. 40A-40B illustrates a Low-Band Band-Pass Filter using one E-CRLH unit cell and 3-cell Low-Pass filter; (a) Circuit layout with pads for components, (b) Picture of preliminary fabricated prototype.
Figures 2, 40A:
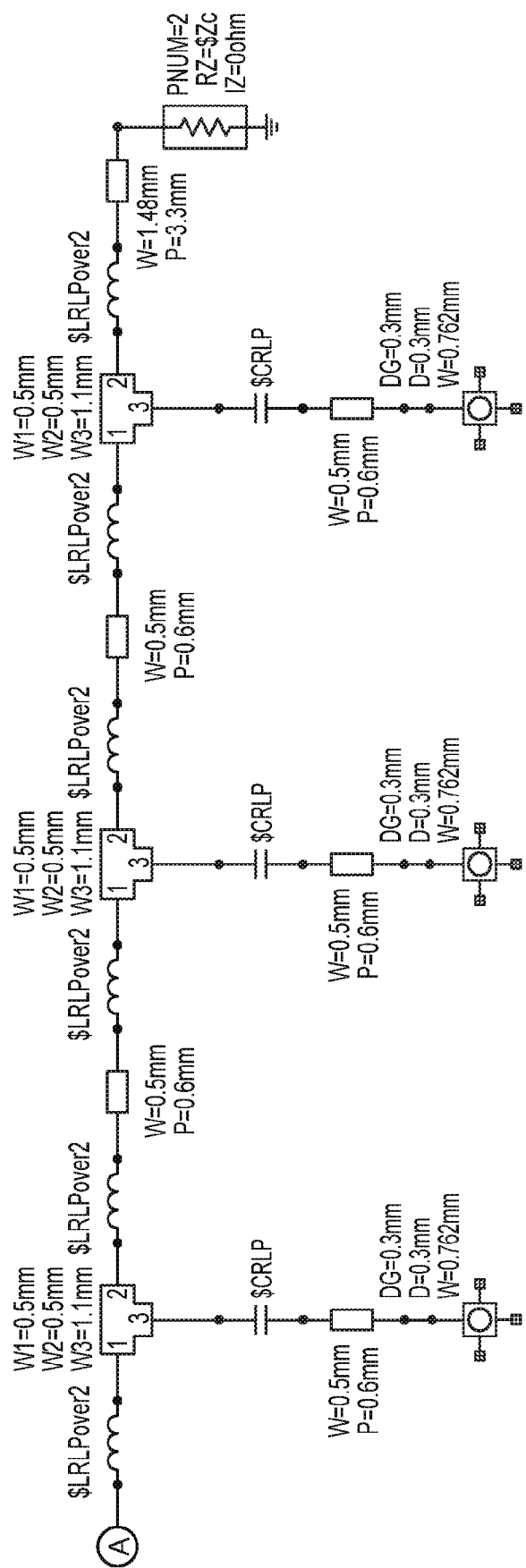
Figure 40B:
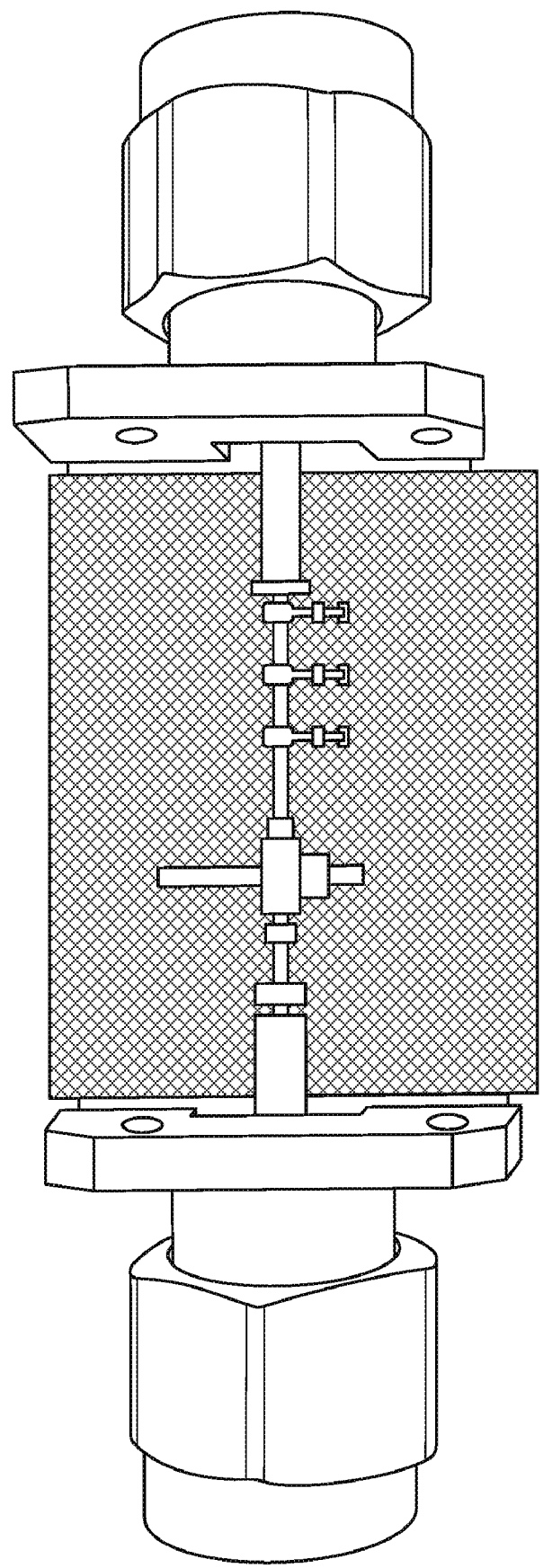

Low-Pass (LP) Band-Pass (BP) Filter Design:

A low-band band-pass filter can be designed using one E-CRLH unit cell followed by a 3-cell conventional LP filter as depicted in FIG. 40A. In this design, pads are included in the design for stability and mounting purposes. The fabricated filter is illustrated in FIG. 40B.

The low-band portion of the cell-phone diplexer can be designed by setting the following parameters in the Matlab code as shown in Table 16.

TABLE 16

| Freq0_1 | 0.8 GHz | Freq0_3 | 0.8 GHz |
|---|---|---|---|
| Freq0_2 | 3.5 GHz | Freq0_4 | 3.5 GHz |
| LR | 6 nH | LL | 5.87714 nH |
| CR | 1.75 pF | CL | 1.328893 pF |
| LR' | 17.63142027 nH | LL' | 2 nH |
| CR' | 3.986679062 pF | CL' | 0.583333 pF |
| Need = 0 | 0 0 | 0 | |

The circuit parameters, shown in Table 17, are used in the circuit simulation tool to evaluate the filter response.

TABLE 17

| Parameter | Value | Units | Value |
|---|---|---|---|
| $Zc | 50 | ohm | 50 ohm |
| $LRover2 | 6/2 | nH | 3 nH |
| $CR | 1.75 | pF | 1.75 pF |
| $LRPover2 | 17.5/2 | nH | 8.75 nH |
| $CRP | 4 | pF | 4 pF |
| $LL | 6 | nH | 6 nH |
| $TwoCL | 2 * 1.3 | pF | 2.6 pF |
| $LLP | 2 | nH | 2 nH |
| $TwoCLP | 2 * 0.6 | pF | 1.2 pF |
| $LRLPover2 | 13 nH/2 | | 6.5 nH |
| $CRLP | 5 | pF | 5 pF |

Figure 41A:
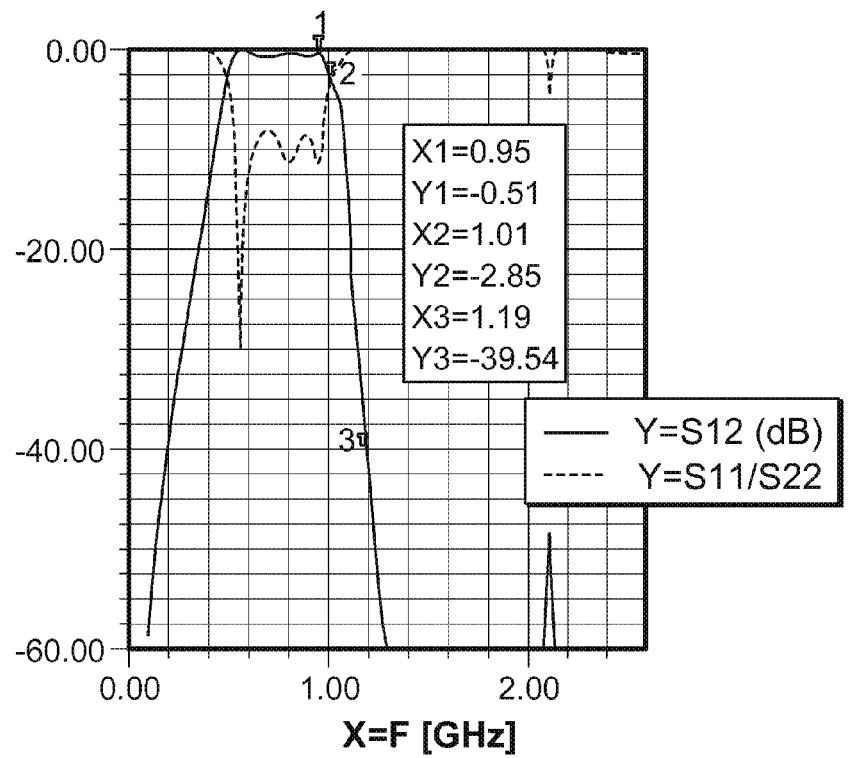
FIGS. 41A-41B illustrates a Transmission (S12) and return loss (S11/S22) for the Low-Band Band-Pass Filter; (a) Simulation from FIG. 40A, (b) Measured from FIG. 40B.
Figure 41B:
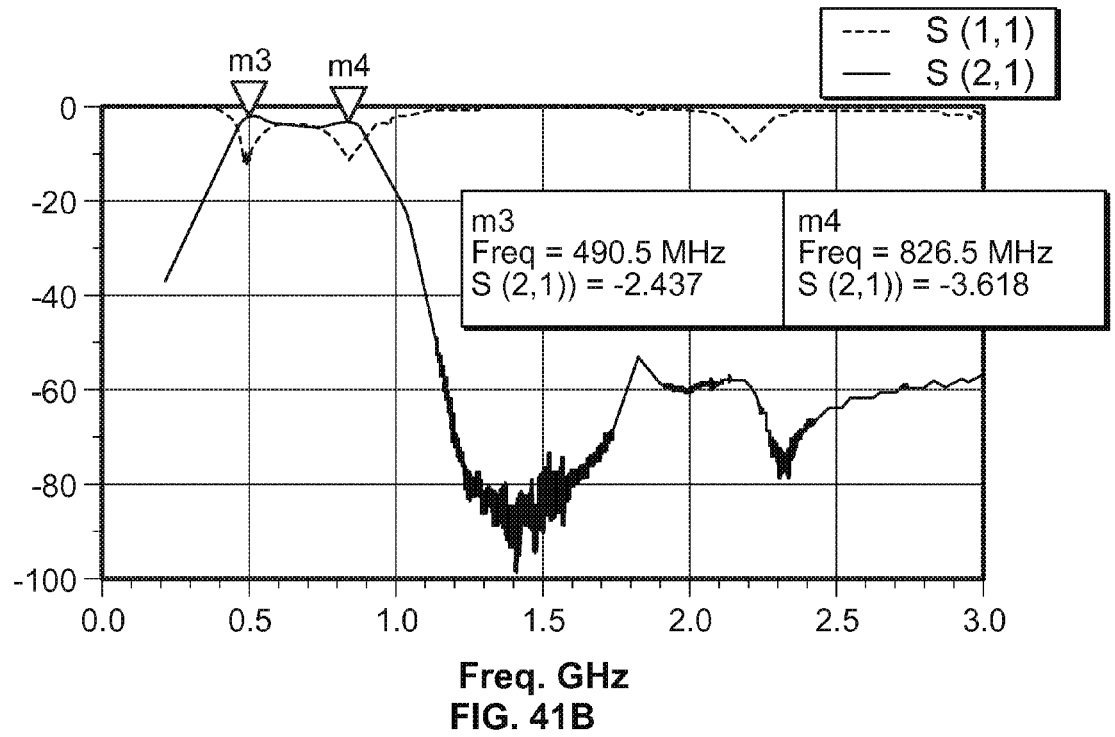

The results are presented in FIG. 41A. The LP BP filter response complies with the diplexer lower-band spec in terms of covering 880-960 MHz band while rejecting higher harmonics and having a steep rejection above 1.1 GHz. Measured results (FIG. 41B) confirms simulated results even with the higher measured insertion loss which may be due to a low-quality lossy inductor and the capacitor selection.

Figure 42A:
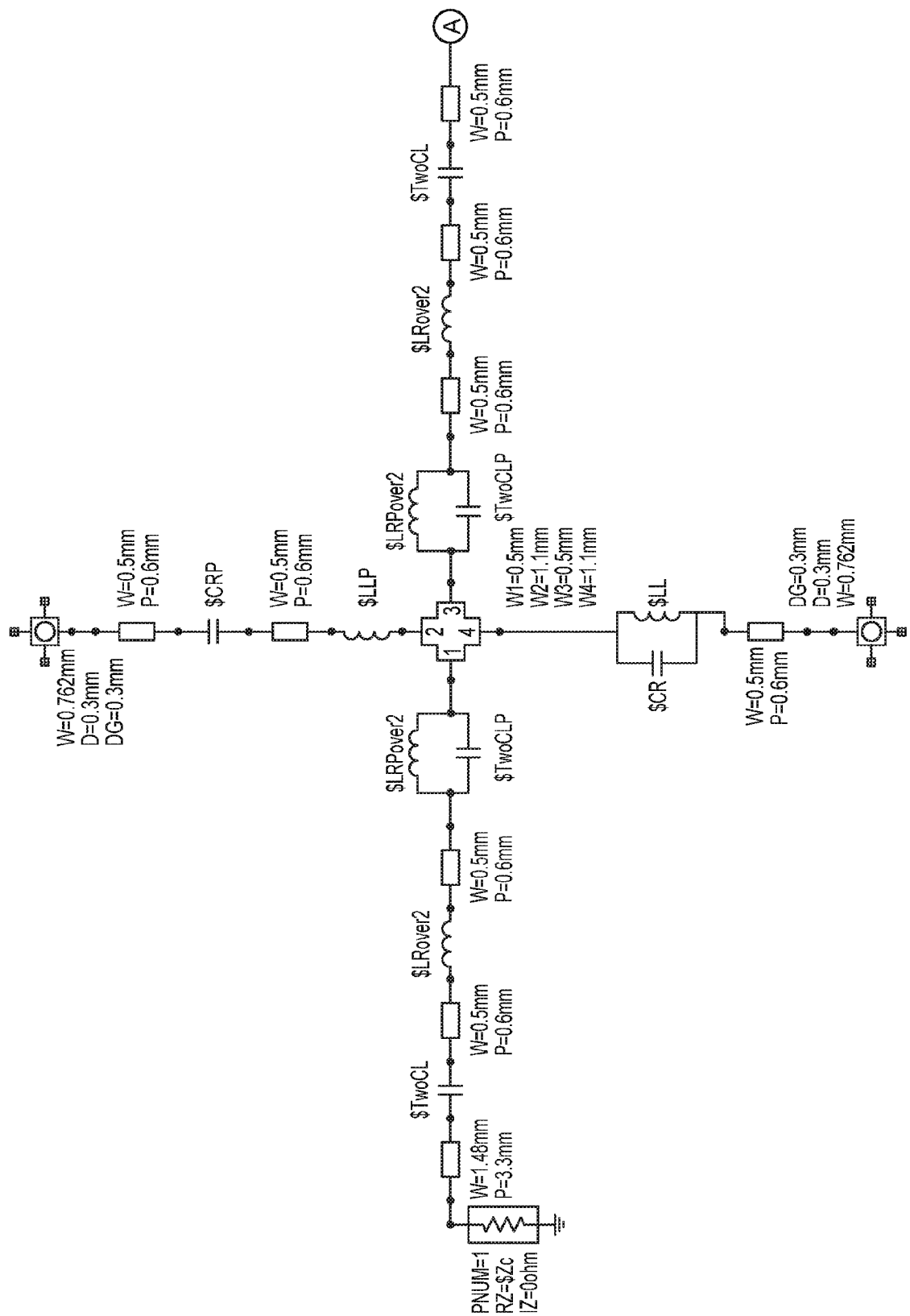
FIGS. 42A-42B illustrate a High-Band Band-Pass Filter using one E-CRLH unit cell and 3-cell High-Pass filter.
Figure 42B:
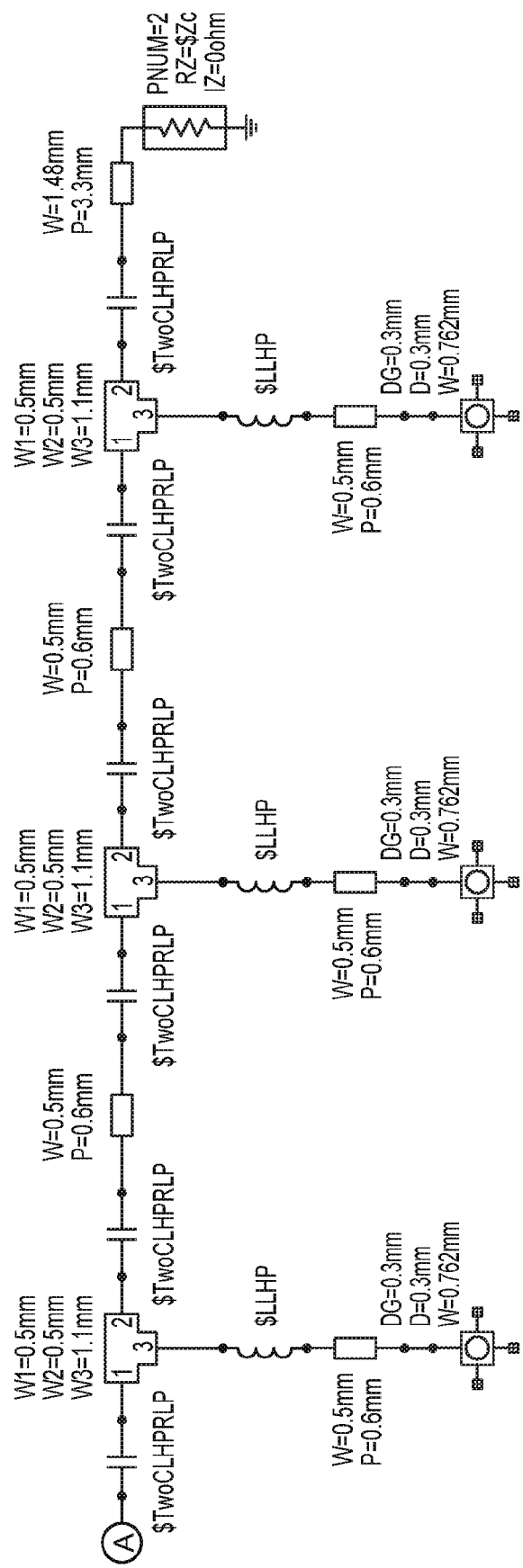

High-Pass Band-Pass Filter Design:

A high-band band-pass filter is designed using one E-CRLH unit cell followed by 3-cell conventional HP filter as depicted in FIG. 42. Pads can be included in the design to evaluate their effect of overall filter response.

The high-band portion of the cell-phone diplexer is designed by setting the following parameters in the Matlab code as shown in Table 18.

TABLE 18

| Freq0_1 | 0.6 GHz | Freq0_3 | 0.6 GHz |
|---|---|---|---|
| Freq0_2 | 2.1 GHz | Freq0_4 | 2.1 GHz |
| LR | 22 nH | LL | 5.590318 nH |
| CR | 3.9 pF | CL | 0.844299 pF |
| LR' | 42.40930957 nH | LL' | 2.9 nH |
| CR' | 6.405030626 pF | CL' | 0.514091 pF |
| Need = 0 | 0 | 0 | |
| Zc | 75.10676162 Ohm | | |

The circuit parameters, shown in Table 19, are used in the circuit simulation tool to evaluate the filter response. Note, to account for the pads effects, the value of LR had to be increased from 22 nH to LR=30 nH, which was derived from the Matlab and the spreadsheet simulations.

TABLE 19

| Parameter | Value | Units | Value |
|---|---|---|---|
| $Zc | 50 | ohm | 50 ohm |
| $LRover2 | 30/2 | nH | 15 nH |
| $CR | 3.9 | pF | 3.9 pF |
| $LRPover2 | 42.4/2 | nH | 21.2 nH |
| $CRP | 6.4 | pF | 6.4 pF |
| $LL | 5.6 | nH | 5.6 nH |
| $TwoCL | 2 * 0.85 | pF | 1.7 pF |
| $LLP | 2.9 | nH | 2.9 nH |
| $TwoCLP | 2 * 0.51 | pF | 1.02 pF |
| $LLHP | 3.3 | nH | 3.3 nH |
| $TwoCLHP | 2 * 1.3 | pF | 2.6 pF |

Figure 43:
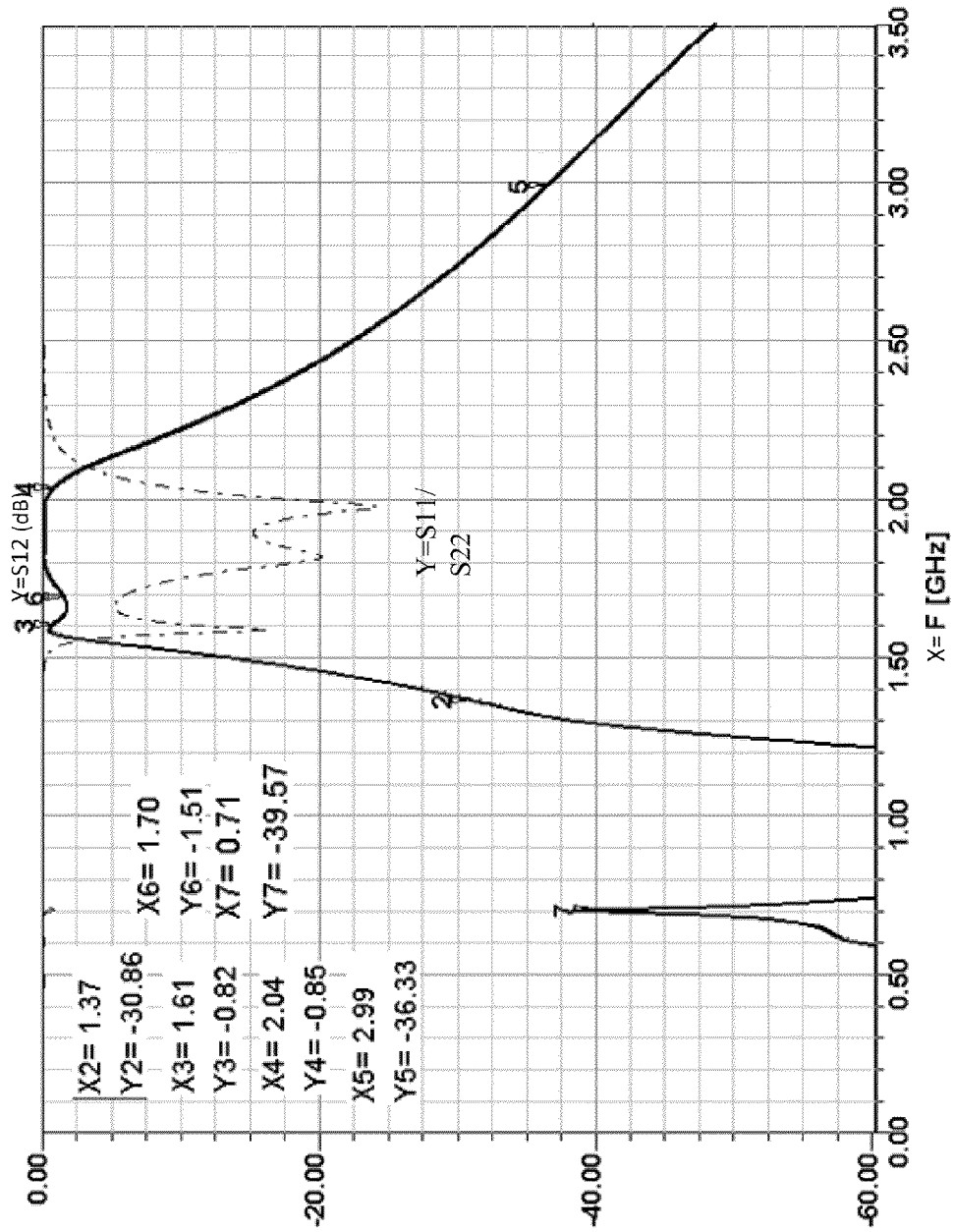
FIG. 43 illustrates a simulated transmission (S12) and return loss (S11/S22) for the Low-Band Band-Pass Filter in FIG. 42.
Figure 44A:
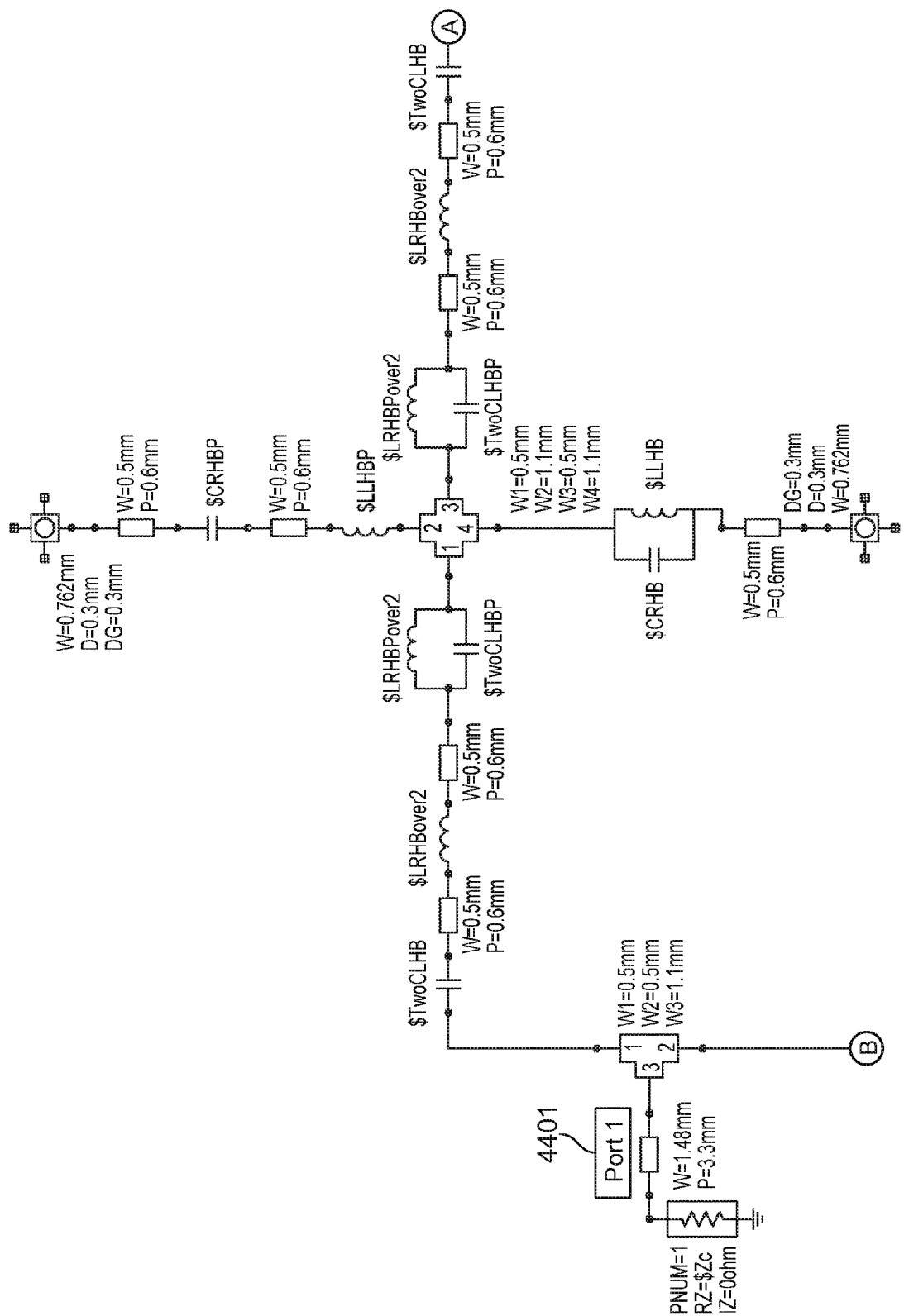
FIGS. 44A-44D illustrate a 3-port diplexer combining both Low-Pass and High-pass band-Pass filters in FIGS. 40A-40B and 41A-41B, respectively.
Figure 44B:
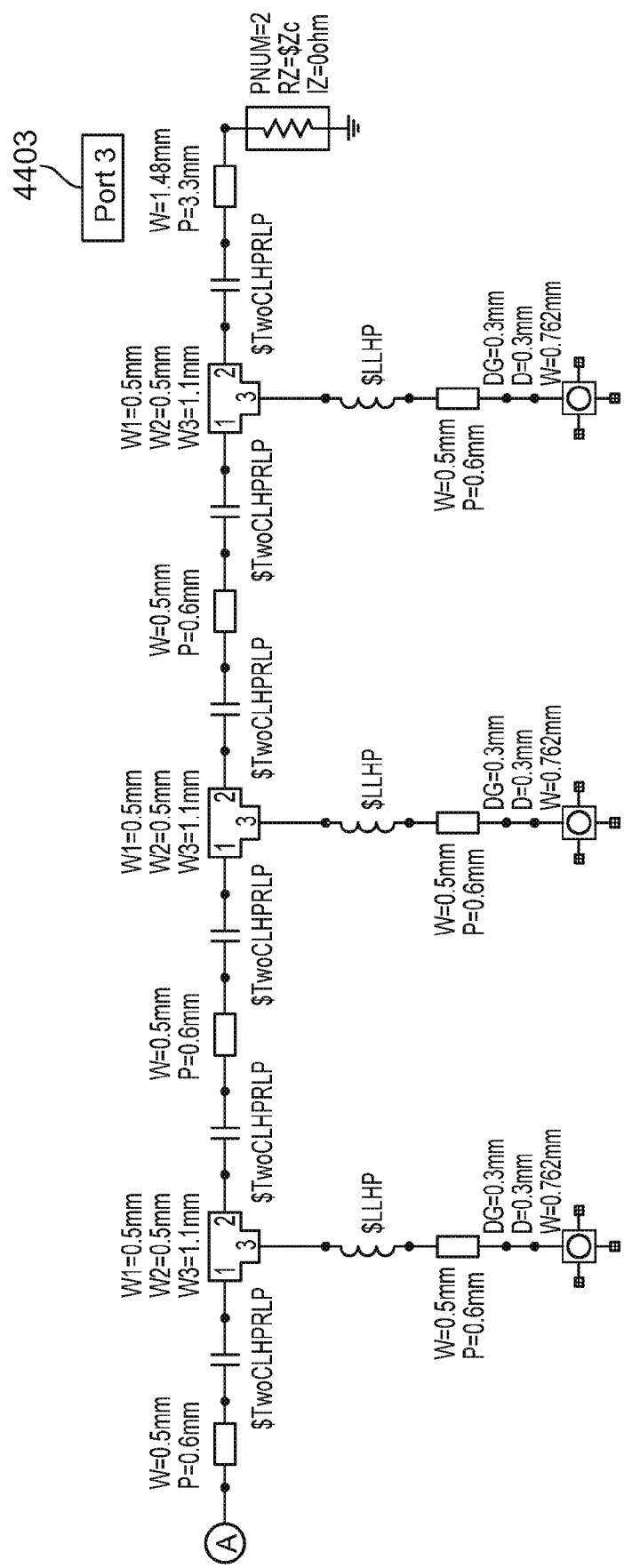
Figure 44C:
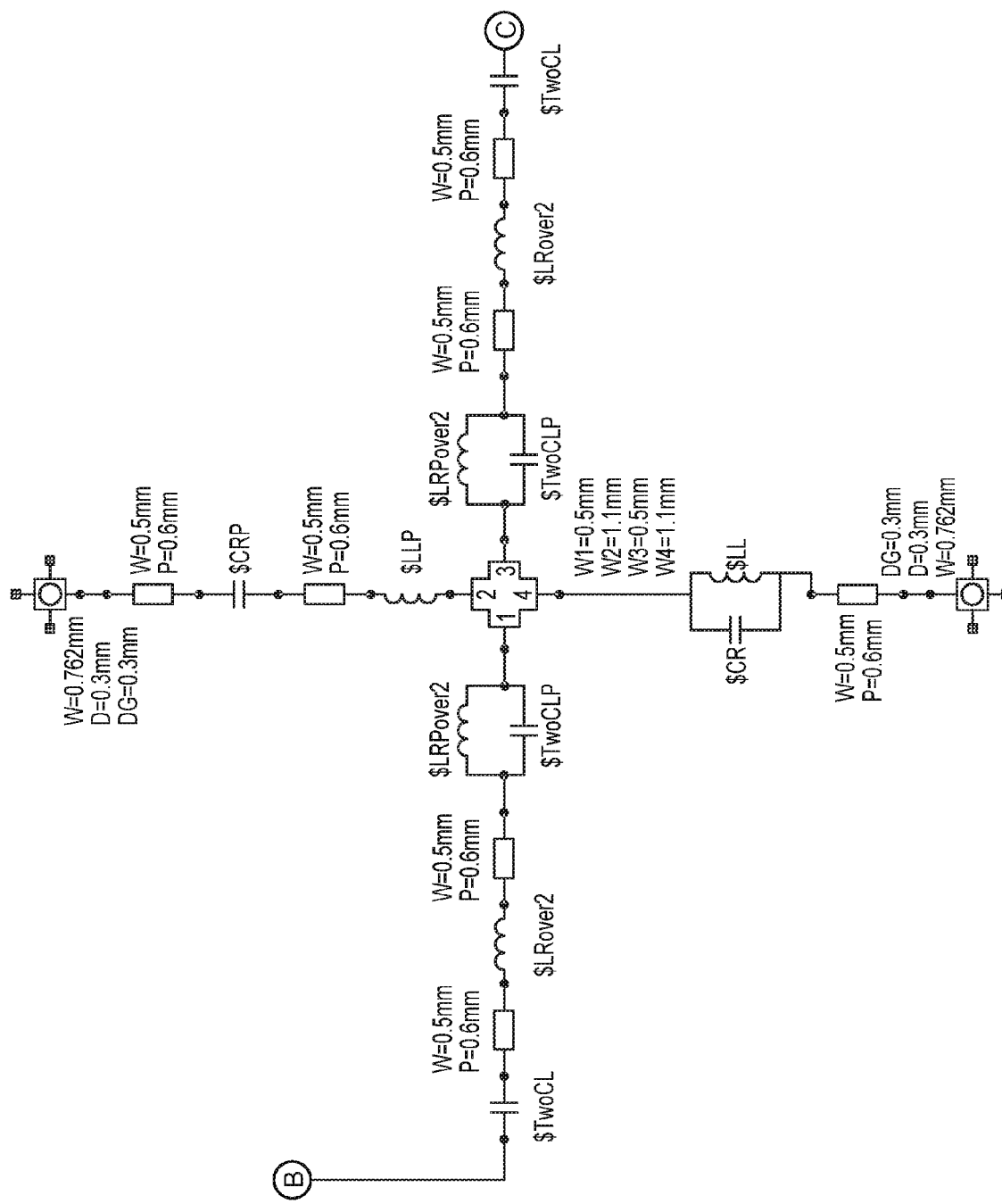
Figure 44D:
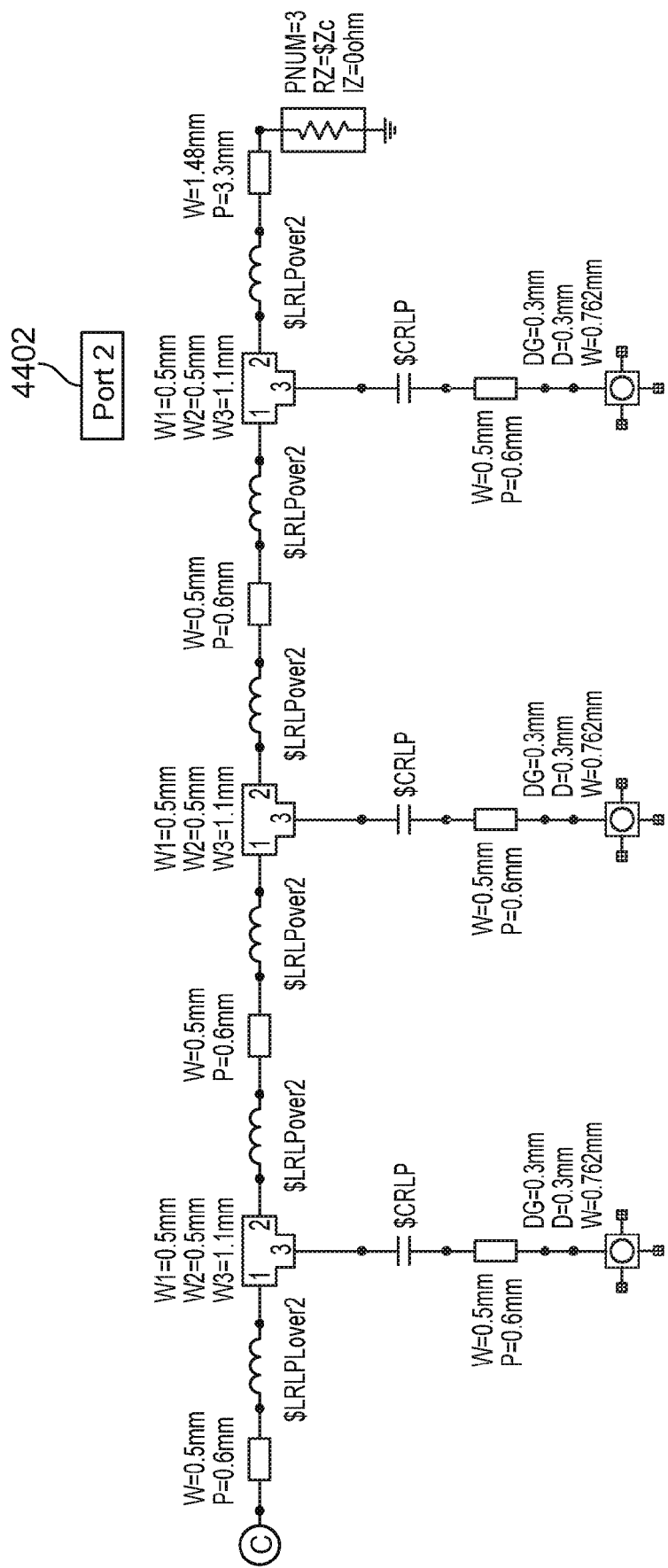

The results are presented in FIG. 43. The HP BP filter response complies with the diplexer upper-band spec in terms of covering 1710-1880 MHz band while rejecting higher harmonics (greater than 3 GHz) and having a steep rejection below 1.37 GHz.

Complete Diplexer Assembly:

The diplexer circuit assembly is shown in FIG. 44 and depicts three ports:

Port 1 4401: antenna input/output port.

Port 2 4402: antenna to low-band Rx transceivers or from low-band TX transceiver.

Port 3 4403: antenna to high-band Rx transceivers or from high-band TX transceiver.

Figure 45:
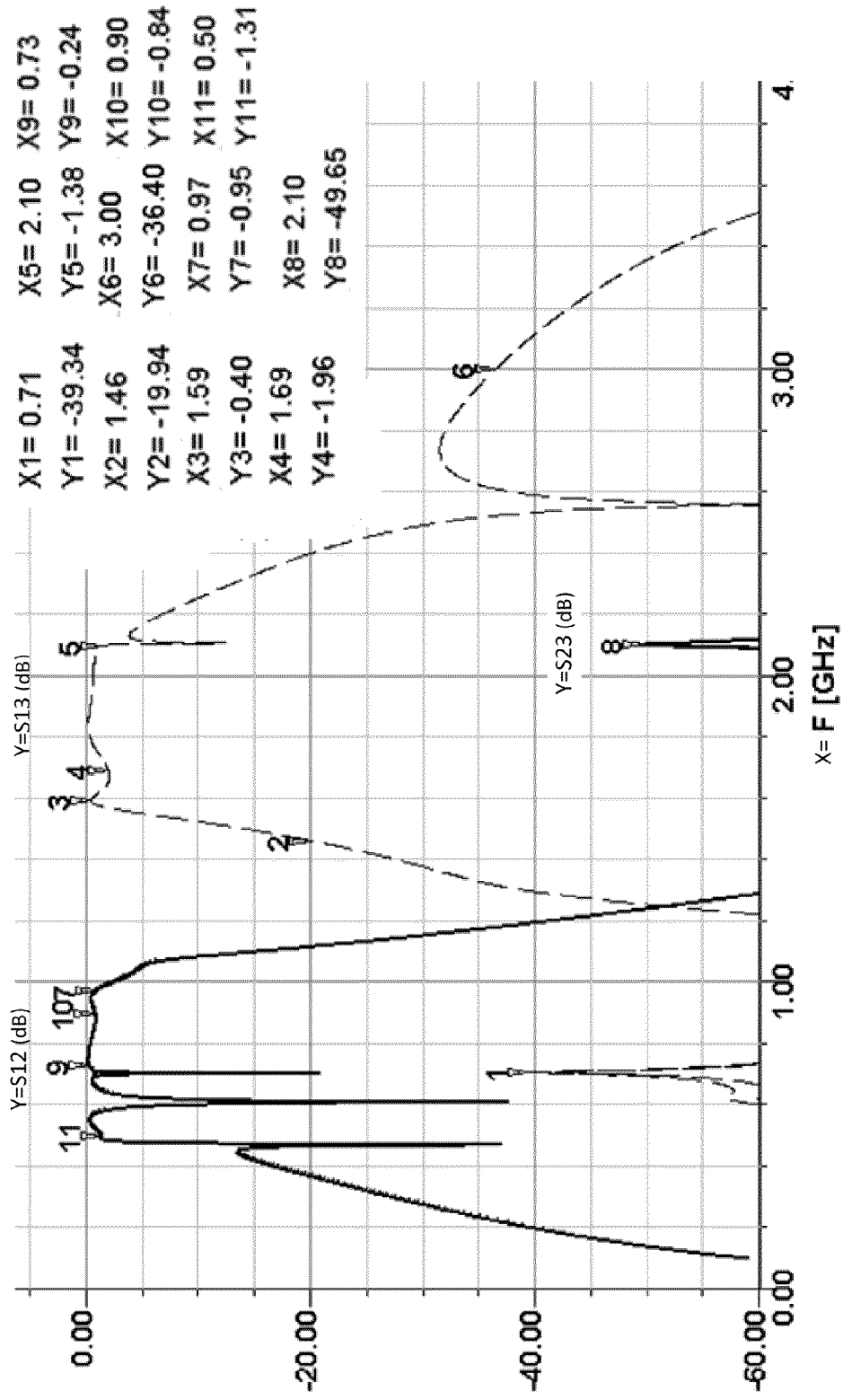
FIG. 45 illustrates simulated transmission S12 and S13 as well as coupling between Port 2 and Port 3 for the High-Band Low-Band Diplexer in FIG. 44.

The diplexer response is illustrated in FIG. 45. As predicted from simulation data, the higher-harmonics rejection is below −40 dB, and the isolation between the lower and upper band is maintained below −40 dB. Furthermore, the isolation between transceiver ports 2 and 3 is maintained below −40 dB.

While this specification contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above are acting in certain combinations and even initially claimed as such, one or more features from a claimed combination can in some cases be exercised from the combination, and the claimed combination may be directed to a subcombination or variation of a subcombination.

Thus, particular embodiments have been described. Variations, enhancements and other embodiments can be made based on what is described and illustrated.

What is claimed is:

1. A metamaterial structure based filter apparatus, comprising: an unbalanced extended composite left and right handed (E-CRLH) metamaterial unit cell comprising:

a first series inductor LR and a first series capacitance CL that in combination produce a first series resonance $\omega_{SE}$, a first shunt inductor LL and a first shunt capacitance CR that in combination produce a first shunt resonance $\omega_{SH}$, a second series inductor LR' and a second series capacitance CL' that in combination produce a second series resonance $\omega_{SE}'$, and a second shunt inductor LL' and a second shunt capacitance CR' that in combination produce a second shunt resonance $\omega_{SH}'$, wherein the first series inductor LR, the first series capacitance CL, the first shunt inductor LL, the first shunt capacitance CR, the second series inductor LR', the second series capacitance CL', the second shunt inductor LL' and the second shunt capacitance CR' are (1) coupled to form a symmetric cell structure for the E-CRLH unit cell where an input and an output of the E-CRLH unit cell have a common circuit structure, and (2) to have values that render $\omega_{SE}$ and $\omega_{SH}'$ to be substantially equal, and $\omega_{SH}$ and $\omega_{SE}'$, to be substantially equal.

2. The apparatus as in claim 1, comprising one or more additional E-CRLH unit cells coupled to the E-CRLH unit cell.

3. The apparatus as in claim 1, comprising a low-pass filter that is coupled to the E-CRLH unit cell.

4. The apparatus as in claim 3, wherein the low-pass filter comprises the metamaterial structure.

5. The apparatus as in claim 1, comprising a high-pass filter that is coupled to the E-CRLH unit cell.

6. The apparatus as in claim 5, wherein the high-pass filter comprises the metamaterial structure.

7. The apparatus as in claim 1, wherein a ratio of LR/CR and a ratio of LL'/CL' are substantially equal.

8. The apparatus as in claim 1, wherein values of LR, CL, LL, CR, LR', CL', LL', CR' are selected to match an input impendance and an output impedance of the apparatus.

9. The apparatus as in claim 1, wherein the series inductor LR is selected to match an input impedance and an output impedance of the apparatus.

10. An apparatus comprising an unbalanced E-CRLH unit cell has a printed circuit structure formed in four separated metallization layers that are parallel to one another and comprise:

a first metallization layer of the four separated metallization layers patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line;

a second metallization layer of the four separated metallization layers patterned to comprise a first conductive cell patch positioned underneath the first metallization layer between the first and second cell patches;

a third metallization layer of the four separated metallization layers patterned to comprise a second conductive cell underneath the first conductive cell patch in the second metallization layer;

a first conductive via configured to couple the first conductive cell patch in the second metallization layer and the second conductive cell patch in the third metallization layer;

a fourth metallization layer of the four separated metallization layers to provide a ground electrode for the apparatus;

a first cell via configured to couple the first cell patch on the first metallization layer and the ground electrode in the fourth metallization layer, the first cell via being separate from and without direct contact with the first and second conductive cell patches; and a second cell via configured to couple the second cell patch on the first metallization layer and the ground electrode in the fourth metallization layer, the second cell via being separate from and without direct contact with the first and second conductive cell patches.

11. The apparatus as in claim 10, wherein:
the first metallization layer is patterned to comprise a first top ground electrode adjacent to the first launch pad and a second top ground electrode adjacent to the second launch pad;
the second metallization layer is patterned to comprise a first bottom ground electrode underneath the first top ground electrode and a second bottom ground electrode underneath the second top ground electrode,
the first top ground electrode is patterned to support, in combination with the first bottom ground electrode, a first co-planar waveguide (CPW) that is coupled between the first signal port and the first feed line, and
the second top ground electrode is patterned to support, in combination with the second bottom ground electrode, a second co-planar waveguide (CPW) that is coupled between the second signal port and the second feed line.

12. The apparatus as in claim 1, wherein circuit elements in the E-CRLH unit cell comprise discrete circuit elements.

13. The apparatus as in claim 1, wherein the E-CLRH unit cell is structured to behave as a low-pass filter at a low frequency range, a high-pass filter at a high frequency range and an isolation between an upper edge of the low-pass filter and a lower edge of the high-pass filter is equal to or greater than 25 dB.

14. The apparatus as in claim 13, wherein the low-pass filter is in a frequency band 800-2170 MHz and the high-pass filter has a frequency band 2.3-6.0 GHz.

15. A filter apparatus comprising:
an unbalanced E-CRLH unit-cell structure formed from a non-linear combination of a Conventional CRLH (C-CRLH) cell and a Dual CRLH (D-CRLH) cell;
a combination of a first series inductor LR and a first series capacitance CL of the C-CRLH cell producing a first series resonance $\omega_{SE}$;
a combination of a first shunt inductor LL and a first shunt capacitance CR of the C-CRLH cell producing a first shunt resonance $\omega_{SH}$;
a combination of a second series inductor second LR' and a second series capacitance CL' of the D-CRLH cell producing a second series resonance $\omega_{SE}'$ and
a combination of a second shunt inductor LL' and a second shunt capacitance CR' of the D-CRLH cell producing a second shunt resonance $\omega_{SH}'$, wherein $\omega_{SE}$ and $\omega_{SH}'$ are substantially equal and $\omega_{SH}'$ and $\omega_{SE}'$ are substantially equal.

16. The filter apparatus of claim 15, wherein LR/CR and LL'/CL' are substantially equal.

17. The filter apparatus of claim 15, wherein LR, CL, LL, CR, LR', CL', LL', CR' and a combination thereof are adjusted to match an input and an output impedance of the filter.

18. The filter apparatus of claim 15, wherein the series inductor LR is adjusted to match an input and an output impedance of the filter.

19. The filter apparatus of claim 15, wherein the unit-cell structure comprises a plurality of E-CRLH unit-cell structures.

20. The filter apparatus of claim 15, wherein the E-CRLH unit-cell is coupled a low-pass filter.

21. The filter apparatus of claim 15, wherein the E-CRLH unit-cell is coupled a high-pass filter.

22. The filter apparatus of claim 15, wherein the series inductor LR, the series capacitance CL, the shunt inductor LL, the shunt capacitance CR, the series inductor LR', the series capacitance CL', the shunt inductor LL' and the shunt capacitance CR' of the E-CRLH unit-cell are arranged and coupled to form a symmetric cell structure for the E-CRLH cell where an input and an output of the E-CRLH cell have a common circuit structure.

23. A filter apparatus comprising:
an unbalanced C-CRLH unit-cell structure comprised of a plurality of Conventional CRLH (C-CRLH) cells having a first CRLH (C-CRLH) cell coupled to a second CRLH (C-CRLH) cell;
a combination of a first series inductor LR1 and a first series capacitance CL1 of the first CRLH (C-CRLH) cell which produces a first series resonance $\omega_{SE1}$;
a combination of a first shunt inductor LL1 and a first shunt capacitance CR1 of the first CRLH (C-CRLH) cell which produces a first shunt resonance $\omega_{SH1}$;
a combination of a second series inductor LR2 and a second series capacitance CL2 of the second CRLH (C-CRLH) cell which produces a second series resonance $\omega_{SE2}$; and
a combination of a second shunt inductor LL2 and a second shunt capacitance CR2 of the second CRLH (C-CRLH) which produces a second shunt resonance $\omega_{SH2}$, wherein $\omega_{SE1}$ and $\omega_{SE2}$ are substantially equal, and $\omega_{SH1}$ and $\omega_{SH2}$ are substantially equal.

24. The filter apparatus of claim 23, wherein LR1, CL1, LL1, CR1, LR2, CL2, LL2, CR2, and a combination thereof are adjusted to match an input and an output impedance of the filter.

25. The filter apparatus of claim 23, wherein LR1 and LR2 parameters are adjusted to match an input and an output impedance of the filter.

26. The filter apparatus of claim 23, wherein the Conventional CRLH (C-CRLH) cell structure is coupled to a low-pass filter.

27. The filter apparatus of claim 23, wherein Conventional CRLH (C-CRLH) cell structure is coupled to a high-pass filter.

28. A fully printed extended composite left and right handed (E-CRLH) metamaterial structure, comprising:

a first metallization layer patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line;

a second metallization layer patterned to comprise a first conductive cell patch positioned underneath the first metallization layer between the first and second cell patches;

a third metallization layer patterned to comprise a second conductive cell underneath the first conductive cell patch in the second metallization layer;

a first conductive via configured to couple the first conductive cell patch in the second metallization layer and the second conductive cell patch in the third metallization layer;

a fourth metallization layer to provide a ground electrode for the apparatus;

a first cell via configured to couple the first cell patch on the first metallization layer and the ground electrode in the fourth metallization layer, the first cell via being separate from and without direct contact with the first and second conductive cell patches; and a second cell via configured to couple the second cell patch on the first metallization layer and the ground electrode in the fourth metallization layer, the second cell via being separate from and without direct contact with the first and second conductive cell patches.

29. A printed conventional composite left and right handed (C-CRLH) structure, comprising:

a top layer having a plurality of CPW feed lines, a top ground, and a plurality of ports;

a first dielectric substrate having a first surface on a first side and a second surface on a second side opposing the first side, wherein the first surface of the first substrate is attached to the top layer;

a second layer having a top metal-insulator-metal (MIM) layer, wherein the second layer is attached to the second surface of the first substrate, wherein a first set of cell conductive via connectors are formed in the first substrate creating a conductive path from the top layer to the second layer;

a second dielectric substrate having a first surface on a first side and a second surface on a second side opposing the first side, wherein the first surface of the second substrate is attached to the second layer;

a third layer having a main structure, wherein the third layer is attached to the second surface of the second substrate, wherein a second set of cell conductive via connectors are formed in the second substrate creating a conductive path from the second layer to the third layer;

a third dielectric substrate having a first surface on a first side and a second surface on a second side opposing the first side, wherein the first surface of the third substrate is attached to the third layer;

a fourth layer having a bottom MIM layer, wherein the fourth layer is attached to the second surface of the third substrate;

a fourth dielectric substrate having a first surface on a first side and a second surface on a second side opposing the first side, wherein the first surface of the fourth substrate is attached to the fourth layer; and a fifth layer having a bottom ground, wherein the fifth layer is attached to the second surface of the fourth substrate, wherein the top layer, the top, second, third, fourth, and fifth layer, the first, second, third, fourth, and fifth substrate, the cell conductive via connectors, the top MIM layer, the main structure, and the bottom MIM layer are structured to form a printed C-CRLH structure.

30. The structure as in claim 29, wherein the third layer is patterned to comprise a first cell patch, a first launch pad separated from and capacitively coupled to the first cell patch, a first feed line coupled to the first cell patch, a second cell patch, a second launch pad separated from and capacitively coupled to the first cell patch.

31. The structure as in claim 30, wherein each of the first cell patch and the second cell patch comprises a first cell patch part, a separate cell patch part and a conductor line configured to couple the first and the second cell patch parts wherein each of the first cell patch and the second cell patches comprises a first cell patch part, a second cell patch part, a separate cell patch part and a conductor line configured to couple the parts of the first and second cell patches.

32. A method, comprising:
forming circuit elements of an unbalanced E-CRLH metamaterial unit cell, including:
providing a first series inductor LR and a first series capacitance CL that in combination produce a first series resonance $\omega_{SE}$;
providing a first shunt inductor LL and a first shunt capacitance CR that in combination produce a first shunt resonance $\omega_{SH}$;
providing a second series inductor LR' and a second series capacitance CL' that in combination produce a second series resonance $\omega_{SE}'$; and
providing a second shunt inductor LL' and a second shunt capacitance CR' that in combination produce a second shunt resonance $\omega_{SH}'$; and
wherein the first series inductor LR, the first series capacitance CL, the first shunt inductor LL, the first shunt capacitance CR, the second series inductor LR', the second series capacitance CL', the second shunt inductor LL' and the second shunt capacitance CR' are (1) coupled to form a symmetric cell structure for the ECRLH unit cell where an input and an output of the E-CRLH unit cell have a common circuit structure, and (2) to have values that render $\omega_{SE}$ and $\omega_{SH}'$ to be substantially equal, and $\omega_{SH}$ and $\omega_{SE}'$ to be substantially equal.

33. The method of claim 32, comprising:
forming one or more additional E-CRLH metamaterial unit cells; and
coupling the one or more additional E-CRLH metamaterial unit cells to the E-CRLH metamaterial unit cell.

34. The method of claim 32, comprising:
forming a low-pass filter; and
coupling the low-pass filter to the E-CRLH unit cell.

35. The method of claim 32, comprising:
forming a high-pass filter; and
coupling the high-pass filter to the E-CRLH unit cell.

36. A method comprising:
forming an unbalanced E-CRLH unit includes forming a printed circuit structure formed in four separated metallization layers that are parallel to one another, the forming the printed circuit structure including:
providing a first metallization layer of the four separated metallization layers patterned to comprise a first signal port, a first feed line coupled to the first signal port, a first launch pad coupled to the first feed line, and a first cell patch that is separated from and capacitively coupled to the first launch pad, a second cell patch spaced from the first cell patch and coupled to receive a signal from the first cell patch, a second launch pad separated from and capacitively coupled to the second cell patch, a second feed line coupled to the second launch pad, and a second signal port coupled to the second feed line;

providing a second metallization layer of the four separated metallization layers patterned to comprise a first conductive cell patch positioned underneath the first metallization layer between the first and second cell patches;

providing a third metallization layer of the four separated metallization layers patterned to comprise a second conductive cell underneath the first conductive cell patch in the second metallization layer;

providing a first conductive via configured to couple the first conductive cell patch in the second metallization layer and the second conductive cell patch in the third metallization layer;

providing a fourth metallization layer of the four separated metallization layers to provide a ground electrode for the apparatus;

providing a first cell via configured to couple the first cell patch on the first metallization layer and the ground electrode in the fourth metallization layer, the first cell via being separate from and without direct contact with the first and second conductive cell patches; and providing a second cell via configured to couple the second cell patch on the first metallization layer and the ground electrode in the fourth metallization layer, the second cell via being separate from and without direct contact with the first and second conductive cell patches.

37. The method of claim 36, wherein the first metallization layer is patterned to comprise a first top ground electrode adjacent to the first launch pad and a second top ground electrode adjacent to the second launch pad;

wherein the second metallization layer is patterned to comprise a first bottom ground electrode underneath the first top ground electrode and a second bottom ground electrode underneath the second top ground electrode, wherein the first top ground electrode is patterned to support, in combination with the first bottom ground electrode, a first co-planar waveguide (CPW) that is coupled between the first signal port and the first feed line, and wherein the second top ground electrode is patterned to support, in combination with the second bottom ground electrode, a second co-planar waveguide (CPW) that is coupled between the second signal port and the second feed line.

38. The method of claim 32, comprising forming the circuit elements in the E-CRLH unit cell using discrete circuit elements.

39. The method of claim 32, comprising forming an E-CRLH metamaterial unit cell configured as a low-pass filter at a low frequency range, a high-pass filter at a high frequency range, and including an isolation between an upper edge of the low-pass filter and a lower edge of the high-pass filter is equal to or greater than 25 dB.

40. The method of claim 39, comprising forming an E-CRLH metamaterial unit cell wherein the low-pass filter has a frequency band 800-2170 MHz, and the high-pass filter has a frequency band 2.3-6.0 GHz.

41. A method, comprising:
forming an unbalanced Conventional CRLH (C-CRLH) cell and a Dual CRLH (D-CRLH) cell to establish an E-CRLH unit-cell structure, including:
providing a combination of a first series inductor LR and a first series capacitance CL of the C-CRLH cell producing a first series resonance $\omega_{SE}$;
providing a combination of a first shunt inductor LL and a shunt capacitance CR of the C-CRLH cell producing a first shunt resonance $\omega_{SH}$;
providing a combination of a second series inductor LR' and a second series capacitance CL' of the D-CRLH cell producing a second series resonance $\omega_{SE}'$; and
providing a combination of a second shunt inductor LL' and a second shunt capacitance CR' of the D-CRLH cell producing a second shunt resonance $\omega_{SH}'$,
wherein $\omega_{SE}$ and $\omega_{SH}'$ are substantially equal and $\omega_{SH}$ and $\omega_{SE}'$ are substantially equal.

42. The method of claim 41, wherein the series inductor LR, the series capacitance CL, the shunt inductor LL, the shunt capacitance CR, the series inductor LR', the series capacitance CL', the shunt inductor LL' and the shunt capacitance CR' of the E-CRLH unit-cell are arranged and coupled to form a symmetric cell structure for the E-CRLH cell where an input and an output of the E-CRLH cell have a common circuit structure.

* * * * *

UNITED STATES PATENT AND TRADEMARK OFFICE
CERTIFICATE OF CORRECTION

PATENT NO. : 8,237,519 B2
APPLICATION NO. : 12/272781
DATED : August 7, 2012
INVENTOR(S) : Achour It is certified that error appears in the above-identified patent and that said Letters Patent is hereby corrected as shown below:

Title Page 2, in Field (56), under "OTHER PUBLICATIONS", in Column 2, Line 1, delete ""Inifinite" and insert -- "Infinite --, therefor.

Title Page 2, in Field (56), under "OTHER PUBLICATIONS", in Column 2, Line 25, delete "et.al.," and insert -- et al., --, therefor.

In Fig. 13, Sheet 8 of 55, for Tag "1301", in Line 3, delete "requiment" and insert -- requirement --, therefor.

In Column 1, Lines 41-42, delete "Composite Left and Right Handed (CRLH)" and insert -- Composite Right and Left Handed (CRLH) --, therefor at each occurrence throughout the specification.

In Column 4, Line 33, delete "GHz," and insert -- GHz. --, therefor.

In Column 4, Line 36, delete "illustrates" and insert -- illustrate --, therefor.

In Column 4, Line 40, delete "(GE-CRLH)" and insert -- (GE-CRLH). --, therefor.

In Column 4, Line 56, delete "frequency" and insert -- frequency. --, therefor.

In Column 5, Line 20, delete "illustrates" and insert -- illustrate --, therefor.

In Column 5, Line 53, delete "illustrates" and insert -- illustrate --, therefor.

In Column 5, Line 57, delete "illustrates" and insert -- illustrate --, therefor.

In Column 6, Lines 25-26, delete "G. Mattaei, L. Young, E.N.T. Jones," and insert -- G. Matthaei, L. Young, E.M.T. Jones, --, therefor.

Signed and Sealed this
Eighth Day of January, 2013

David J. Kappos
*Director of the United States Patent and Trademark Office*

CERTIFICATE OF CORRECTION (continued)
U.S. Pat. No. 8,237,519 B2

In Column 6, Line 30, delete "Mattaei." and insert -- Matthaei. --, therefor.

In Column 6, Line 33, delete "Mattaei," and insert -- Matthaei, --, therefor.

In Column 6, Line 36, delete "Mattaei's" and insert -- Matthaei's --, therefor.

In Column 7, Line 32, delete "M™ transmission line (TL) is a M™" and insert -- MTM transmission line (TL) is a MTM --, therefor.

In Column 7, Line 57, delete "$\mu(\omega_o) = 0$" and insert -- $\beta(\omega_o) = 0$ --, therefor.

In Column 7, Line 67, delete "CRHL" and insert -- CRLH --, therefor.

In Column 9, Line 3, delete "respectively," and insert -- respectively. --, therefor.

In Column 9, Line 30, delete "$ZLin' = ZLin + \frac{2}{j\omega CL}, ZLout' = ZLout + \frac{2}{j\omega CL},$" and insert -- $ZLin' = ZLin + \frac{2}{j\omega CL}, ZLout' = ZLout + \frac{2}{j\omega CL},$ --, therefor.

In Column 10, Line 20, after Equation, insert -- . --.

In Column 12, Line 1, delete "condition:" and insert -- condition : --, therefor.

In Column 16, Line 58, after Equation, insert -- . --.

In Column 17, Line 67, delete "LR' LL'," and insert -- LR', LL', --, therefor.

In Column 18, Line 3, delete "LR' LL'," and insert -- LR', LL', --, therefor.

In Column 18, Line 32, delete "CL'= 6pF" and insert -- CL'= 6pF. --, therefor.

In Column 18, Line 40, delete "CL= 0.99996pF" and insert -- CL= 0.99996pF. --, therefor.

In Column 20, Line 27, delete "MHz" and insert -- +120 MHz --, therefor.

In Column 20, Line 57, under "TABLE 7", delete "layer 2 layer 2" and insert -- layer 2 --, therefor.

In Column 24, Line 35, delete "case)" and insert -- case). --, therefor.

In Column 25, Line 36, after Equation, insert -- . --.

In Column 26, Line 21, delete "C-CRLH)" and insert -- C-CRLH --, therefor.

CERTIFICATE OF CORRECTION (continued)
U.S. Pat. No. 8,237,519 B2

In Column 28, Line 43, after Equation, insert -- . --.

In Column 28, Line 47, delete "MIM2," and insert -- MIM2 --, therefor.

In Column 30, Line 8, delete "18880 MHz)" and insert -- 1880 MHz) --, therefor.

In Column 30, Line 12, delete "IIII" and insert -- III --, therefor.

In Column 32, Line 53, in Claim 8, delete "impendance" and insert -- impedance --, therefor.

In Column 33, Line 49, in Claim 13, delete "E-CLRH" and insert -- E-CRLH --, therefor.

In Column 33, Line 64, in Claim 15, delete "ωSE," and insert -- ωSE; --, therefor.

In Column 34, Line 3, in Claim 15, delete "$\omega_{SE}'$ and" and insert -- $\omega_{SE}'$; and --, therefor.

In Column 36, Line 20, in Claim 31, delete "patches" and insert -- patch --, therefor.

In Column 36, Line 45, in Claim 32, delete "ECRLH" and insert -- E-CRLH --, therefor.

In Column 36, Line 64, in Claim 36, delete "another, the" and insert -- another, --, therefor.

In Column 38, Line 29, in Claim 41, delete "secondseries" and insert -- second series --, therefor.

UNITED STATES PATENT AND TRADEMARK OFFICE
CERTIFICATE OF CORRECTION

| | |
|---|---|
| PATENT NO. | : 8,237,519 B2 |
| APPLICATION NO. | : 12/272781 |
| DATED | : August 7, 2012 |
| INVENTOR(S) | : Maha Achour |

Page 1 of 1

It is certified that error appears in the above-identified patent and that said Letters Patent is hereby corrected as shown below:

On the Title Page:

Item (73) Assignee: please change "Rayspan Corporation" to read --Hollinworth Fund, L.L.C.--

Signed and Sealed this
Fifth Day of February, 2013

Teresa Stanek Rea
*Acting Director of the United States Patent and Trademark Office*